US009449988B2

(12) United States Patent
Masuoka et al.

(10) Patent No.: US 9,449,988 B2
(45) Date of Patent: Sep. 20, 2016

(54) SEMICONDUCTOR DEVICE WITH SIX TRANSISTORS FORMING A NOR CIRCUIT

(71) Applicant: UNISANTIS ELECTRONICS SINGAPORE PTE. LTD., Singapore (SG)

(72) Inventors: Fujio Masuoka, Tokyo (JP); Masamichi Asano, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/855,984

(22) Filed: Sep. 16, 2015

(65) Prior Publication Data

US 2016/0005764 A1  Jan. 7, 2016

Related U.S. Application Data

(63) Continuation of application No. PCT/JP2013/071527, filed on Aug. 8, 2013.

(51) Int. Cl.
| | | |
|---|---|---|
| *H01L 29/423* | (2006.01) | |
| *H01L 27/118* | (2006.01) | |
| *H01L 27/092* | (2006.01) | |

(Continued)

(52) U.S. Cl.
CPC . *H01L 27/11807* (2013.01); *H01L 21/823885* (2013.01); *H01L 27/092* (2013.01); *H01L 29/42392* (2013.01); *H01L 29/7827* (2013.01); *H01L 2027/11816* (2013.01)

(58) Field of Classification Search
CPC ............ H01L 27/11807; H01L 29/7827; H01L 29/42392; H01L 21/823885; H01L 27/092; H01L 2027/11816; H01L 21/82285; H01L 29/66666; H01L 29/7788

USPC ........ 257/135, 202, 302, 329; 438/137, 138, 438/156, 206, 268
See application file for complete search history.

(56) References Cited

U.S. PATENT DOCUMENTS

| | | | |
|---|---|---|---|
| 4,756,221 | A | 7/1988 | Nitschmann et al. |
| 5,031,809 | A | 7/1991 | Roberts et al. |

(Continued)

FOREIGN PATENT DOCUMENTS

| | | |
|---|---|---|
| JP | 2010251586 A | 11/2010 |
| JP | 2010258345 A | 11/2010 |

(Continued)

OTHER PUBLICATIONS

PCT—English translation of the International Preliminary Report on patentability dated Feb. 18, 2016.

(Continued)

*Primary Examiner* — Jarrett Stark
*Assistant Examiner* — Shahed Ahmed
(74) *Attorney, Agent, or Firm* — Laurence Greenberg; Werner Stemer; Ralph Locher

(57) ABSTRACT

A semiconductor device has a small area and constitutes a CMOS 3-input NOR circuit by using surrounding gate transistors (SGTs) which are vertical transistors. In the 3-input NOR circuit including six MOS transistors arranged in a line, the MOS transistors constituting the NOR circuit have the following configuration: Planar silicon layers are disposed on a substrate. The drain, the gate, and the source of the MOS transistors are arranged in a vertical direction, and the gate surrounds a silicon pillar. The planar silicon layers include a first active region having a first conductivity type and a second active region having a second conductivity type. The first and second active regions are connected to each other via a silicide layer disposed on surfaces of the planar silicon layers. In this way, a semiconductor device constituting a NOR circuit with a small area is provided.

13 Claims, 44 Drawing Sheets

(51) Int. Cl.
*H01L 21/8238* (2006.01)
*H01L 29/78* (2006.01)

(56) References Cited

U.S. PATENT DOCUMENTS

| | | | |
|---|---|---|---|
| 5,130,596 A | 7/1992 | Umeki | |
| 8,039,893 B2 | 10/2011 | Masuoka et al. | |
| 8,212,311 B2 | 7/2012 | Masuoka et al. | |
| 8,647,947 B2 | 2/2014 | Masuoka et al. | |
| 8,901,640 B2 | 12/2014 | Masuoka et al. | |
| 2010/0194438 A1* | 8/2010 | Masuoka | H01L 21/82385 326/121 |
| 2011/0115011 A1* | 5/2011 | Masuoka | H01L 21/82343 257/314 |
| 2012/0196415 A1 | 8/2012 | Masuoka et al. | |

FOREIGN PATENT DOCUMENTS

| | | |
|---|---|---|
| JP | 2011108702 A | 6/2011 |
| JP | 4756221 B2 | 8/2011 |
| JP | 5130596 B2 | 1/2013 |
| WO | 2009096464 A1 | 8/2009 |
| WO | 2009096465 A1 | 8/2009 |

OTHER PUBLICATIONS

Hirokazu Yoshizawa, CMOS OP AMP Kairo Jitsumu Sekkei NO KISO (CMOS OP Amplifier Circuit, Basis of Practical Design), CQ Publishing Co., Ltd., May 15, 2007, p. 23.

* cited by examiner

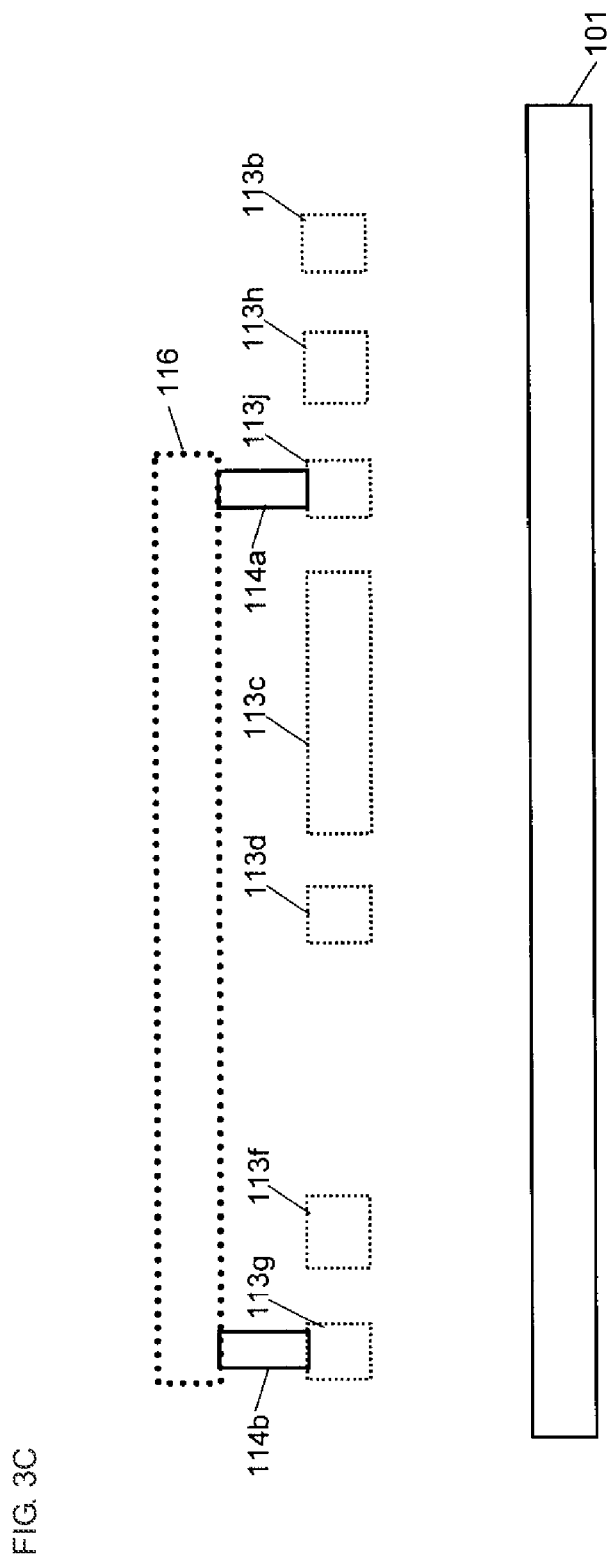

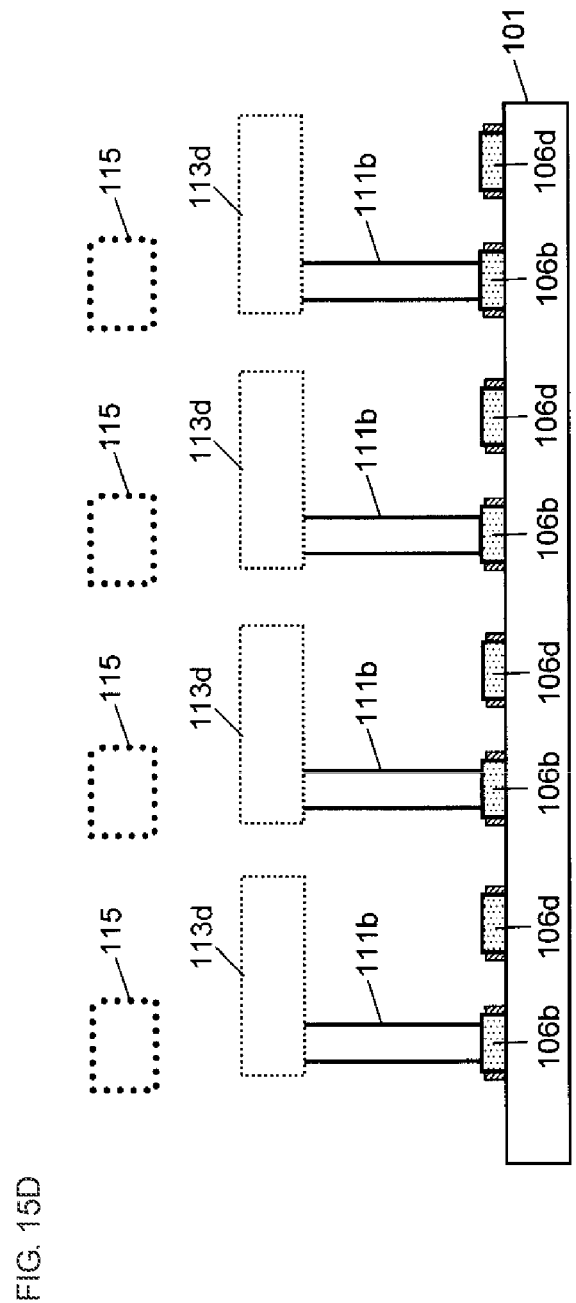

SEMICONDUCTOR DEVICE WITH SIX TRANSISTORS FORMING A NOR CIRCUIT

CROSS-REFERENCE TO RELATED APPLICATION

This application is a continuation, under 35 U.S.C. §120, of copending international application PCT/JP2013/071527, filed Aug. 8, 2013, which designated the United States; the entire contents of the earlier application are incorporated herein by reference.

BACKGROUND OF THE INVENTION

Field of the Invention

The present invention relates to a semiconductor device.

The integration scale of semiconductor integrated circuits continues to become larger. As for leading-edge microprocessing units (MPUs), semiconductor chips including as many as one giga (G) transistors have been developed. In conventional transistors formed by the planar process, that is, so-called planar transistors, an n-well region which constitutes a PMOS needs to be completely isolated from a p-type silicon substrate (or p-well region) which constitutes an NMOS, as described in "CMOS OP anpu kairo jitsumu sekkei no kiso", written by Yoshizawa Hirokazu, CQ Publishing, page 23. In addition, the n-well region and the p-type silicon substrate need body terminals for applying potentials thereto, further increasing the area of the transistors.

As a solution to such an issue, surrounding gate transistors (SGTs) have been proposed in which a source, a gate, and a drain are disposed in a direction perpendicular to a substrate and the gate surrounds an island-shaped semiconductor layer. A method for manufacturing an SGT and a complementary metal-oxide semiconductor (CMOS) inverter, NAND circuit, or static random access memory (SRAM) cell using SGTs are disclosed (see, for example, Japanese Patent Nos. 5130596, 5031809, and 4756221 and International Publication WO2009/096465).

FIGS. 18, 19A, and 19B are a circuit diagram and layout diagrams of an inverter using SGTs.

FIG. 18 is a circuit diagram of the inverter. The inverter includes a p-channel MOS transistor (hereinafter, referred to as a PMOS transistor) Qp and an n-channel MOS transistor (hereinafter, referred to as an NMOS transistor) Qn. IN denotes an input signal, and OUT denotes an output signal. In addition, Vcc denotes a supply voltage, and Vss denotes a reference voltage.

FIG. 19A is a plan view of an example of the layout in the inverter of FIG. 18 including SGTs. FIG. 19B is a cross-sectional view taken along a cut line A-A' in the plan view of FIG. 19A.

Referring to FIGS. 19A and 19B, planar silicon layers 2p and 2n are disposed on an insulting film, such as a buried oxide (BOX) film layer 1 disposed on a substrate. The planar silicon layers (hereinafter, also referred to as lower diffusion layers) 2p and 2n are respectively formed as a p+ diffusion layer and an n+ diffusion layer through impurity implantation or the like. A silicide layer 3 disposed on the surfaces of the planar silicon layers (2p and 2n) connects the planar silicon layers 2p and 2n to each other. 4n denotes a silicon pillar of n type, and 4p denotes a silicon pillar of p type. 5 denotes a gate insulting film that surrounds the silicon pillars 4n and 4p. 6 denotes a gate electrode, and 6a denotes a gate line. A p+ diffusion layer 7p and an n+ diffusion layer 7n are respectively formed at top portions of the silicon pillars 4n and 4p through impurity implantation or the like. 8 denotes a silicon nitride film that protects the gate insulating film 5 and so on. 9p and 9n denote silicide layers respectively connected to the p+ diffusion layer (hereinafter, also referred to as an upper diffusion layer) 7p and the n+ diffusion layer (hereinafter, also referred to as an upper diffusion layer) 7n. 10p and 10n denote contacts that respectively connect the silicide layers 9p and 9n to metal lines 13a and 13b. 11 denotes a contact that connects the gate line 6a to a metal line 13c.

The silicon pillar 4n, the lower diffusion layer 2p, the upper diffusion layer 7p, the gate insulating film 5, and the gate electrode 6 constitute the PMOS transistor Qp. The silicon pillar 4p, the lower diffusion layer 2n, the upper diffusion layer 7n, the gate insulating film 5, and the gate electrode 6 constitute the NMOS transistor Qn. Each of the upper diffusion layers 7p and 7n serves as a source. Each of the lower diffusion layers 2p and 2n serves as a drain. The metal line 13a is supplied with the supply voltage Vcc, and the metal line 13b is supplied with the reference voltage Vss. The input signal IN is connected to the metal line 13c. The output signal OUT is output from the silicide layer 3 that connects the lower diffusion layer 2p that serves as the drain of the PMOS transistor Qp to the lower diffusion layer 2n that serves as the drain of the NMOS transistor Qn.

The inverter using SGTs illustrated in FIGS. 18, 19A, and 19B has a characteristic in that it can implement a very compact layout (arrangement) because the PMOS transistor and the NMOS transistor are completely isolated from each other structurally, eliminating the necessity of isolation of wells unlike planar transistors and because the silicon pillars are floating bodies, eliminating the necessity of body terminals for applying potentials to the wells unlike planar transistors.

As described above, the most advantageous characteristic of the SGT is that the structural principal allows utilization of a lower layer line implemented by the silicide layer located in the vicinity of the substrate below the silicon pillar and an upper line implemented by connection via a contact above the silicon pillar.

SUMMARY OF THE INVENTION

It is an object of the present invention to provide low-cost logic semiconductor devices by arranging 3-input NOR circuits, which are often used in logic circuits, in a line to implement a compact arrangement and minimize the area by taking advantage of the characteristic of the SGT.

An aspect of the present invention provides a semiconductor device including six transistors arranged in a line on a substrate to constitute a NOR circuit, each of the six transistors having a source, a drain, and a gate arranged hierarchically in a direction perpendicular to the substrate, each of the six transistors including: a silicon pillar; an insulator surrounding a side surface of the silicon pillar; a gate surrounding the insulator; a source region disposed at an upper portion or lower portion of the silicon pillar; and a drain region disposed at an upper portion or lower portion of the silicon pillar on a side of the silicon pillar opposite to the source region, the six transistors including a first n-channel MOS transistor, a second n-channel MOS transistor, a third n-channel MOS transistor, a first p-channel MOS transistor, a second p-channel MOS transistor, and a third p-channel MOS transistor, wherein the gate of the first n-channel MOS transistor and the gate of the first p-channel MOS transistor are connected to each other; the gate of the second n-channel MOS transistor and the gate of the second p-channel MOS transistor are connected to each other; the gate of the third n-channel MOS transistor and the gate of the third p-channel MOS transistor are connected to each other; the drain region of the first n-channel MOS transistor, the drain region of the second n-channel MOS transistor, the drain region of the third n-channel MOS transistor, the drain region of the first p-channel MOS transistor, and the drain region of the third p-channel MOS transistor are disposed on a side of the silicon pillars close to the substrate; the source region of the second p-channel MOS transistor is disposed on a side of the silicon pillar close to the substrate; the drain region of the first n-channel MOS transistor, the drain region of the second n-channel MOS transistor, the drain region of the third n-channel MOS transistor, and the drain region of the first p-channel MOS transistor are connected to one another via a silicide region; the source region of the first p-channel MOS transistor and the drain region of the second p-channel MOS transistor are connected to each other via a contact; and the source region of the second p-channel MOS transistor and the drain region of the third p-channel MOS transistor are connected to each other via the silicide region.

According to a preferable embodiment of the present invention, in the semiconductor device, the six transistors may be arranged in a line in an order of the first p-channel MOS transistor, the first n-channel MOS transistor, the third n-channel MOS transistor, the second n-channel MOS transistor, the second p-channel MOS transistor, and the third p-channel MOS transistor or in an order of the first p-channel MOS transistor, the first n-channel MOS transistor, the third n-channel MOS transistor, the second n-channel MOS transistor, the third p-channel MOS transistor, and the second p-channel MOS transistor.

According to another embodiment, in the semiconductor device, the gate of the third n-channel MOS transistor and the gate of the third p-channel MOS transistor may be connected to each other via a contact.

According to another embodiment, in the semiconductor device, the gate of the third n-channel MOS transistor and the gate of the third p-channel MOS transistor may be connected by different signal lines via a contact.

According to another embodiment, in the semiconductor device, the six transistors may be arranged in a line in an order of the first p-channel MOS transistor, the first n-channel MOS transistor, the second n-channel MOS transistor, the third n-channel MOS transistor, the second p-channel MOS transistor, and the third p-channel MOS transistor or in an order of the first p-channel MOS transistor, the first n-channel MOS transistor, the second n-channel MOS transistor, the third n-channel MOS transistor, the third p-channel MOS transistor, and the second p-channel MOS transistor.

According to another embodiment, in the semiconductor device, the six transistors may be arranged in a line in an order of the third n-channel MOS transistor, the second n-channel MOS transistor, the first n-channel MOS transistor, the first p-channel MOS transistor, the second p-channel MOS transistor, and the third p-channel MOS transistor.

According to another embodiment, in the semiconductor device, the gate of the third n-channel MOS transistor and the gate of the third p-channel MOS transistor may be connected by different signal lines via a contact.

According to another embodiment, in the semiconductor device, the six transistors may be arranged in a line in an order of the first n-channel MOS transistor, the first p-channel MOS transistor, the third n-channel MOS transistor, the second n-channel MOS transistor, the second p-channel MOS transistor, and the third p-channel MOS transistor or in an order of the first n-channel MOS transistor, the first p-channel MOS transistor, the third n-channel MOS transistor, the second n-channel MOS transistor, the third p-channel MOS transistor, and the second p-channel MOS transistor.

According to another embodiment, in the semiconductor device, the six transistors may be arranged in a line in an order of the first n-channel MOS transistor, the first p-channel MOS transistor, the second n-channel MOS transistor, the third n-channel MOS transistor, the second p-channel MOS transistor, and the third p-channel MOS transistor or in an order of the first n-channel MOS transistor, the first p-channel MOS transistor, the second n-channel MOS transistor, the third n-channel MOS transistor, the third p-channel MOS transistor, and the second p-channel MOS transistor.

According to another embodiment, in the semiconductor device, the six transistors may be arranged in a line in an order of the third n-channel MOS transistor, the first p-channel MOS transistor, the first n-channel MOS transistor, the second n-channel MOS transistor, the second p-channel MOS transistor, and the third p-channel MOS transistor or in an order of the third n-channel MOS transistor, the first p-channel MOS transistor, the first n-channel MOS transistor, the second n-channel MOS transistor, the third p-channel MOS transistor, and the second p-channel MOS transistor.

According to another embodiment, in the semiconductor device, the six transistors may be arranged in a line in an order of the second n-channel MOS transistor, the first p-channel MOS transistor, the first n-channel MOS transistor, the third n-channel MOS transistor, the second p-channel MOS transistor, and the third p-channel MOS transistor or in an order of the second n-channel MOS transistor, the first p-channel MOS transistor, the first n-channel MOS transistor, the third n-channel MOS transistor, the third p-channel MOS transistor, and the second p-channel MOS transistor.

According to another embodiment, in the semiconductor device, the six transistors may be arranged in a line in an order of the third n-channel MOS transistor, the first n-channel MOS transistor, the first p-channel MOS transistor, the second n-channel MOS transistor, the second p-channel MOS transistor, and the third p-channel MOS transistor or in an order of the third n-channel MOS transistor, the first n-channel MOS transistor, the first p-channel MOS transistor, the second n-channel MOS transistor, the third p-channel MOS transistor, and the second p-channel MOS transistor.

According to another embodiment, in the semiconductor device, the six transistors may be arranged in a line in an order of the second n-channel MOS transistor, the first n-channel MOS transistor, the first p-channel MOS transistor, the third n-channel MOS transistor, the second p-channel MOS transistor, and the third p-channel MOS transistor or in an order of the second n-channel MOS transistor, the first n-channel MOS transistor, the first p-channel MOS transistor, the third n-channel MOS transistor, the third p-channel MOS transistor, and the second p-channel MOS transistor.

Another preferable aspect of the present invention provides a semiconductor device including a plurality of semiconductor devices each including six transistors arranged in a line on a substrate to constitute a NOR circuit, each of the six transistors having a source, a drain, and a gate arranged hierarchically in a direction perpendicular to the substrate, each of the six transistors including: a silicon pillar; an insulator surrounding a side surface of the silicon pillar; a gate surrounding the insulator; a source region disposed at an upper portion or lower portion of the silicon pillar; and a drain region disposed at an upper portion or lower portion of the silicon pillar on a side of the silicon pillar opposite to the source region, the six transistors including a first n-channel MOS transistor, a second n-channel MOS transistor, a third n-channel MOS transistor, a first p-channel MOS transistor, a second p-channel MOS transistor, and a third p-channel MOS transistor, wherein the gate of the first n-channel MOS transistor and the gate of the first p-channel MOS transistor are connected to each other; the gate of the second n-channel MOS transistor and the gate of the second p-channel MOS transistor are connected to each other; the gate of the third n-channel MOS transistor and the gate of the third p-channel MOS transistor are connected to each other; the drain region of the first n-channel MOS transistor, the drain region of the second n-channel MOS transistor, the drain region of the third n-channel MOS transistor, the drain region of the first p-channel MOS transistor, and the drain region of the third p-channel MOS transistor are disposed on a side of the silicon pillars close to the substrate; the source region of the second p-channel MOS transistor is disposed on a side of the silicon pillar close to the substrate; the drain region of the first n-channel MOS transistor, the drain region of the second n-channel MOS transistor, the drain region of the third n-channel MOS transistor, and the drain region of the first p-channel MOS transistor are connected to one another via a silicide region; the source region of the first p-channel MOS transistor and the drain region of the second p-channel MOS transistor are connected to each other via a contact; the source region of the second p-channel MOS transistor and the drain region of the third p-channel MOS transistor are connected to each other via the silicide region; the gate of the first n-channel MOS transistor and the gate of the first p-channel MOS transistor are connected to a first input signal line; the gate of the second n-channel MOS transistor and the gate of the second p-channel MOS transistor are connected to a second input signal line; the gate of the third n-channel MOS transistor and the gate of the third p-channel MOS transistor are connected to a third input signal line; the source region of the first n-channel MOS transistor, the source region of the second n-channel MOS transistor, and the source region of the third n-channel MOS transistor are connected to a reference voltage terminal via respective contacts; and the source region of the third p-channel MOS transistor is connected to a supply voltage terminal via a contact, and wherein the plurality of semiconductor devices are arranged in parallel with one another and share a supply voltage and a reference voltage.

According to another embodiment, in the semiconductor device, the first input signal line, the second input signal line, and the third input signal line may be disposed in a direction perpendicular to a direction in which the plurality of semiconductor devices are arranged in parallel with one another.

Yet another preferable aspect of the present invention provides a semiconductor device including six transistors arranged in a line on a substrate to constitute a NOR circuit, each of the six transistors having a source, a drain, and a gate arranged hierarchically in a direction perpendicular to the substrate, each of the six transistors including: a silicon pillar; an insulator surrounding a side surface of the silicon pillar; a gate surrounding the insulator; a source region disposed at an upper portion or lower portion of the silicon pillar; and a drain region disposed at an upper portion or lower portion of the silicon pillar on a side of the silicon pillar opposite to the source region, the six transistors including a first n-channel MOS transistor, a second n-channel MOS transistor, a third n-channel MOS transistor, a first p-channel MOS transistor, a second p-channel MOS transistor, and a third p-channel MOS transistor, wherein the gate of the first n-channel MOS transistor and the gate of the first p-channel MOS transistor are connected to each other; the gate of the second n-channel MOS transistor and the gate of the second p-channel MOS transistor are connected to each other; the gate of the third n-channel MOS transistor and the gate of the third p-channel MOS transistor are connected to each other; the source region of the first n-channel MOS transistor, the source region of the second n-channel MOS transistor, the source region of the third n-channel MOS transistor, the source region of the first p-channel MOS transistor, and the source region of the third p-channel MOS transistor are disposed on a side of the silicon pillars close to the substrate; the drain region of the second p-channel MOS transistor is disposed on a side of the silicon pillar close to the substrate; the drain region of the first n-channel MOS transistor, the drain region of the second n-channel MOS transistor, the drain region of the third n-channel MOS transistor, and the drain region of the first p-channel MOS transistor are connected to one another via respective contacts; the source region of the first p-channel MOS transistor and the drain region of the second p-channel MOS transistor are connected to each other via a silicide region; and the source region of the second p-channel MOS transistor and the drain region of the third p-channel MOS transistor are connected to each other via a contact.

According to another aspect, in the semiconductor device, the six transistors may be arranged in a line in an order of the third n-channel MOS transistor, the third p-channel MOS transistor, the second p-channel MOS transistor, the first p-channel MOS transistor, the first n-channel MOS transistor, and the second n-channel MOS transistor or in an order of the third n-channel MOS transistor, the third p-channel MOS transistor, the second p-channel MOS transistor, the first p-channel MOS transistor, the second n-channel MOS transistor, and the first n-channel MOS transistor.

According to another embodiment, in the semiconductor device, the six transistors may be arranged in a line in an order of the third p-channel MOS transistor, the second p-channel MOS transistor, the first p-channel MOS transistor, the first n-channel MOS transistor, the second n-channel MOS transistor, and the third n-channel MOS transistor or in an order of the third p-channel MOS transistor, the second p-channel MOS transistor, the first p-channel MOS transistor, the first n-channel MOS transistor, the third n-channel MOS transistor, and the second n-channel MOS transistor.

Another preferable aspect of the present invention provides a semiconductor device including a plurality of semiconductor devices each including six transistors arranged in a line on a substrate to constitute a NOR circuit, each of the six transistors having a source, a drain, and a gate arranged hierarchically in a direction perpendicular to the substrate, each of the six transistors including: a silicon pillar; an insulator surrounding a side surface of the silicon pillar; a gate surrounding the insulator; a source region disposed at an upper portion or lower portion of the silicon pillar; and a drain region disposed at an upper portion or lower portion of the silicon pillar on a side of the silicon pillar opposite to the source region, the six transistors including a first n-channel MOS transistor, a second n-channel MOS transistor, a third n-channel MOS transistor, a first p-channel MOS transistor, a second p-channel MOS transistor, and a third p-channel MOS transistor, wherein the gate of the first n-channel MOS transistor and the gate of the first p-channel MOS transistor are connected to each other; the gate of the second n-channel MOS transistor and the gate of the second p-channel MOS transistor are connected to each other; the gate of the third n-channel MOS transistor and the gate of the third p-channel MOS transistor are connected to each other; the source region of the first n-channel MOS transistor, the source region of the second n-channel MOS transistor, the source region of the third n-channel MOS transistor, the source region of the first p-channel MOS transistor, and the source region of the third p-channel MOS transistor are disposed on a side of the silicon pillars close to the substrate; the drain region of the second p-channel MOS transistor is disposed on a side of the silicon pillar close to the substrate; the drain region of the first n-channel MOS transistor, the drain region of the second n-channel MOS transistor, the drain region of the third n-channel MOS transistor, and the drain region of the first p-channel MOS transistor are connected to one another via respective contacts; the source region of the first p-channel MOS transistor and the drain region of the second p-channel MOS transistor are connected to each other via a silicide region; the source region of the second p-channel MOS transistor and the drain region of the third p-channel MOS transistor are connected to each other via a contact; the gate of the first n-channel MOS transistor and the gate of the first p-channel MOS transistor are connected to a first input signal line; the gate of the second n-channel MOS transistor and the gate of the second p-channel MOS transistor are connected to a second input signal line; the gate of the third n-channel MOS transistor and the gate of the third p-channel MOS transistor are connected to a third input signal line; the source region of the first n-channel MOS transistor, the source region of the second n-channel MOS transistor, and the source region of the third n-channel MOS transistor are connected to a reference voltage terminal via respective contacts; and the source region of the third p-channel MOS transistor is connected to a supply voltage terminal via a contact, and wherein the plurality of semiconductor devices are arranged in parallel with one another and share a supply voltage and a reference voltage.

According to another embodiment, in the semiconductor device, the first input signal line, the second input signal line, and the third input signal line may be disposed in a direction perpendicular to a direction in which the plurality of semiconductor devices are arranged in parallel with one another.

According to another embodiment, in the semiconductor device, the silicide region via which the plurality of semiconductor devices are supplied with the supply voltage and the reference voltage may be connected in common in a direction in which the plurality of semiconductor devices are arranged in parallel with one another.

BRIEF DESCRIPTION OF THE SEVERAL VIEWS OF THE DRAWING

FIG. 3C is a cross-sectional view of the NOR circuit according to the second embodiment of the present invention.

FIG. 15D is a cross-sectional view of the NOR circuits according to the thirteenth embodiment of the present invention.

DETAILED DESCRIPTION OF THE INVENTION

First Embodiment

Figure 1:
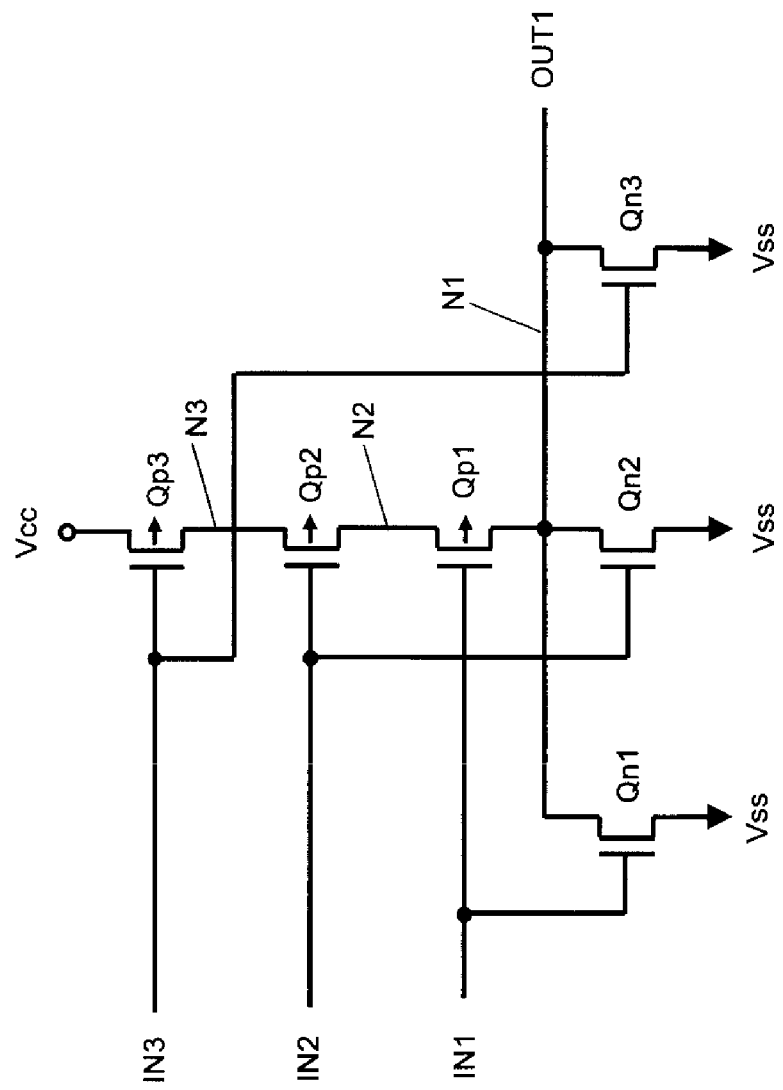
FIG. 1 is an equivalent circuit diagram of a NOR circuit according to embodiments of the present invention.

FIG. 1 is an equivalent circuit diagram of a 3-input NOR circuit employed in the present invention. The 3-input NOR circuit includes NMOS transistors Qn1, Qn2, and Qn3 each constituted by an SGT and PMOS transistors Qp1, Qp2, and Qp3 each constituted by an SGT similarly. Sources of the NMOS transistors Qn1, Qn2, and Qn3 are connected to a reference voltage Vss, and drains thereof are connected to a node N1 in common. A drain of the PMOS transistor Qp1 is connected to the node N1, and a source thereof is connected to a drain of the PMOS transistor Qp2 via a node N2. A source of the PMOS transistor Qp2 is connected to a drain of the PMOS transistor Qp3 via a node N3. A source of the PMOS transistor Qp3 is connected to a supply voltage Vcc. An input signal IN1 is connected to gates of the NMOS transistor Qn1 and the PMOS transistor Qp1. An input signal IN2 is connected to gates of the NMOS transistor Qn2 and the PMOS transistor Qp2. An input signal IN3 is connected to gates of the NMOS transistor Qn3 and the PMOS transistor Qp3.

Figure 2A:
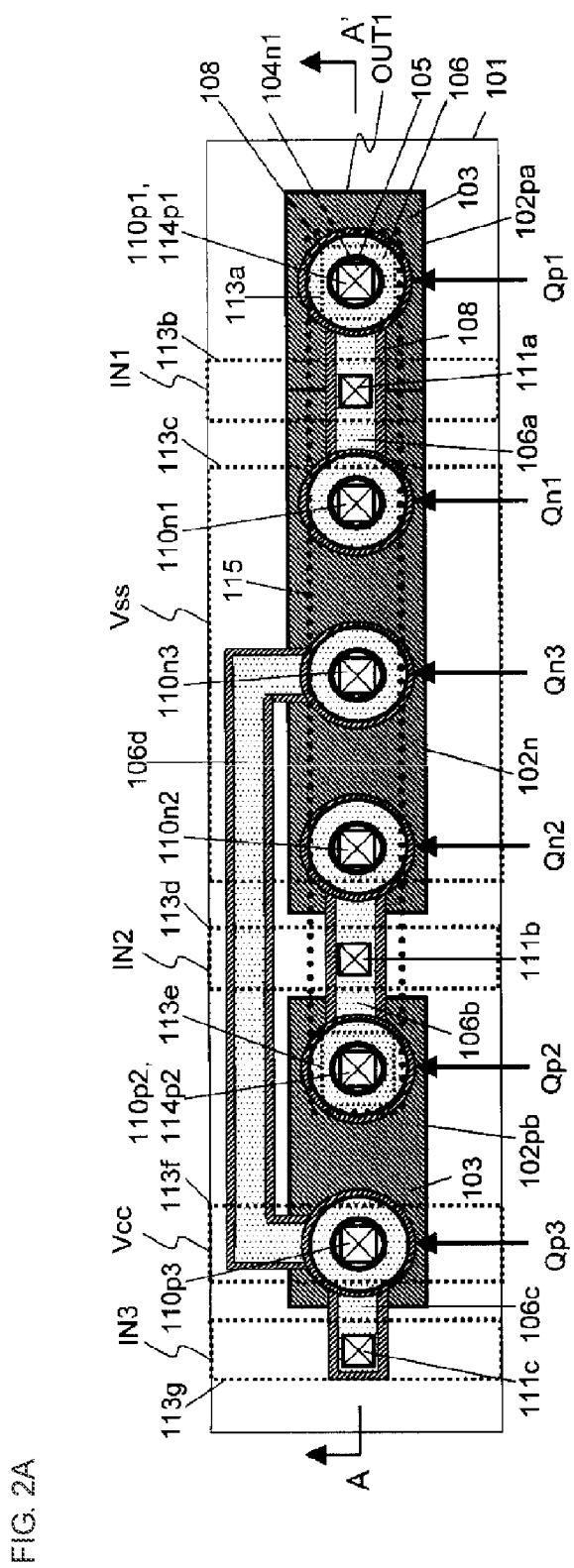
FIG. 2A is a plan view of a NOR circuit according to a first embodiment of the present invention.
Figure 2B:
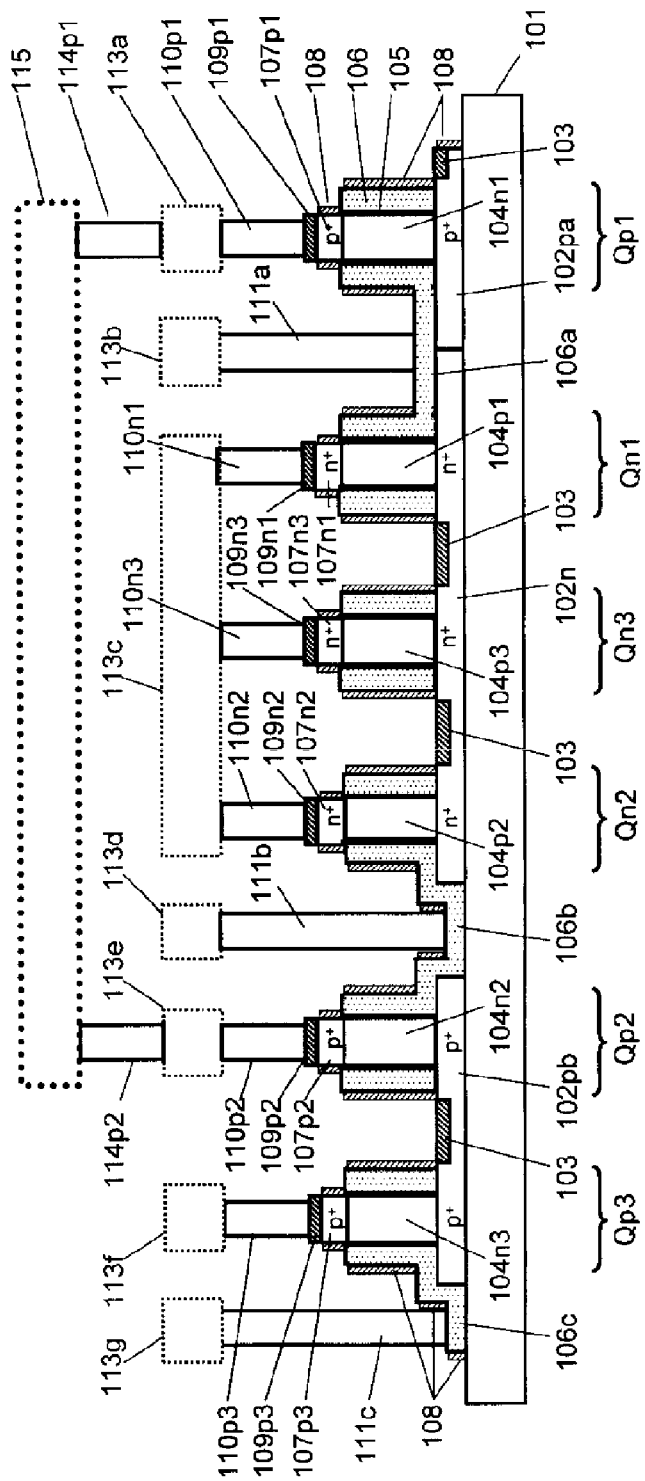
FIG. 2B is a cross-sectional view of the NOR circuit according to the first embodiment of the present invention.

FIGS. 2A and 2B illustrate a first embodiment. FIG. 2A is a plan view of the layout (arrangement) in the 3-input NOR circuit (hereinafter, simply referred to as a NOR circuit) of the present invention. FIG. 2B is a cross-sectional view taken along a cut line A-A' illustrated in FIG. 2A.

Referring to FIG. 2A, the PMOS transistor Qp1, the NMOS transistor Qn1, the NMOS transistor Qn3, the NMOS transistor Qn2, the PMOS transistor Qp2, and the PMOS transistor Qp3 of the NOR circuit illustrated in FIG. 1 are arranged in a line from the right.

Figure 19A:
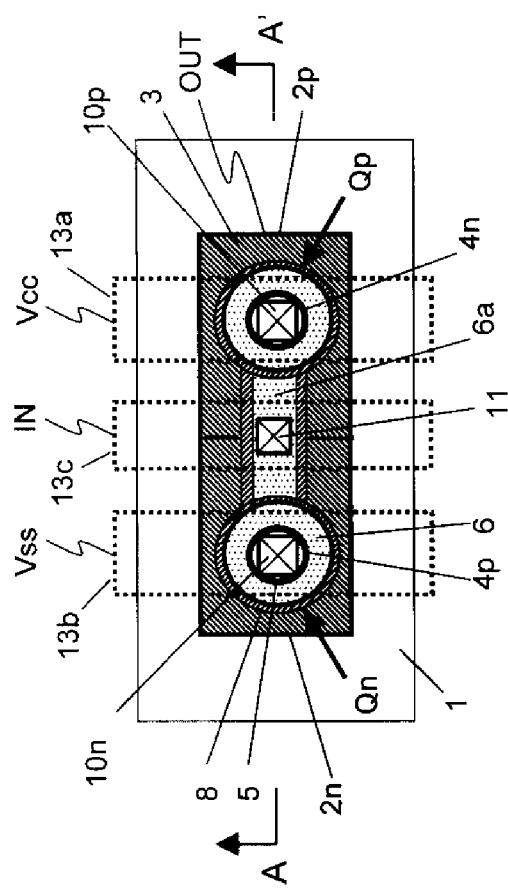
FIG. 19A is a plan view of the inverter according to the related art.
Figure 19B:
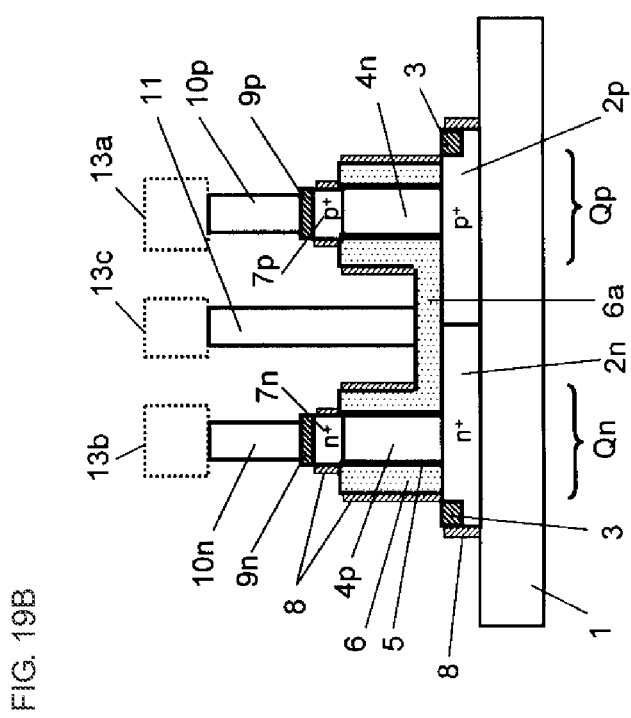
FIG. 19B is a cross-sectional view of the inverter according to the related art.

In FIGS. 2A and 2B, the same or substantially the same structures as those illustrated in FIGS. 19A and 19B are denoted by reference numerals in the 100s having the same last one or two digits as the reference numerals used in FIGS. 19A and 19B.

Planar silicon layers 102*pa*, 102*n*, and 102*pb* are disposed on an insulating film, such as a buried oxide (BOX) film layer 101 disposed on a substrate. The planar silicon layers (hereinafter, also referred to as lower diffusion layers) 102*pa*, 102*n*, and 102*pb* are respectively formed as a p+ diffusion layer, an n+ diffusion layer, and a p+ diffusion layer through impurity implantation or the like. A silicide layer 103 disposed on the surfaces of the planar silicon layers (102*pa*, 102*n*, and 102*pb*) connects the planar silicon layers 102*pa* and 102*n* to each other. 104*p*1, 104*p*2, and 104*p*3 denote silicon pillars of p type, and 104*n*1, 104*n*2, and 104*n*3 denote silicon pillars of n type. 105 denotes a gate insulating film surrounding the silicon pillars 104*p*1, 104*p*2, 104*p*3, 104*n*1, 104*n*2, and 104*n*3. 106 denotes a gate electrode. 106*a*, 106*b*, 106*c*, and 106*d* each denote a gate line. At top portions of the silicon pillars 104*p*1, 104*p*2, and 104*p*3, n+ diffusion layers (hereinafter, also referred to as upper diffusion layers) 107*n*1, 107*n*2, and 107*n*3 are respectively formed through impurity implantation or the like. At top portions of the silicon pillars 104*n*1, 104*n*2, and 104*n*3, p+ diffusion layers (hereinafter, also referred to as upper diffusion layers) 107*p*1, 107*p*2, and 107*p*3 are formed through impurity implantation or the like. 108 denotes a silicon nitride film that protects the gate insulating film 105. 109*n*1, 109*n*2, 109*n*3, 109*p*1, 109*p*2, and 109*p*3 denote silicide layers respectively connected to the n+ diffusion layers 107*n*1, 107*n*2, and 107*n*3 and the p+ diffusion layers 107*p*1, 107*p*2, and 107*p*3. 110*n*1, 110*n*2, 110*n*3, 110*p*1, 110*p*2, and 110*p*3 denote contacts that respectively connect the silicide layers 109*n*1, 109*n*2, 109*n*3, 109*p*1, 109*p*2, and 109*p*3 to first metal lines 113*c*, 113*c*, 113*c*, 113*a*, 113*e*, and 113*f*. 111*a* denotes a contact that connects the gate line 106*a* to a first metal line 113*b*. 111*b* denotes a contact that connects the gate line 106*b* to a first metal line 113*d*. 111*c* denotes a contact that connects the gate line 106*c* to a first metal line 113*g*.

114*p*1 denotes a contact that connects the first metal line 113*a* to a second metal line 115. 114*p*2 denotes a contact that connects the first metal line 113*e* to the second metal line 115.

The silicon pillar 104*p*1, the lower diffusion layer 102*n*, the upper diffusion layer 107*n*1, the gate insulating film 105, and the gate electrode 106 constitute the NMOS transistor Qn1. The silicon pillar 104*p*2, the lower diffusion layer 102*n*, the upper diffusion layer 107*n*2, the gate insulting film 105, and the gate electrode 106 constitute the NMOS transistor Qn2. The silicon pillar 104*p*3, the lower diffusion layer 102*n*, the upper diffusion layer 107*n*3, the gate insulating film 105, and the gate electrode 106 constitute the NMOS transistor Qn3. The silicon pillar 104*n*1, the lower diffusion layer 102*pa*, the upper diffusion layer 107*p*1, the gate insulating film 105, and the gate electrode 106 constitute the PMOS transistor Qp1. The silicon pillar 104*n*2, the lower diffusion layer 102*pb*, the upper diffusion layer 107*p*2, the gate insulating film 105, and the gate electrode 106 constitute the PMOS transistor Qp2. The silicon pillar 104n3, the lower diffusion layer 102pb, the upper diffusion layer 107p3, the gate insulating film 105, and the gate electrode 106 constitute the PMOS transistor Qp3.

In addition, the gate line 106a is connected to the gate electrode 106 of the NMOS transistor Qn1. The gate line 106b is connected to the gate electrode 106 of the NMOS transistor Qn2. The gate line 106d is connected to the gate electrode 106 of the NMOS transistor Qn3. The gate line 106a is connected to the gate electrode 106 of the PMOS transistor Qp1. The gate line 106b is connected to the gate electrode 106 of the PMOS transistor Qp2. The gate lines 106c and 106d are connected to the gate electrode 106 of the PMOS transistor Qp3.

The lower diffusion layers 102pa and 102n serve as a common drain of the PMOS transistor Qp1 and the NMOS transistors Qn1, Qn2, and Qn3 and are connected to an output OUT1. The upper diffusion layer 107n1, which is a source of the NMOS transistor Qn1, is connected to the first metal line 113c via the silicide layer 109n1 and the contact 110n1. The first metal line 113c is supplied with the reference voltage Vss. The upper diffusion layer 107n2, which is a source of the NMOS transistor Qn2, is connected to the first metal line 113c via the silicide layer 109n2 and the contact 110n2. The upper diffusion layer 107n3, which is a source of the NMOS transistor Qn3, is connected to the first metal line 113c via the silicide layer 109n3 and the contact 110n3. The upper diffusion layer 107p1, which is a source of the PMOS transistor Qp1, is connected to the first metal line 113a via the silicide layer 109p1 and the contact 110p1. The first metal line 113a is further connected to the second metal line 115 via the contact 114p1. The upper diffusion layer 107p2, which is a drain of the PMOS transistor Qp2, is connected to the first metal line 113e via the silicide layer 109p2 and the contact 110p2. The first metal line 113e is further connected to the second metal line 115 via the contact 114p2. The source of the PMOS transistor Qp1 and the drain of the PMOS transistor Qp2 are connected to each other via the second metal line 115. In addition, the source of the PMOS transistor Qp2 is connected to the drain of the PMOS transistor Qp3 via the lower diffusion layer 102pb and the silicide layer 103. The source of the PMOS transistor Qp3 is connected to the first metal line 113f via the contact 110p3. The first metal line 113f is supplied with the supply voltage Vcc.

The input signal IN1 is supplied to the first metal line 113b, is connected to the gate line 106a via the contact 111a, and is supplied to the gate electrodes 106 of the NMOS transistor Qn1 and the PMOS transistor Qp1.

The input signal IN2 is supplied to the first metal line 113d, is connected to the gate line 106b via the contact 111b, and is connected to the gate electrodes 106 of the NMOS transistor Qn2 and the PMOS transistor Qp2.

The input signal IN3 is supplied to the first metal line 113g, is connected to the gate line 106c via the contact 111c, and is connected to the gate electrode 106 of the PMOS transistor Qp3. The input signal IN3 is also connected to the gate electrode 106 of the NMOS transistor Qn3 via the gate line 106d.

According to the first embodiment, six SGTs constituting a 3-input NOR circuit can be arranged in a line without providing any extra lines or contact regions. Thus, a semiconductor device with a reduced area can be provided.

Second Embodiment

Figure 3A:
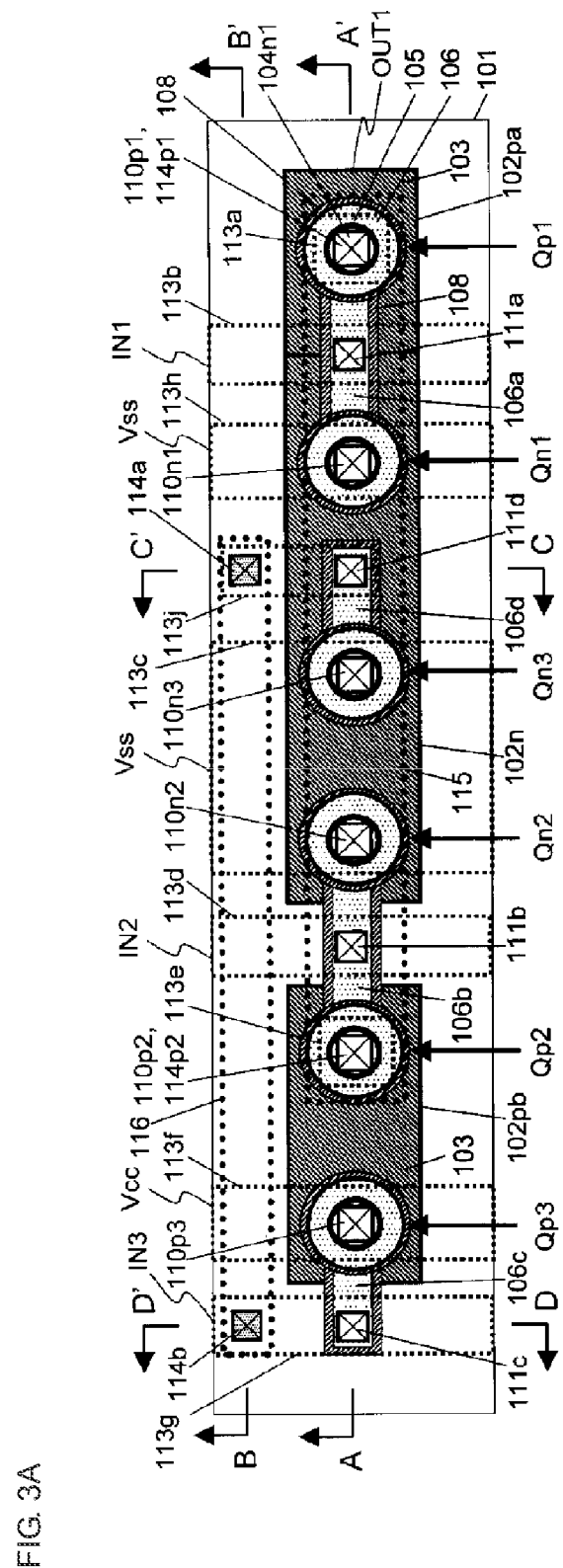
FIG. 3A is a plan view of a NOR circuit according to a second embodiment of the present invention.
Figure 3B:
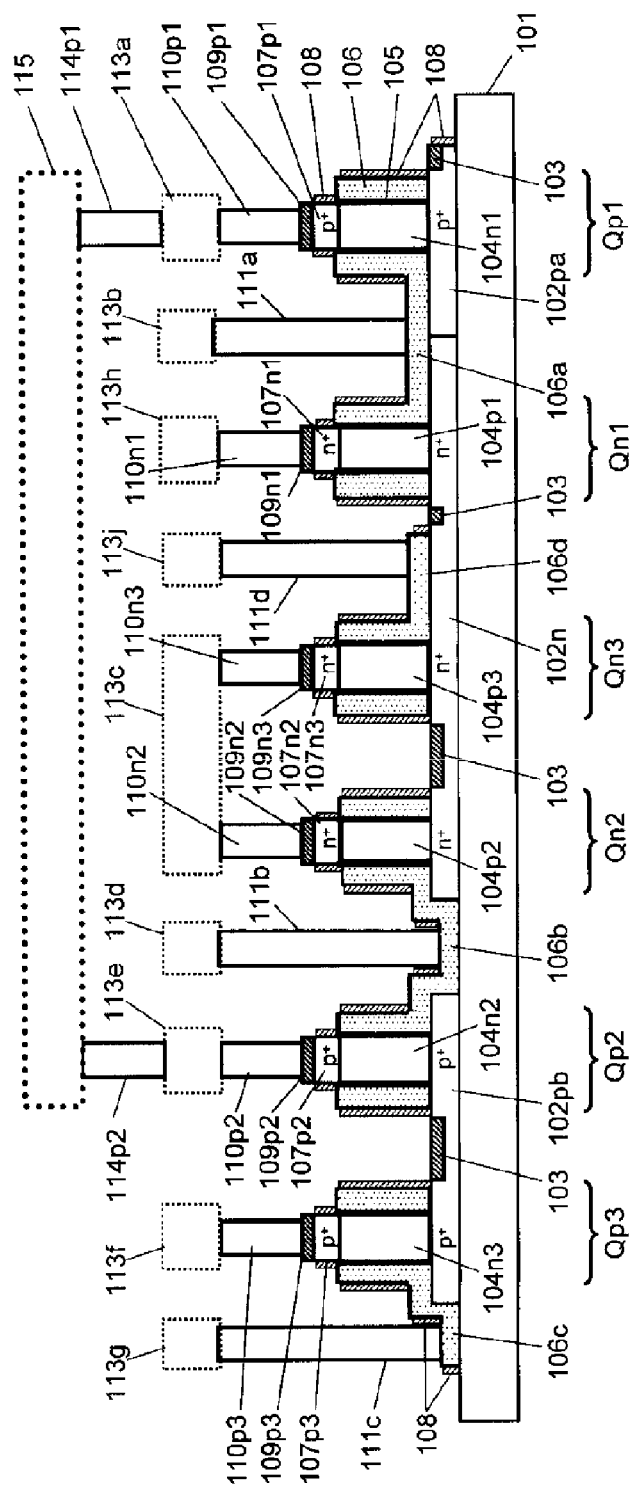
FIG. 3B is a cross-sectional view of the NOR circuit according to the second embodiment of the present invention.
Figures 3D, 3E:
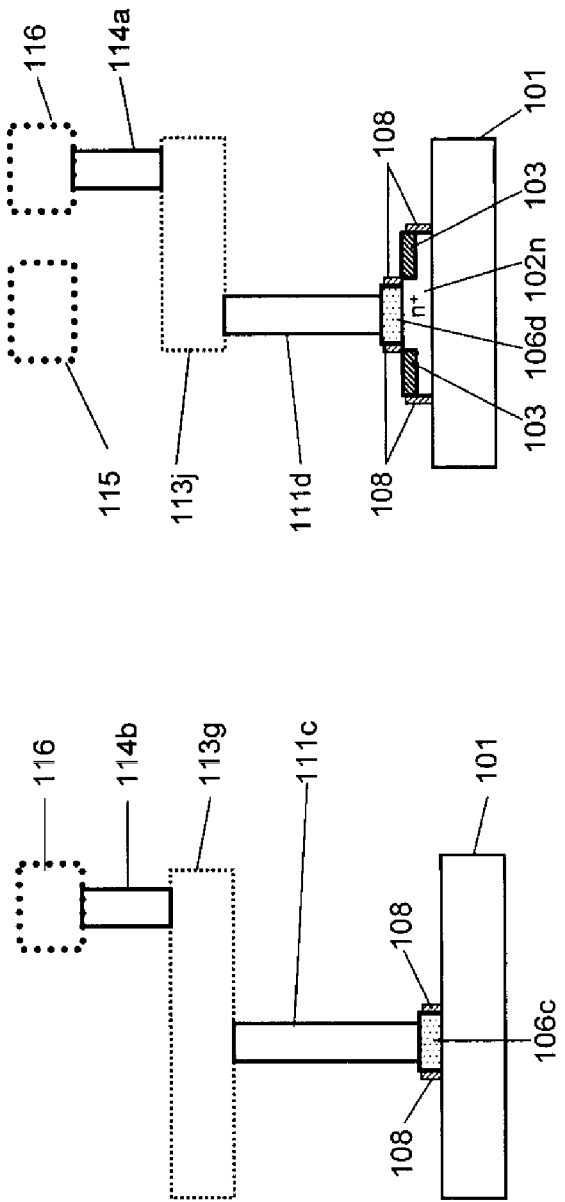
FIG. 3D is a cross-sectional view of the NOR circuit according to the second embodiment of the present invention.
FIG. 3E is a cross-sectional view of the NOR circuit according to the second embodiment of the present invention.

FIGS. 3A to 3E illustrate a second embodiment. FIG. 3A is a plan view of the layout (arrangement) in the 3-input NOR circuit (hereinafter, simply referred to as a NOR circuit) of the present invention. FIG. 3B is a cross-sectional view taken along a cut line A-A' illustrated in FIG. 3A. FIG. 3C is a cross-sectional view taken along a cut line B-B' illustrated in FIG. 3A. FIG. 3D is a cross-sectional view taken along a cut line C-C' illustrated in FIG. 3A. FIG. 3E is a cross-sectional view taken along a cut line D-D' illustrated in FIG. 3A.

Referring to FIGS. 3A and 3B, the PMOS transistor Qp1, the NMOS transistor Qn1, the NMOS transistor Qn3, the NMOS transistor Qn2, the PMOS transistor Qp2, and the PMOS transistor Qp3 of the NOR circuit illustrated in FIG. 1 are arranged in a line from the right. A difference from the configuration illustrated in FIGS. 2A and 2B is that the gate line 106d that extends in FIGS. 2A and 2B is omitted and a second metal line is used for connection.

In FIGS. 3A to 3E, the same or substantially the same structures as those illustrated in FIGS. 2A and 2B are denoted by the same reference numerals in the 100s.

Planar silicon layers 102pa, 102n, and 102pb are disposed on an insulating film, such as a buried oxide (BOX) film layer 101 disposed on a substrate. The planar silicon layers (hereinafter, also referred to as lower diffusion layers) 102pa, 102n, and 102pb are respectively formed as a p+ diffusion layer, an n+ diffusion layer, and a p+ diffusion layer through impurity implantation or the like. A silicide layer 103 disposed on the surfaces of the planar silicon layers (102pa, 102n, and 102pb) connects the planar silicon layers 102pa and 102n to each other. 104p1, 104p2, and 104p3 denote silicon pillars of p type, and 104n1, 104n2, and 104n3 denote silicon pillars of n type. 105 denotes a gate insulating film surrounding the silicon pillars 104p1, 104p2, 104p3, 104n1, 104n2, and 104n3. 106 denotes a gate electrode. 106a, 106b, 106c, and 106d each denote a gate line. At top portions of the silicon pillars 104p1, 104p2, and 104p3, n+ diffusion layers (hereinafter, also referred to as upper diffusion layers) 107n1, 107n2, and 107n3 are respectively formed through impurity implantation or the like. At top portions of the silicon pillars 104n1, 104n2, and 104n3, p+ diffusion layers (hereinafter, also referred to as upper diffusion layers) 107p1, 107p2, and 107p3 are formed through impurity implantation or the like. 108 denotes a silicon nitride film that protects the gate insulating film 105. 109n1, 109n2, 109n3, 109p1, 109p2, and 109p3 denote silicide layers respectively connected to the n+ diffusion layers 107n1, 107n2, and 107n3 and the p+ diffusion layers 107p1, 107p2, and 107p3. 110n1, 110n2, 110n3, 110p1, 110p2, and 110p3 denote contacts that respectively connect the silicide layers 109n1, 109n2, 109n3, 109p1, 109p2, and 109p3 to first metal lines 113h, 113c, 113c, 113a, 113e, and 113f. 111a denotes a contact that connects the gate line 106a to a first metal line 113b. 111b denotes a contact that connects the gate line 106b to a first metal line 113d. 111c denotes a contact that connects the gate line 106c to a first metal line 113g. 111d denotes a contact that connects the gate line 106d to a first metal line 113j.

114p1 denotes a contact that connects the first metal line 113a to a second metal line 115. 114p2 denotes a contact that connects the first metal line 113e to the second metal line 115.

The silicon pillar 104p1, the lower diffusion layer 102n, the upper diffusion layer 107n1, the gate insulating film 105, and the gate electrode 106 constitute the NMOS transistor Qn1. The silicon pillar 104p2, the lower diffusion layer 102n, the upper diffusion layer 107n2, the gate insulating film 105, and the gate electrode 106 constitute the NMOS transistor Qn2. The silicon pillar 104p3, the lower diffusion layer 102*n*, the upper diffusion layer 107*n*3, the gate insulating film 105, and the gate electrode 106 constitute the NMOS transistor Qn3. The silicon pillar 104*n*1, the lower diffusion layer 102*pa*, the upper diffusion layer 107*p*1, the gate insulating film 105, and the gate electrode 106 constitute the PMOS transistor Qp1. The silicon pillar 104*n*2, the lower diffusion layer 102*pb*, the upper diffusion layer 107*p*2, the gate insulating film 105, and the gate electrode 106 constitute the PMOS transistor Qp2. The silicon pillar 104*n*3, the lower diffusion layer 102*pb*, the upper diffusion layer 107*p*3, the gate insulting film 105, and the gate electrode 106 constitute the PMOS transistor Qp3.

In addition, the gate line 106*a* is connected to the gate electrode 106 of the NMOS transistor Qn1. The gate line 106*b* is connected to the gate electrode 106 of the NMOS transistor Qn2. The gate line 106*d* is connected to the gate electrode 106 of the NMOS transistor Qn3. The gate line 106*a* is connected to the gate electrode 106 of the PMOS transistor Qp1. The gate line 106*b* is connected to the gate electrode 106 of the PMOS transistor Qp2. The gate line 106*c* is connected to the gate electrode 106 of the PMOS transistor Qp3.

The lower diffusion layers 102*pa* and 102*n* serve as a common drain of the PMOS transistor Qp1 and the NMOS transistors Qn1, Qn2, and Qn3 and are connected to an output OUT1. The upper diffusion layer 107*n*1, which is a source of the NMOS transistor Qn1, is connected to the first metal line 113*h* via the silicide layer 109*n*1 and the contact 110*n*1. The first metal line 113*h* is supplied with the reference voltage Vss. The upper diffusion layer 107*n*2, which is a source of the NMOS transistor Qn2, is connected to the first metal line 113*c* via the silicide layer 109*n*2 and the contact 110*n*2. The first metal line 113*c* is supplied with the reference voltage Vss. The upper diffusion layer 107*n*3, which is a source of the NMOS transistor Qn3, is connected to the first metal line 113*c* via the silicide layer 109*n*3 and the contact 110*n*3. The upper diffusion layer 107*p*1, which is a source of the PMOS transistor Qp1, is connected to the first metal line 113*a* via the silicide layer 109*p*1 and the contact 110*p*1. The first metal line 113*a* is further connected to the second metal line 115 via the contact 114*p*1. The upper diffusion layer 107*p*2, which is a drain of the PMOS transistor Qp2, is connected to the first metal line 113*e* via the silicide layer 109*p*2 and the contact 110*p*2. The first metal line 113*e* is further connected to the second metal line 115 via the contact 114*p*2. The source of the PMOS transistor Qp1 and the drain of the PMOS transistor Qp2 are connected to each other via the second metal line 115. In addition, the source of the PMOS transistor Qp2 is connected to the drain of the PMOS transistor Qp3 via the lower diffusion layer 102*pb* and the silicide layer 103. The source of the PMOS transistor Qp3 is connected to the first metal line 113*f* via the contact 110*p*3. The first metal line 113*f* is supplied with the supply voltage Vcc.

The gate line 106*d* is connected to the first metal line 113*j* via the contact 111*d*. The first metal line 113*j* extends at an upper part of FIGS. 3A to 3D and is connected to a second metal line 116 via a contact 114*a*. The gate line 106*c* is connected to the first metal line 113*g* via the contact 111*c*. The first metal line 113*g* is connected to the second metal line 116 via a contact 114*b*.

The input signal IN1 is supplied to the first metal line 113*b*, is connected to the gate line 106*a* via the contact 111*a*, and is supplied to the gate electrodes 106 of the NMOS transistor Qn1 and the PMOS transistor Qp1.

The input signal IN2 is supplied to the first metal line 113*d*, is connected to the gate line 106*b* via the contact 111*b*, and is connected to the gate electrodes 106 of the NMOS transistor Qn2 and the PMOS transistor Qp2.

The input signal IN3 is supplied to the first metal line 113*g*, is connected to the gate line 106*c* via the contact 111*c*, and is connected to the gate electrode 106 of the PMOS transistor Qp3. The first metal line 113*g* is further connected to the second metal line 116 via the contact 114*b*. The second metal line 116 is connected to the gate line 106*d* via the contact 114*a* and the first metal line 113*j*, and thus the input signal IN3 is connected to the gate electrode 106 of the NMOS transistor Qn3.

According to the second embodiment, six SGTs constituting a 3-input NOR circuit can be arranged in a line without providing any extra lines or contact regions. Thus, a semiconductor device with a reduced area can be provided.

Further, a higher speed can be achieved because line resistance and parasitic capacitance can be reduced by omitting an extending gate line.

Third Embodiment

Figure 4A:
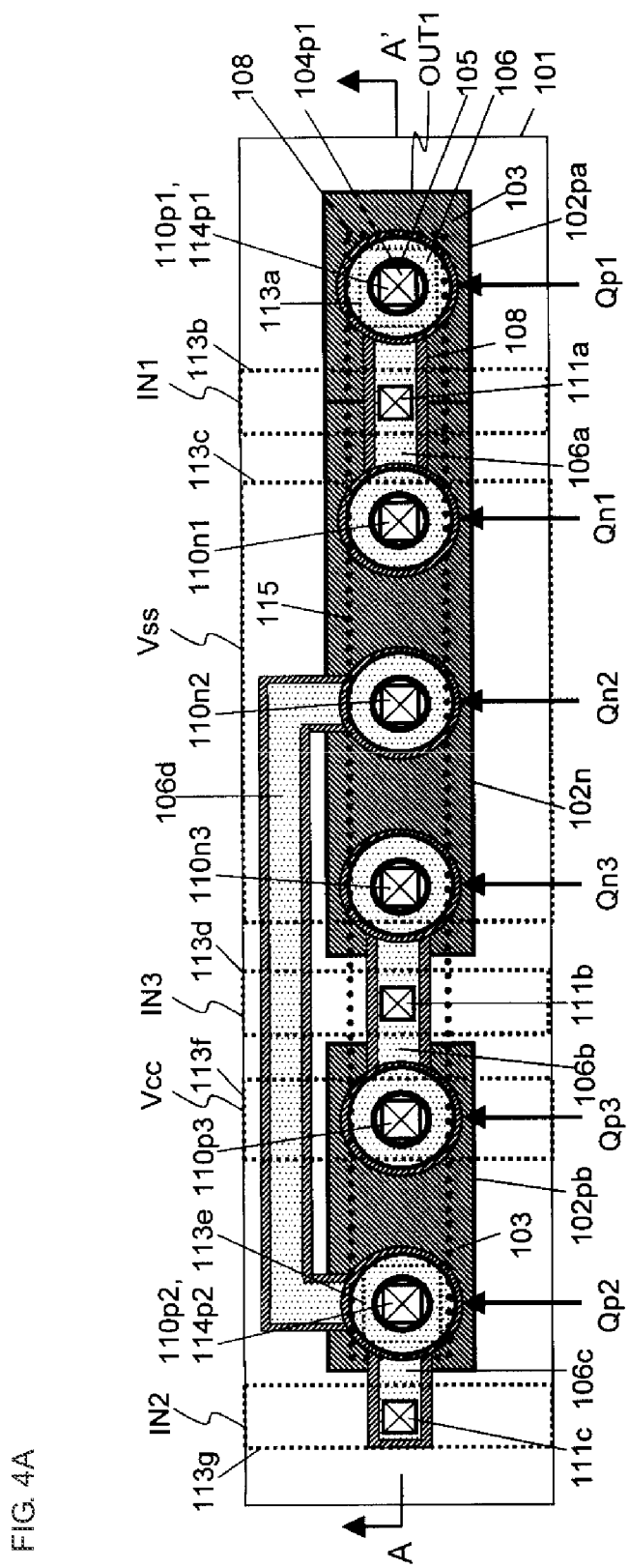
FIG. 4A is a plan view of a NOR circuit according to a third embodiment of the present invention.
Figure 4B:
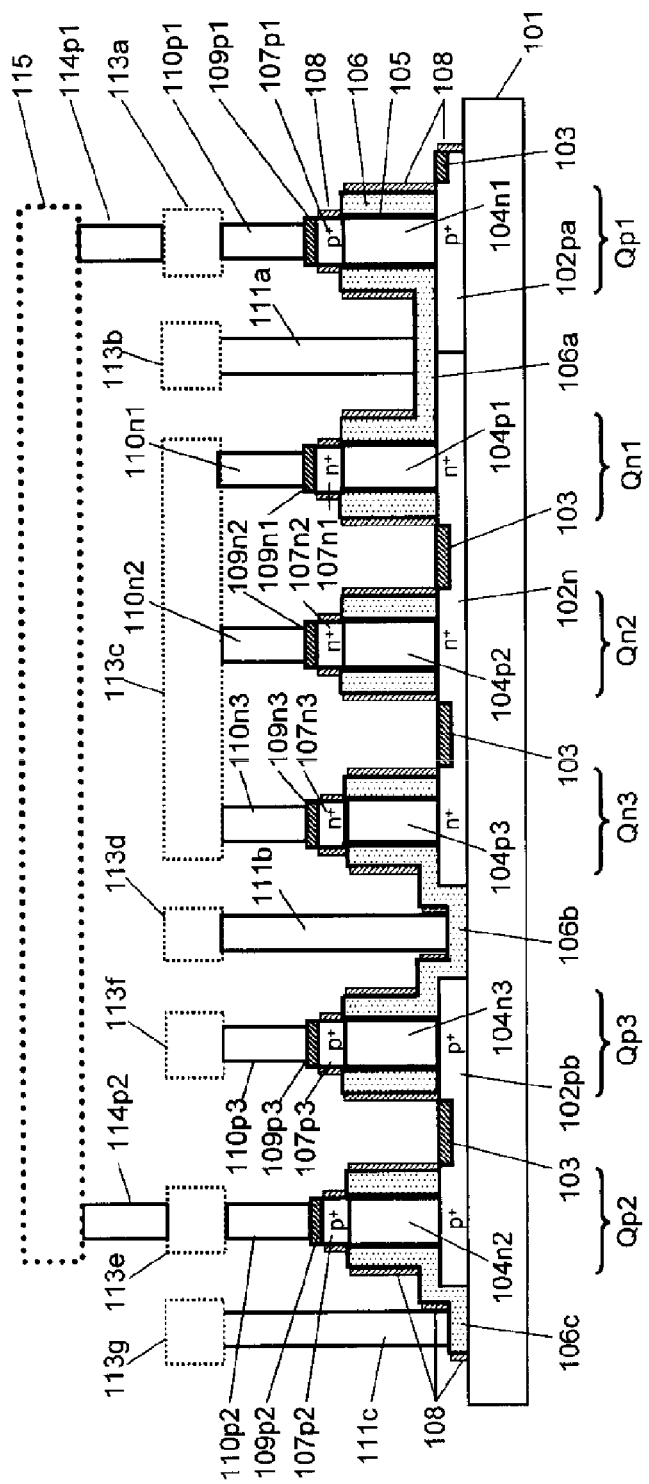
FIG. 4B is a cross-sectional view of the NOR circuit according to the third embodiment of the present invention.

FIGS. 4A and 4B illustrate a third embodiment. FIG. 4A is a plan view of the layout (arrangement) in the 3-input NOR circuit (hereinafter, simply referred to as a NOR circuit) of the present invention. FIG. 4B is a cross-sectional view taken along a cut line A-A' illustrated in FIG. 4A.

Referring to FIG. 4A, the PMOS transistor Qp1, the NMOS transistor Qn1, the NMOS transistor Qn2, the NMOS transistor Qn3, the PMOS transistor Qp3, and the PMOS transistor Qp2 of the NOR circuit illustrated in FIG. 1 are arranged in a line from the right.

A difference from the configuration illustrated in FIGS. 2A and 2B is that the positions of the NMOS transistors Qn2 and Qn3 are switched and the positions of the PMOS transistors Qp2 and Qp3 are also switched.

In FIGS. 4A and 4B, the same or substantially the same structures as those illustrated in FIGS. 2A and 2B are denoted by the same reference numerals in the 100s.

Planar silicon layers 102*pa*, 102*n*, and 102*pb* are disposed on an insulating film, such as a buried oxide (BOX) film layer 101 disposed on a substrate. The planar silicon layers (hereinafter, also referred to as lower diffusion layers) 102*pa*, 102*n*, and 102*pb* are respectively formed as a p+ diffusion layer, an n+ diffusion layer, and a p+ diffusion layer through impurity implantation or the like. A silicide layer 103 disposed on the surfaces of the planar silicon layers (102*pa*, 102*n*, and 102*pb*) connects the planar silicon layers 102*pa* and 102*n* to each other. 104*p*1, 104*p*2, and 104*p*3 denote silicon pillars of p type, and 104*n*1, 104*n*2, and 104*n*3 denote silicon pillars of n type. 105 denotes a gate insulating film surrounding the silicon pillars 104*p*1, 104*p*2, 104*p*3, 104*n*1, 104*n*2, and 104*n*3. 106 denotes a gate electrode. 106*a*, 106*b*, 106*c*, and 106*d* each denote a gate line. At top portions of the silicon pillars 104*p*1, 104*p*2, and 104*p*3, n+ diffusion layers (hereinafter, also referred to as upper diffusion layers) 107*n*1, 107*n*2, and 107*n*3 are respectively formed through impurity implantation or the like. At top portions of the silicon pillars 104*n*1, 104*n*2, and 104*n*3, p+ diffusion layers (hereinafter, also referred to as upper diffusion layers) 107*p*1, 107*p*2, and 107*p*3 are formed through impurity implantation or the like. 108 denotes a silicon nitride film that protects the gate insulating film 105. 109*n*1, 109*n*2, 109*n*3, 109*p*1, 109*p*2, and 109*p*3 denote silicide layers respectively connected to the n+ diffusion layers 107*n*1, 107*n*2, and 107*n*3 and the p+ diffusion layers 107*p*1, 107*p*2, and 107*p*3. 110*n*1, 110*n*2, 110*n*3, 110*p*1, 110*p*2, and 110*p*3 denote contacts that respectively connect the silicide layers 109n1, 109n2, 109n3, 109p1, 109p2, and 109p3 to first metal lines 113c, 113c, 113c, 113a, 113e, and 113f. 111a denotes a contact that connects the gate line 106a to a first metal line 113b. 111b denotes a contact that connects the gate line 106b to a first metal line 113d. 111c denotes a contact that connects the gate line 106c to a first metal line 113g.

114p1 denotes a contact that connects the first metal line 113a to a second metal line 115. 114p2 denotes a contact that connects the first metal line 113e to the second metal line 115.

The silicon pillar 104p1, the lower diffusion layer 102n, the upper diffusion layer 107n1, the gate insulating film 105, and the gate electrode 106 constitute the NMOS transistor Qn1. The silicon pillar 104p2, the lower diffusion layer 102n, the upper diffusion layer 107n2, the gate insulating film 105, and the gate electrode 106 constitute the NMOS transistor Qn2. The silicon pillar 104p3, the lower diffusion layer 102n, the upper diffusion layer 107n3, the gate insulating film 105, and the gate electrode 106 constitute the NMOS transistor Qn3. The silicon pillar 104n1, the lower diffusion layer 102pa, the upper diffusion layer 107p1, the gate insulating film 105, and the gate electrode 106 constitute the PMOS transistor Qp1. The silicon pillar 104n2, the lower diffusion layer 102pb, the upper diffusion layer 107p2, the gate insulating film 105, and the gate electrode 106 constitute the PMOS transistor Qp2. The silicon pillar 104n3, the lower diffusion layer 102pb, the upper diffusion layer 107p3, the gate insulting film 105, and the gate electrode 106 constitute the PMOS transistor Qp3.

In addition, the gate line 106a is connected to the gate electrode 106 of the NMOS transistor Qn1. The gate line 106d is connected to the gate electrode 106 of the NMOS transistor Qn2. The gate line 106b is connected to the gate electrode 106 of the NMOS transistor Qn3. The gate line 106a is connected to the gate electrode 106 of the PMOS transistor Qp1. The gate lines 106c and 106d are connected to the gate electrode 106 of the PMOS transistor Qp2. The gate line 106b is connected to the gate electrode 106 of the PMOS transistor Qp3.

The lower diffusion layers 102pa and 102n serve as a common drain of the PMOS transistor Qp1 and the NMOS transistors Qn1, Qn2, and Qn3 and are connected to an output OUT1. The upper diffusion layer 107n1, which is a source of the NMOS transistor Qn1, is connected to the first metal line 113c via the silicide layer 109n1 and the contact 110n1. The first metal line 113c is supplied with the reference voltage Vss. The upper diffusion layer 107n2, which is a source of the NMOS transistor Qn2, is connected to the first metal line 113c via the silicide layer 109n2 and the contact 110n2. The upper diffusion layer 107n3, which is a source of the NMOS transistor Qn3, is connected to the first metal line 113c via the silicide layer 109n3 and the contact 110n3. The upper diffusion layer 107p1, which is a source of the PMOS transistor Qp1, is connected to the first metal line 113a via the silicide layer 109p1 and the contact 110p1. The first metal line 113a is further connected to the second metal line 115 via the contact 114p1. The upper diffusion layer 107p2, which is a drain of the PMOS transistor Qp2, is connected to the first metal line 113e via the silicide layer 109p2 and the contact 110p2. The first metal line 113e is further connected to the second metal line 115 via the contact 114p2. The source of the PMOS transistor Qp1 and the drain of the PMOS transistor Qp2 are connected to each other via the second metal line 115. In addition, the source of the PMOS transistor Qp2 is connected to a drain of the PMOS transistor Qp3 via the lower diffusion layer 102pb and the silicide layer 103. The source of the PMOS transistor Qp3 is connected to the first metal line 113f via the contact 110n3. The first metal line 113f is supplied with the supply voltage Vcc.

The input signal IN1 is supplied to the first metal line 113b, is connected to the gate line 106a via the contact 111a, and is supplied to the gate electrodes 106 of the NMOS transistor Qn1 and the PMOS transistor Qp1.

The input signal IN2 is supplied to the first metal line 113g, is connected to the gate line 106c via the contact 111c, and is connected to the gate electrode 106 of the PMOS transistor Qp2. The input signal IN2 is also connected to the gate electrode 106 of the NMOS transistor Qn2 via the gate line 106d.

The input signal IN3 is supplied to the first metal line 113d, is connected to the gate line 106b via the contact 111b, and is connected to the gate electrodes 106 of the NMOS transistor Qn3 and the PMOS transistor Qp3.

According to the third embodiment, six SGTs constituting a 3-input NOR circuit can be arranged in a line without providing any extra lines or contact regions. Thus, a semiconductor device with a reduced area can be provided.

Fourth Embodiment

Figure 5A:
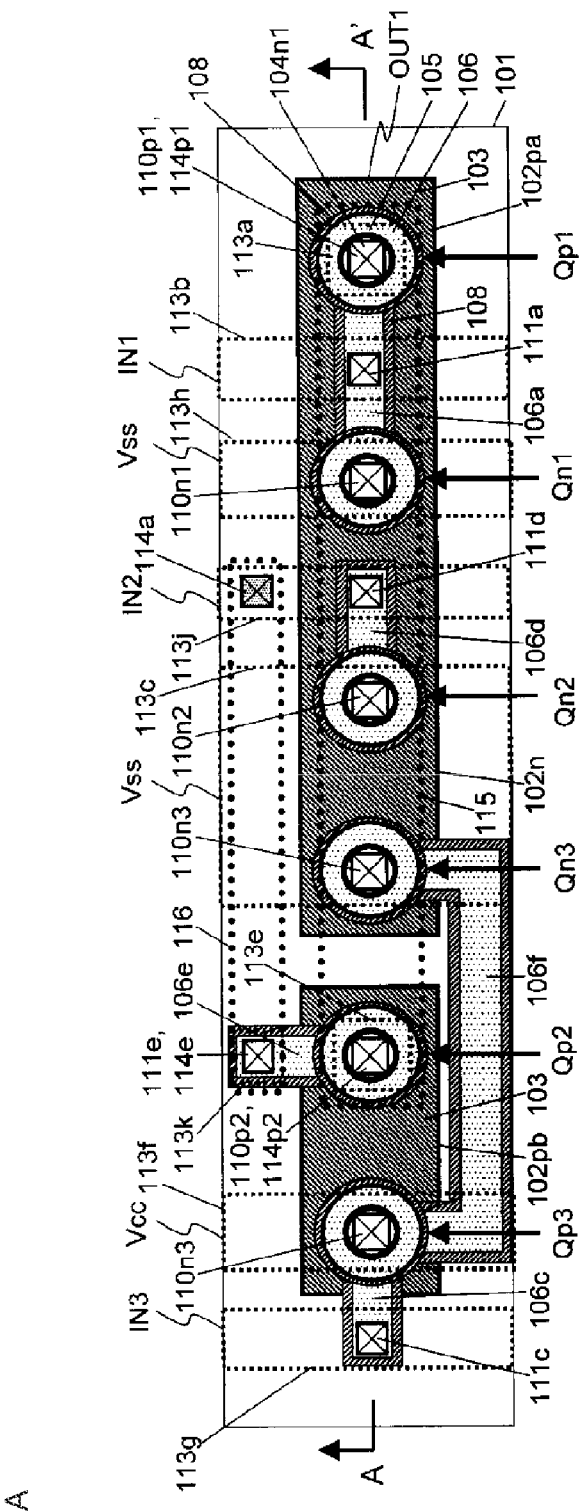
FIG. 5A is a plan view of a NOR circuit according to a fourth embodiment of the present invention.
Figure 5B:
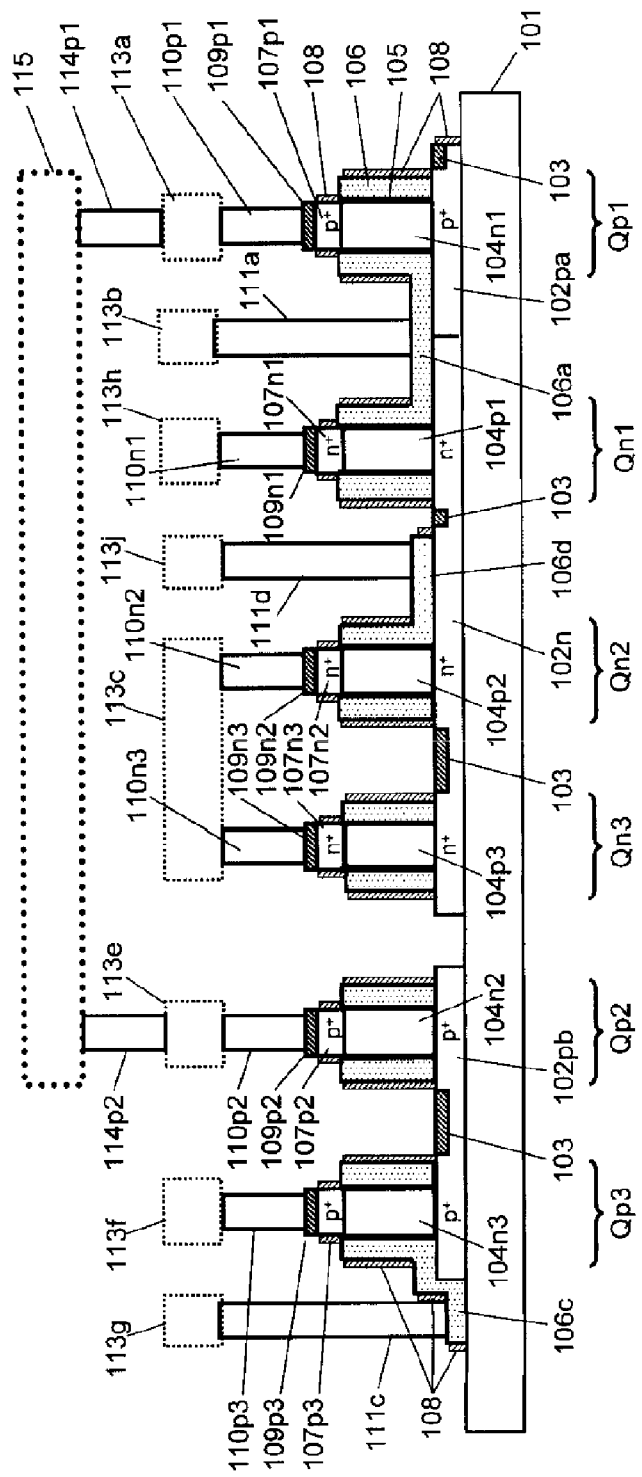
FIG. 5B is a cross-sectional view of the NOR circuit according to the fourth embodiment of the present invention.

FIGS. 5A and 5B illustrate a fourth embodiment. FIG. 5A is a plan view of the layout (arrangement) in the 3-input NOR circuit (hereinafter, simply referred to as a NOR circuit) of the present invention. FIG. 5B is a cross-sectional view taken along a cut line A-A' illustrated in FIG. 5A.

Referring to FIG. 5A, the PMOS transistor Qp1, the NMOS transistor Qn1, the NMOS transistor Qn2, the NMOS transistor Qn3, the PMOS transistor Qp2, and the PMOS transistor Qp3 of the NOR circuit illustrated in FIG. 1 are arranged in a line from the right.

A difference from the configuration illustrated in FIGS. 4A and 4B is that the positions of the PMOS transistors Qp2 and Qp3 are switched.

In FIGS. 5A and 5B, the same or substantially the same structures as those illustrated in FIGS. 4A and 4B are denoted by the same reference numerals in the 100s.

Planar silicon layers 102pa, 102n, and 102pb are disposed on an insulating film, such as a buried oxide (BOX) film layer 101 disposed on a substrate. The planar silicon layers (hereinafter, also referred to as lower diffusion layers) 102pa, 102n, and 102pb are respectively formed as a p+ diffusion layer, an n+ diffusion layer, and a p+ diffusion layer through impurity implantation or the like. A silicide layer 103 disposed on the surfaces of the planar silicon layers (102pa, 102n, and 102pb) connects the planar silicon layers 102pa and 102n to each other. 104p1, 104p2, and 104p3 denote silicon pillars of p type, and 104n1, 104n2, and 104n3 denote silicon pillars of n type. 105 denotes a gate insulating film surrounding the silicon pillars 104p1, 104p2, 104p3, 104n1, 104n2, and 104n3. 106 denotes a gate electrode. 106a, 106c, 106d, 106e, and 106f each denote a gate line. At top portions of the silicon pillars 104p1, 104p2, and 104p3, n+diffusion layers (hereinafter, also referred to as upper diffusion layers) 107n1, 107n2, and 107n3 are respectively formed through impurity implantation or the like. At top portions of the silicon pillars 104n1, 104n2, and 104n3, p+ diffusion layers (hereinafter, also referred to as upper diffusion layers) 107p1, 107p2, and 107p3 are formed through impurity implantation or the like. 108 denotes a silicon nitride film that protects the gate insulating film 105. 109n1, 109n2, 109n3, 109p1, 109p2, and 109p3 denote silicide layers respectively connected to the n+ diffusion layers 107*n*1, 107*n*2, and 107*n*3 and the p+ diffusion layers 107*p*1, 107*p*2, and 107*p*3. 110*n*1, 110*n*2, 110*n*3, 110*p*1, 110*p*2, and 110*p*3 denote contacts that respectively connect the silicide layers 109*n*1, 109*n*2, 109*n*3, 109*p*1, 109*p*2, and 109*p*3 to first metal lines 113*h*, 113*c*, 113*c*, 113*a*, 113*e*, and 113*f*. 111*a* denotes a contact that connects the gate line 106*a* to a first metal line 113*b*. 111*c* denotes a contact that connects the gate line 106*c* to a first metal line 113*g*. 111*d* denotes a contact that connects the gate line 106*d* to a first metal line 113*j*. 111*e* denotes a contact that connects the gate line 106*e* to a first metal line 113*k*.

114*p*1 denotes a contact that connects the first metal line 113*a* to a second metal line 115. 114*p*2 denotes a contact that connects the first metal line 113*e* to the second metal line 115. In addition, 114*a* denotes a contact that connects the first metal line 113*j* to a second metal line 116. 114*e* denotes a contact that connects the first metal line 113*k* to the second metal line 116.

The silicon pillar 104*p*1, the lower diffusion layer 102*n*, the upper diffusion layer 107*n*1, the gate insulating film 105, and the gate electrode 106 constitute the NMOS transistor Qn1. The silicon pillar 104*p*2, the lower diffusion layer 102*n*, the upper diffusion layer 107*n*2, the gate insulating film 105, and the gate electrode 106 constitute the NMOS transistor Qn2. The silicon pillar 104*p*3, the lower diffusion layer 102*n*, the upper diffusion layer 107*n*3, the gate insulating film 105, and the gate electrode 106 constitute the NMOS transistor Qn3. The silicon pillar 104*n*1, the lower diffusion layer 102*pa*, the upper diffusion layer 107*p*1, the gate insulating film 105, and the gate electrode 106 constitute the PMOS transistor Qp1. The silicon pillar 104*n*2, the lower diffusion layer 102*pb*, the upper diffusion layer 107*p*2, the gate insulating film 105, and the gate electrode 106 constitute the PMOS transistor Qp2. The silicon pillar 104*n*3, the lower diffusion layer 102*pb*, the upper diffusion layer 107*p*3, the gate insulting film 105, and the gate electrode 106 constitute the PMOS transistor Qp3.

In addition, the gate line 106*a* is connected to the gate electrode 106 of the NMOS transistor Qn1. The gate line 106*d* is connected to the gate electrode 106 of the NMOS transistor Qn2. The gate line 106*f* is connected to the gate electrode 106 of the NMOS transistor Qn3. The gate line 106*a* is connected to the gate electrode 106 of the PMOS transistor Qp1. The gate line 106*e* is connected to the gate electrode 106 of the PMOS transistor Qp2. The gate lines 106*c* and 106*f* are connected to the gate electrode 106 of the PMOS transistor Qp3.

The lower diffusion layers 102*pa* and 102*n* serve as a common drain of the PMOS transistor Qp1 and the NMOS transistors Qn1, Qn2, and Qn3 and are connected to an output OUT1. The upper diffusion layer 107*n*1, which is a source of the NMOS transistor Qn1, is connected to the first metal line 113*h* via the silicide layer 109*n*1 and the contact 110*n*1. The first metal line 113*h* is supplied with the reference voltage Vss. The upper diffusion layer 107*n*2, which is a source of the NMOS transistor Qn2, is connected to the first metal line 113*c* via the silicide layer 109*n*2 and the contact 110*n*2. The first metal line 113*c* is supplied with the reference voltage Vss. The upper diffusion layer 107*n*3, which is a source of the NMOS transistor Qn3, is connected to the first metal line 113*c* via the silicide layer 109*n*3 and the contact 110*n*3. The upper diffusion layer 107*p*1, which is a source of the PMOS transistor Qp1, is connected to the first metal line 113*a* via the silicide layer 109*p*1 and the contact 110*p*1. The first metal line 113*a* is further connected to the second metal line 115 via the contact 114*p*1. The upper diffusion layer 107*p*2, which is a drain of the PMOS transistor Qp2, is connected to the first metal line 113*e* via the silicide layer 109*p*2 and the contact 110*p*2. The first metal line 113*e* is further connected to the second metal line 115 via the contact 114*p*2. The source of the PMOS transistor Qp1 and the drain of the PMOS transistor Qp2 are connected to each other via the second metal line 115. In addition, the source of the PMOS transistor Qp2 is connected to a drain of the PMOS transistor Qp3 via the lower diffusion layer 102*pb* and the silicide layer 103. The source of the PMOS transistor Qp3 is connected to the first metal line 113*f* via the contact 110*p*3. The first metal line 113*f* is supplied with the supply voltage Vcc.

The input signal IN1 is supplied to the first metal line 113*b*, is connected to the gate line 106*a* via the contact 111*a*, and is supplied to the gate electrodes 106 of the NMOS transistor Qn1 and the PMOS transistor Qp1.

The input signal IN2 is supplied to the first metal line 113*j*, is connected to the gate line 106*d* via the contact 111*d*, and is connected to the gate electrode 106 of the NMOS transistor Qn2. The first metal line 113*j* is also connected to the second metal line 116 via the contact 114*a*. The first metal line 113*j* is further connected to the gate line 106*e* via the contact 114*e*, the first metal line 113*k*, and the contact 111*e*, and thus the input signal IN2 is connected to the gate electrode 106 of the PMOS transistor Qp2.

The input signal IN3 is supplied to the first metal line 113*g*, is connected to the gate line 106*c* via the contact 111*c*, and is connected to the gate electrode 106 of the PMOS transistor Qp3. The input signal IN3 is also connected to the gate electrode 106 of the NMOS transistor Qn3 via the gate line 106*f*.

According to the fourth embodiment, six SGTs constituting a 3-input NOR circuit can be arranged in a line without providing any extra lines or contact regions. Thus, a semiconductor device with a reduced area can be provided.

Fifth Embodiment

Figure 6:
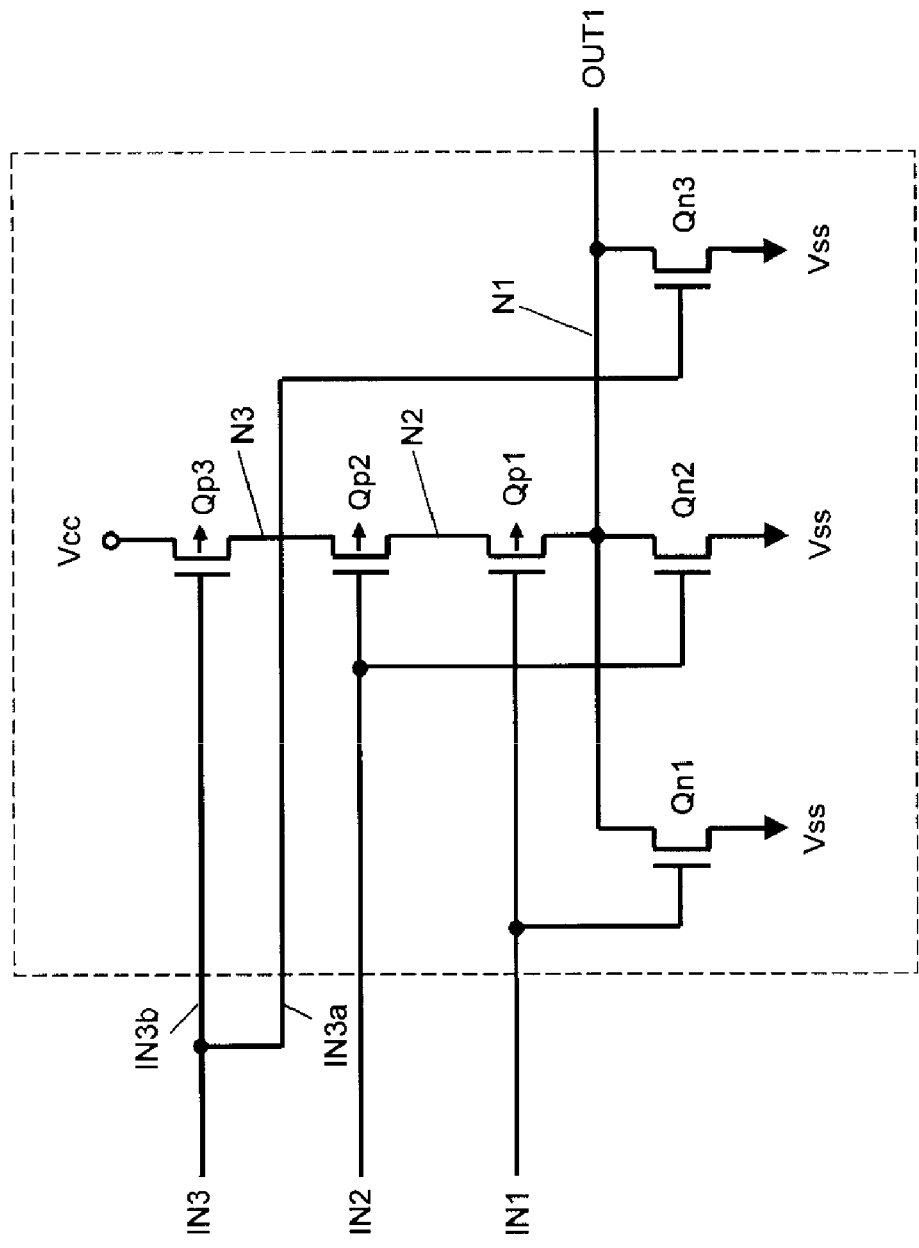
FIG. 6 is another equivalent circuit diagram of a NOR circuit according to embodiments of the present invention.

FIG. 6 illustrates a modification of the equivalent circuit of the 3-input NOR circuit illustrated in FIG. 1. The input signal IN3 is connected to the gates of the NMOS transistor Qn3 and the PMOS transistor Qp3 via different lines, i.e., lines IN3*a* and IN3*b*, respectively. The lines IN3*a* and IN3*b* are connected to IN3 in a region not illustrated in FIG. 6. The circuits illustrated in FIGS. 1 and 6 are equivalent in terms of operation; however, the circuits illustrated in FIGS. 1 and 6 are handled as different equivalent circuits in following embodiments in order to clarify connections because IN3 is not illustrated in the layout (arrangement) in some of the embodiments.

Figure 7A:
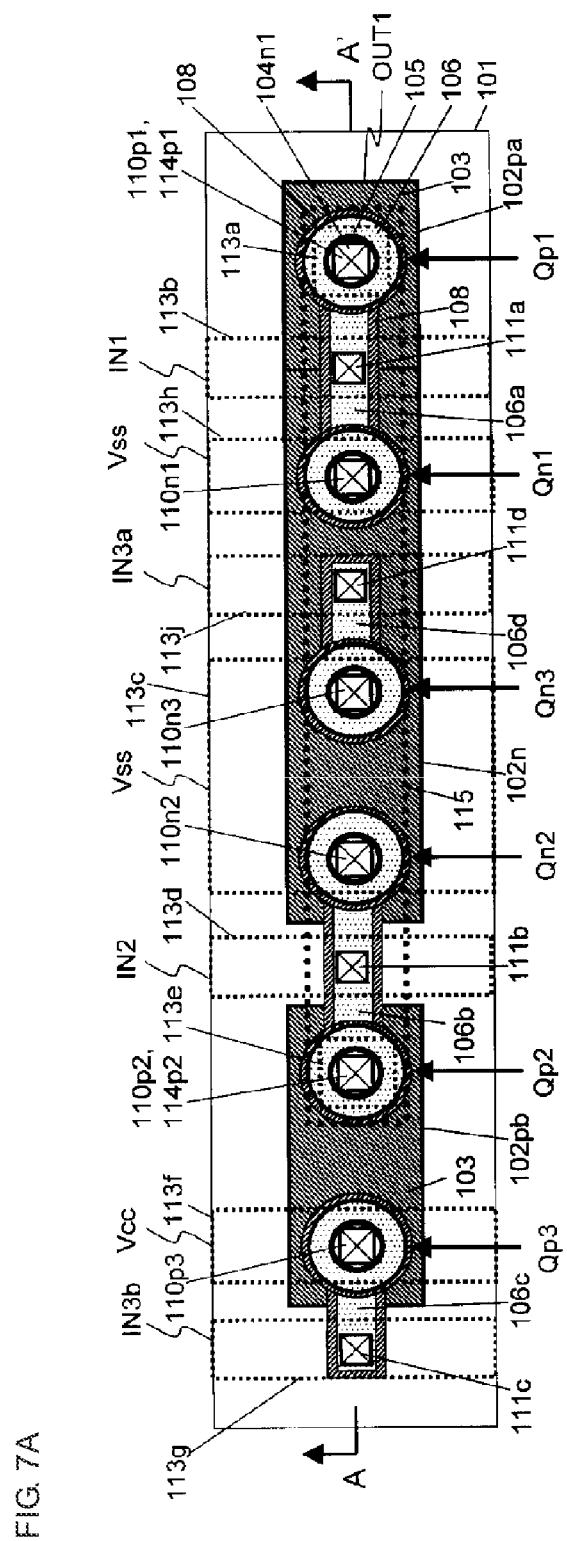
FIG. 7A is a plan view of a NOR circuit according to a fifth embodiment of the present invention.
Figure 7B:
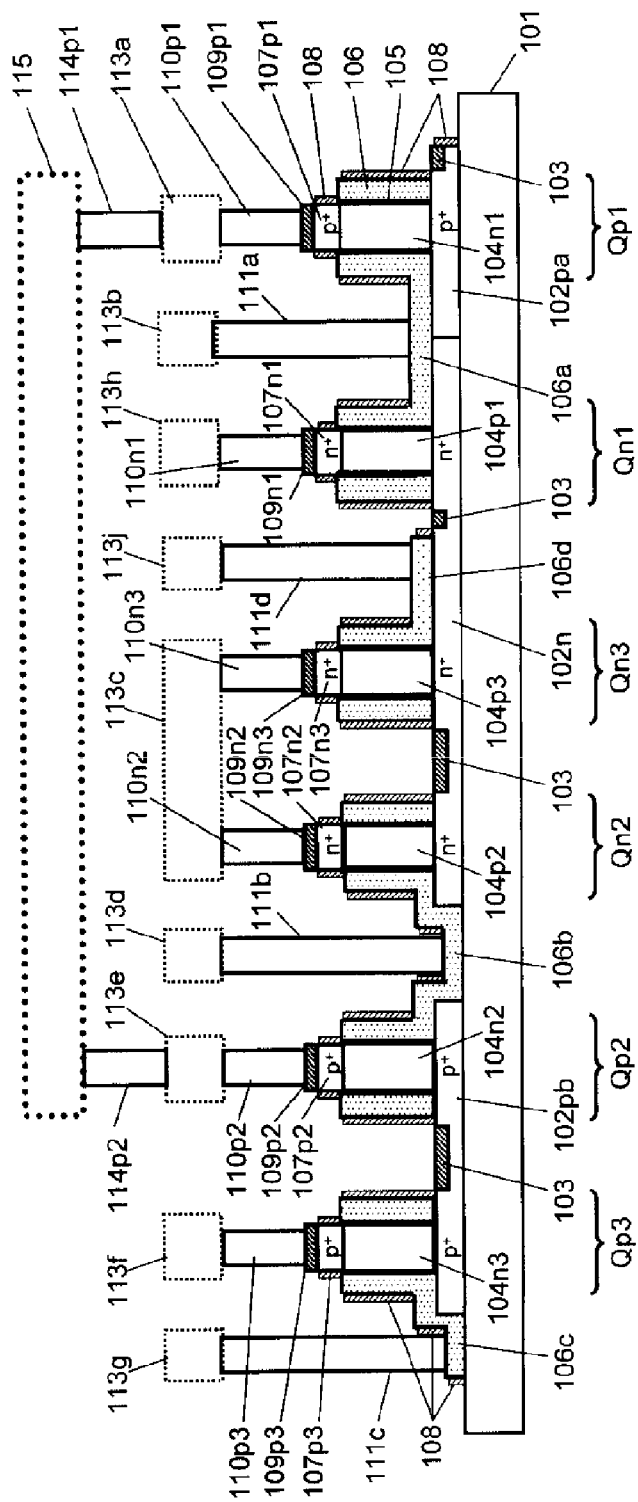
FIG. 7B is a cross-sectional view of the NOR circuit according to the fifth embodiment of the present invention.

FIGS. 7A and 7B illustrate a fifth embodiment. FIG. 7A is a plan view of the layout (arrangement) in the 3-input NOR circuit (hereinafter, simply referred to as a NOR circuit) of the present invention. FIG. 7B is a cross-sectional view taken along a cut line A-A' illustrated in FIG. 7A.

Referring to FIG. 7*a*, the PMOS transistor Qp1, the NMOS transistor Qn1, the NMOS transistor Qn3, the NMOS transistor Qn2, the PMOS transistor Qp2, and the PMOS transistor Qp3 of the NOR circuit illustrated in FIG. 6 are arranged in a line from the right. A difference from the configuration illustrated in FIGS. 2A and 2B is that the input signal IN3 is supplied using different lines IN3*a* and IN3*b* and the extending gate line 106*d* is omitted.

In FIGS. 7A and 7B, the same or substantially the same structures as those illustrated in FIGS. 2A and 2B are denoted by the same reference numerals in the 100s.

Planar silicon layers 102*pa*, 102*n*, and 102*pb* are disposed on an insulating film, such as a buried oxide (BOX) film layer 101 disposed on a substrate. The planar silicon layers (hereinafter, also referred to as lower diffusion layers) 102*pa*, 102*n*, and 102*pb* are respectively formed as a p+ diffusion layer, an n+ diffusion layer, and a p+ diffusion layer through impurity implantation or the like. A silicide layer 103 disposed on the surfaces of the planar silicon layers (102*pa*, 102*n*, and 102*pb*) connects the planar silicon layers 102*pa* and 102*n* to each other. 104*p*1, 104*p*2, and 104*p*3 denote silicon pillars of p type, and 104*n*1, 104*n*2, and 104*n*3 denote silicon pillars of n type. 105 denotes a gate insulating film surrounding the silicon pillars 104*p*1, 104*p*2, 104*p*3, 104*n*1, 104*n*2, and 104*n*3. 106 denotes a gate electrode. 106*a*, 106*b*, 106*c*, and 106*d* each denote a gate line. At top portions of the silicon pillars 104*p*1, 104*p*2, and 104*p*3, n+ diffusion layers (hereinafter, also referred to as upper diffusion layers) 107*n*1, 107*n*2, and 107*n*3 are respectively formed through impurity implantation or the like. At top portions of the silicon pillars 104*n*1, 104*n*2, and 104*n*3, p+ diffusion layers (hereinafter, also referred to as upper diffusion layers) 107*p*1, 107*p*2, and 107*p*3 are formed through impurity implantation or the like. 108 denotes a silicon nitride film that protects the gate insulating film 105. 109*n*1, 109*n*2, 109*n*3, 109*p*1, 109*p*2, and 109*p*3 denote silicide layers respectively connected to the n+ diffusion layers 107*n*1, 107*n*2, and 107*n*3 and the p+ diffusion layers 107*p*1, 107*p*2, and 107*p*3. 110*n*1, 110*n*2, 110*n*3, 110*p*1, 110*p*2, and 110*p*3 are contacts that respectively connect the silicide layers 109*n*1, 109*n*2, 109*n*3, 109*p*1, 109*p*2, and 109*p*3 to first metal lines 113*h*, 113*c*, 113*c*, 113*a*, 113*e*, and 113*f*. 111*a* denotes a contact that connects the gate line 106*a* to a first metal line 113*b*. 111*b* denotes a contact that connects the gate line 106*b* to a first metal line 113*d*. 111*c* denotes a contact that connects the gate line 106*c* to a first metal line 113*g*. 111*d* denotes a contact that connects the gate line 106*d* to a first metal line 113*j*.

114*p*1 denotes a contact that connects the first metal line 113*a* to a second metal line 115. 114*p*2 denotes a contact that connects the first metal line 113*e* to the second metal line 115.

The silicon pillar 104*p*1, the lower diffusion layer 102*n*, the upper diffusion layer 107*n*1, the gate insulating film 105, and the gate electrode 106 constitute the NMOS transistor Qn1. The silicon pillar 104*p*2, the lower diffusion layer 102*n*, the upper diffusion layer 107*n*2, the gate insulating film 105, and the gate electrode 106 constitute the NMOS transistor Qn2. The silicon pillar 104*p*3, the lower diffusion layer 102*n*, the upper diffusion layer 107*n*3, the gate insulating film 105, and the gate electrode 106 constitute the NMOS transistor Qn3. The silicon pillar 104*n*1, the lower diffusion layer 102*pa*, the upper diffusion layer 107*p*1, the gate insulating film 105, and the gate electrode 106 constitute the PMOS transistor Qp1. The silicon pillar 104*n*2, the lower diffusion layer 102*pb*, the upper diffusion layer 107*p*2, the gate insulating film 105, and the gate electrode 106 constitute the PMOS transistor Qp2. The silicon pillar 104*n*3, the lower diffusion layer 102*pb*, the upper diffusion layer 107*p*3, the gate insulting film 105, and the gate electrode 106 constitute the PMOS transistor Qp3.

In addition, the gate line 106*a* is connected to the gate electrode 106 of the NMOS transistor Qn1. The gate line 106*b* is connected to the gate electrode 106 of the NMOS transistor Qn2. The gate line 106*d* is connected to the gate electrode 106 of the NMOS transistor Qn3. The gate line 106*a* is connected to the gate electrode 106 of the PMOS transistor Qp1. The gate line 106*b* is connected to the gate electrode 106 of the PMOS transistor Qp2. The gate line 106*c* is connected to the gate electrode 106 of the PMOS transistor Qp3.

The lower diffusion layers 102*pa* and 102*n* serve as a common drain of the PMOS transistor Qp1 and the NMOS transistors Qn1, Qn2, and Qn3 and are connected to an output OUT1. The upper diffusion layer 107*n*1, which is a source of the NMOS transistor Qn1, is connected to the first metal line 113*h* via the silicide layer 109*n*1 and the contact 110*n*1. The first metal line 113*h* is supplied with the reference voltage Vss. The upper diffusion layer 107*n*2, which is a source of the NMOS transistor Qn2, is connected to the first metal line 113*c* via the silicide layer 109*n*2 and the contact 110*n*2. The first metal line 113*c* is supplied with the reference voltage Vss. The upper diffusion layer 107*n*3, which is a source of the NMOS transistor Qn3, is connected to the first metal line 113*c* via the silicide layer 109*n*3 and the contact 110*n*3. The upper diffusion layer 107*p*1, which is a source of the PMOS transistor Qp1, is connected to the first metal line 113*a* via the silicide layer 109*p*1 and the contact 110*p*1. The first metal line 113*a* is further connected to the second metal line 115 via the contact 114*p*1. The upper diffusion layer 107*p*2, which is a drain of the PMOS transistor Qp2, is connected to the first metal line 113*e* via the silicide layer 109*p*2 and the contact 110*p*2. The first metal line 113*e* is further connected to the second metal line 115 via the contact 114*p*2. The source of the PMOS transistor Qp1 and the drain of the PMOS transistor Qp2 are connected to each other via the second metal line 115. In addition, the source of the PMOS transistor Qp2 is connected to a drain of the PMOS transistor Qp3 via the lower diffusion layer 102*pb* and the silicide layer 103. The source of the PMOS transistor Qp3 is connected to the first metal line 113*f* via the contact 110*p*3. The first metal line 113*f* is supplied with the supply voltage Vcc.

The input signal IN1 is supplied to the first metal line 113*b*, is connected to the gate line 106*a* via the contact 111*a*, and is supplied to the gate electrodes 106 of the NMOS transistor Qn1 and the PMOS transistor Qp1.

The input signal IN2 is supplied to the first metal line 113*d*, is connected to the gate line 106*b* via the contact 111*b*, and is connected to the gate electrodes 106 of the NMOS transistor Qn2 and the PMOS transistor Qp2.

The input signal IN3*a* is supplied to the first metal line 113*j*, is connected to the gate line 106*d* via the contact 111*d*, and is connected to the gate electrode 106 of the NMOS transistor Qn3.

The input signal IN3*b* is supplied to the first metal line 113*g*, is connected to the gate line 106*c* via the contact 111*c*, and is connected to the gate electrode 106 of the PMOS transistor Qp3. The input signals IN3*a* and IN3*b* are connected to the input signal IN3 at a node (not illustrated).

According to the fifth embodiment, although the number of input signal lines increases by one, an extending gate line and an extending second metal line can be omitted. In addition, six SGTs constituting a 3-input NOR circuit can be arranged in a line without providing any extra lines or contact regions. Thus, a semiconductor device with a reduced area can be provided.

Sixth Embodiment

Figure 8A:
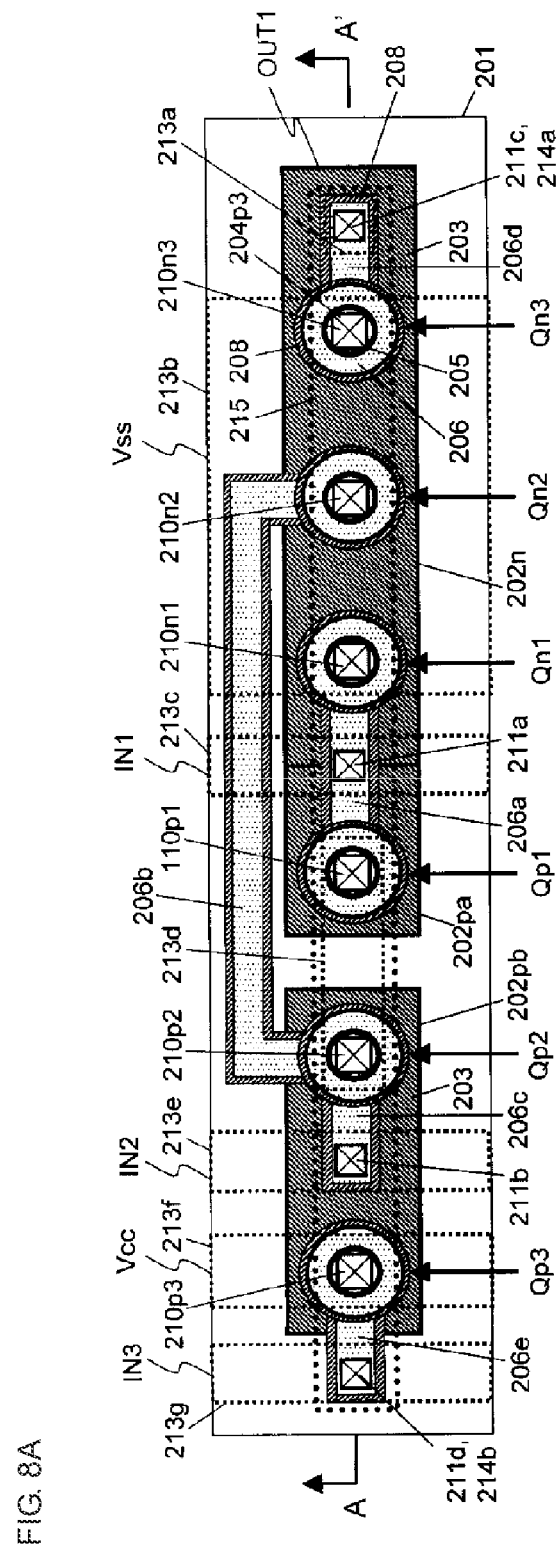
FIG. 8A is a plan view of a NOR circuit according to a sixth embodiment of the present invention.
Figure 8B:
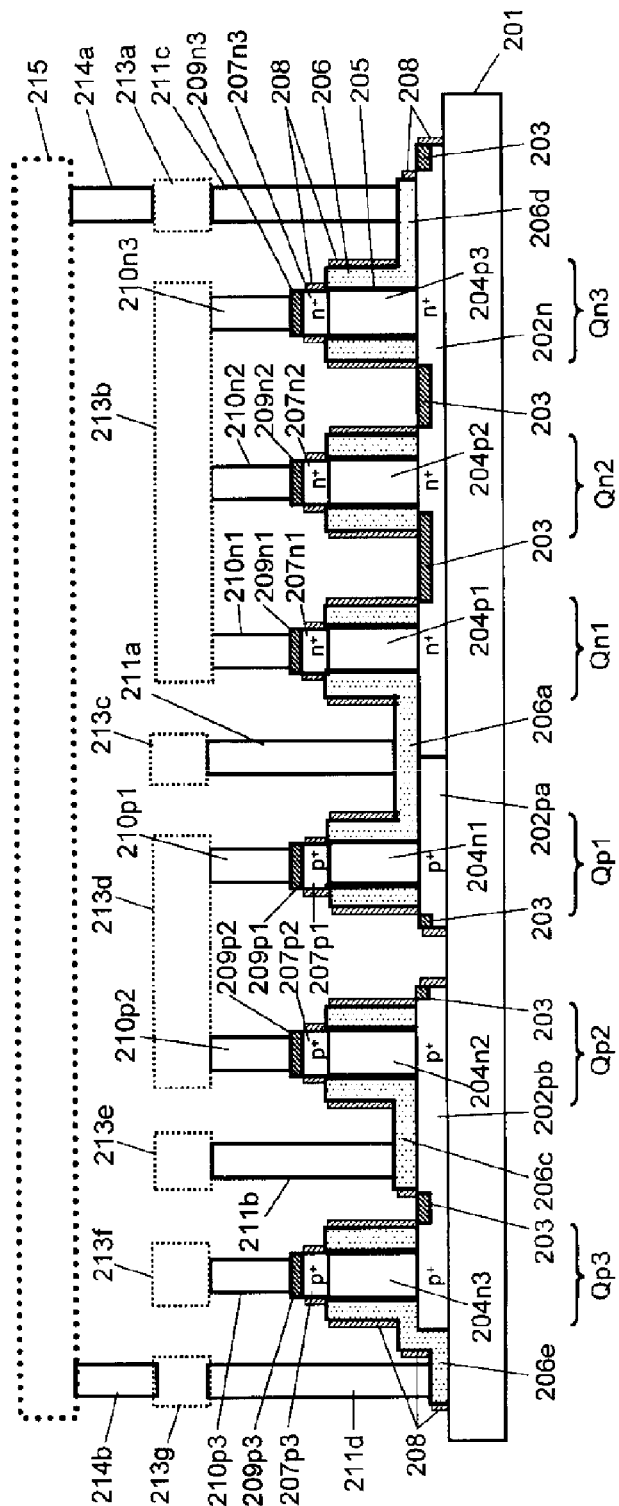
FIG. 8B is a cross-sectional view of the NOR circuit according to the sixth embodiment of the present invention.

FIGS. 8A and 8B illustrate a sixth embodiment. FIG. 8A is a plan view of the layout (arrangement) in the 3-input NOR circuit (hereinafter, simply referred to as a NOR circuit) of the present invention. FIG. 8B is a cross-sectional view taken along a cut line A-A' illustrated in FIG. 8A.

The sixth embodiment is based on the equivalent circuit illustrated in FIG. 1 because the input signal IN3 is input directly.

Referring to FIG. 8A, the NMOS transistor Qn3, the NMOS transistor Qn2, the NMOS transistor Qn1, the PMOS transistor Qp1, the PMOS transistor Qp2, and the PMOS transistor Qp3 of the NOR circuit illustrated in FIG. 1 are arranged in a line from the right.

A difference from the configuration illustrated in FIGS. 2A and 2B is that positions of the NMOS transistors Qn1, Qn2, and Qn3 and the PMOS transistor Qp1 are changed.

In FIGS. 8A and 8B, the same or substantially the same structures as those illustrated in FIGS. 2A and 2B are denoted by reference numerals in the 200s having the same last one or two digits as the reference numerals used in FIGS. 2A and 2B.

Planar silicon layers 202n, 202pa, and 202pb are disposed on an insulating film, such as a buried oxide (BOX) film layer 201 disposed on a substrate. The planar silicon layers (hereinafter, also referred to as lower diffusion layers) 202n, 202pa, and 202pb are respectively formed of an n+ diffusion layer, a p+ diffusion layer, and a p+ diffusion layer through impurity implantation or the like. A silicide layer 203 disposed on the surfaces of the planar silicon layers (202n, 202pa, and 202pb) connects the planar silicon layers 202n and 202pa to each other. 204p1, 204p2, and 204p3 denote silicon pillars of p type, and 204n1, 204n2, and 204n3 denote silicon pillars of n type. 205 denotes a gate insulating film surrounding the silicon pillars 204p1, 204p2, 204p3, 204n1, 204n2, and 204n3. 206 denotes a gate electrode. 206a, 206b, 206c, 206d, and 206e each denote a gate line. At top portions of the silicon pillars 204p1, 204p2, and 204p3, n+diffusion layers (hereinafter, also referred to as upper diffusion layers) 207n1, 207n2, and 207n3 are respectively formed through impurity implantation or the like. At top portions of the silicon pillars 204n1, 204n2, and 204n3, p+ diffusion layers (hereinafter, also referred to as upper diffusion layers) 207p1, 207p2, and 207p3 are respectively formed through impurity implantation or the like. 208 denotes a silicon nitride film that protects the gate insulating film 205. 209n1, 209n2, 209n3, 209p1, 209p2, and 209p3 denote silicide layers respectively connected to the n+diffusion layers 207n1, 207n2, and 207n3 and the p+ diffusion layers 207p1, 207p2, and 207p3. 210n1, 210n2, 210n3, 210p1, 210p2, and 210p3 denote contacts that respectively connect the silicide layers 209n1, 209n2, 209n3, 209p1, 209p2, and 209p3 to first metal lines 213b, 213b, 213b, 213d, 213d, and 213f. 211a denotes a contact that connects the gate line 206a to a first metal line 213c. 211b denotes a contact that connects the gate line 206c to a first metal line 213e. 211c denotes a contact that connects the gate line 206d to a first metal line 213a. 211d denotes a contact that connects the gate line 206e to a first metal line 213g.

214a denotes a contact that connects the first metal line 213a to a second metal line 215. 214b denotes a contact that connects the first metal line 213g to the second metal line 215.

The silicon pillar 204p1, the lower diffusion layer 202n, the upper diffusion layer 207n1, the gate insulating film 205, and the gate electrode 206 constitute the NMOS transistor Qn1. The silicon pillar 204p2, the lower diffusion layer 202n, the upper diffusion layer 207n2, the gate insulating film 205, and the gate electrode 206 constitute the NMOS transistor Qn2. The silicon pillar 204p3, the lower diffusion layer 202n, the upper diffusion layer 207n3, the gate insulating film 205, and the gate electrode 206 constitute the NMOS transistor Qn3. The silicon pillar 204n1, the lower diffusion layer 202pa, the upper diffusion layer 207p1, the gate insulating film 205, and the gate electrode 206 constitute the PMOS transistor Qp1. The silicon pillar 204n2, the lower diffusion layer 202pb, the upper diffusion layer 207p2, the gate insulating film 205, and the gate electrode 206 constitute the PMOS transistor Qp2. The silicon pillar 204n3, the lower diffusion layer 202pb, the upper diffusion layer 207p3, the gate insulating film 205, and the gate electrode 206 constitute the PMOS transistor Qp3.

In addition, the gate line 206a is connected to the gate electrode 206 of the NMOS transistor Qn1. The gate line 206b is connected to the gate electrode 206 of the NMOS transistor Qn2. The gate line 206d is connected to the gate electrode 206 of the NMOS transistor Qn3. The gate line 206a is connected to the gate electrode 206 of the PMOS transistor Qp1. The gate lines 206b and 206c are connected to the gate electrode 206 of the PMOS transistor Qp2. The gate line 206e is connected to the gate electrode 206 of the PMOS transistor Qp3.

The lower diffusion layers 202pa and 202n serve as a common drain of the PMOS transistor Qp1 and the NMOS transistors Qn1, Qn2, and Qn3 and is connected to an output OUT1. The upper diffusion layer 207n1, which is a source of the NMOS transistor Qn1, is connected to the first metal line 213b via the silicide layer 209n1 and the contact 210n1. The first metal line 213b is supplied with the reference voltage Vss. The upper diffusion layer 207n2, which is a source of the NMOS transistor Qn2, is connected to the first metal line 213b via the silicide layer 209n2 and the contact 210n2. The upper diffusion layer 207n3, which is a source of the NMOS transistor Qn3, is connected to the first metal line 213b via the silicide layer 209n3 and the contact 210n3. The upper diffusion layer 207p1, which is a source of the PMOS transistor Qp1, is connected to the first metal line 213d via the silicide layer 209p1 and the contact 210p1. The upper diffusion layer 207p2, which is a drain of the PMOS transistor Qp2, is connected to the first metal line 213d via the silicide layer 209p2 and the contact 210p2. The source of the PMOS transistor Qp1 and the drain of the PMOS transistor Qp2 are connected to each other via the first metal line 213d. The source of the PMOS transistor Qp2 is connected to the drain of the PMOS transistor Qp3 via the lower diffusion layer 202pb and the silicide layer 203. The source of the PMOS transistor Qp3 is connected to the first metal line 213f via the contact 210p3. The first metal line 213f is supplied with the supply voltage Vcc.

The input signal IN1 is supplied to the first metal line 213c, is connected to the gate line 206a via the contact 211a, and is supplied to the gate electrodes 206 of the NMOS transistor Qn1 and the PMOS transistor Qp1.

The input signal IN2 is supplied to the first metal line 213e, is connected to the gate line 206c via the contact 211b, and is connected to the gate electrode 206 of the PMOS transistor Qp2. The input signal IN2 is also connected to the gate electrode 206 of the NMOS transistor Qn2 via the gate line 206b.

The input signal IN3 is supplied to the first metal line 213g, is connected to the gate line 206e via the contact 211d, and is connected to the gate electrode 206 of the PMOS transistor Qp3. The first metal line 213g is also connected to the second metal line 215 via the contact 214b and is connected to the gate line 206d via the contact 214a, the first metal line 213a, and the contact 211c. Thus, the input signal IN3 is connected to the gate electrode 206 of the NMOS transistor Qn3.

According to the sixth embodiment, six SGTs constituting a 3-input NOR circuit can be arranged in a line without providing any extra lines or contact regions. Thus, a semiconductor device with a reduced area can be provided.

Seventh Embodiment

Figure 9A:
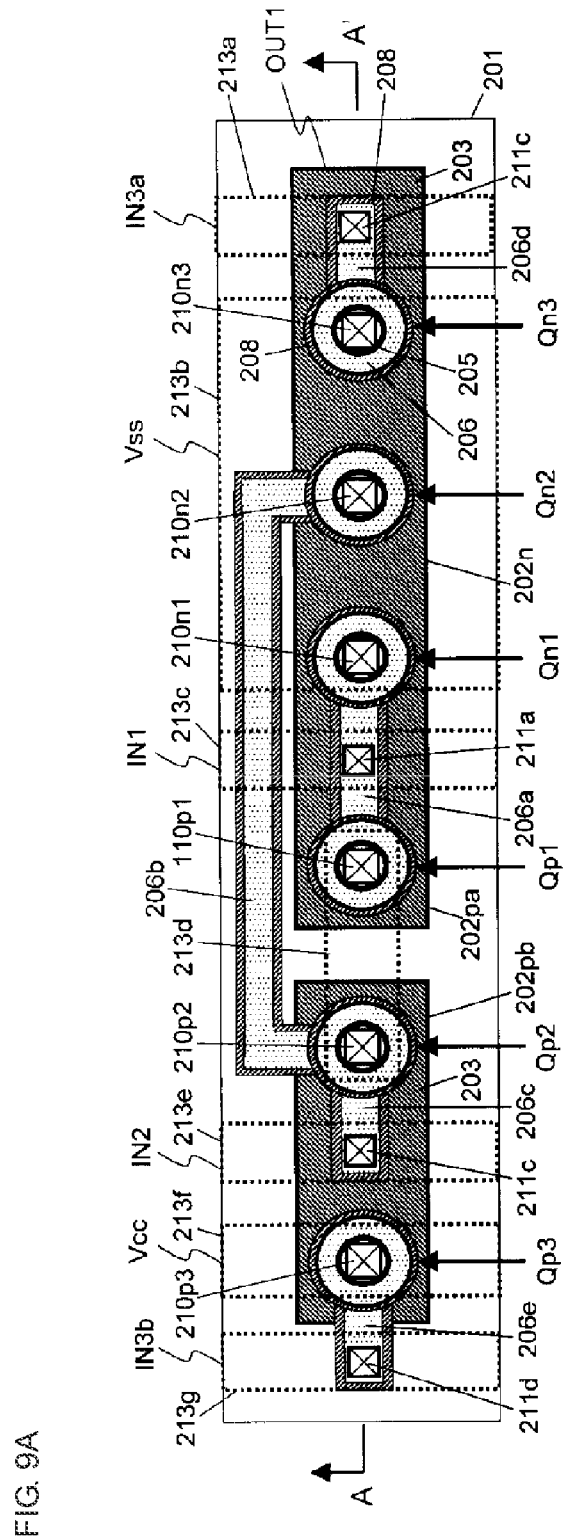
FIG. 9A is a plan view of a NOR circuit according to a seventh embodiment of the present invention.
Figure 9B:
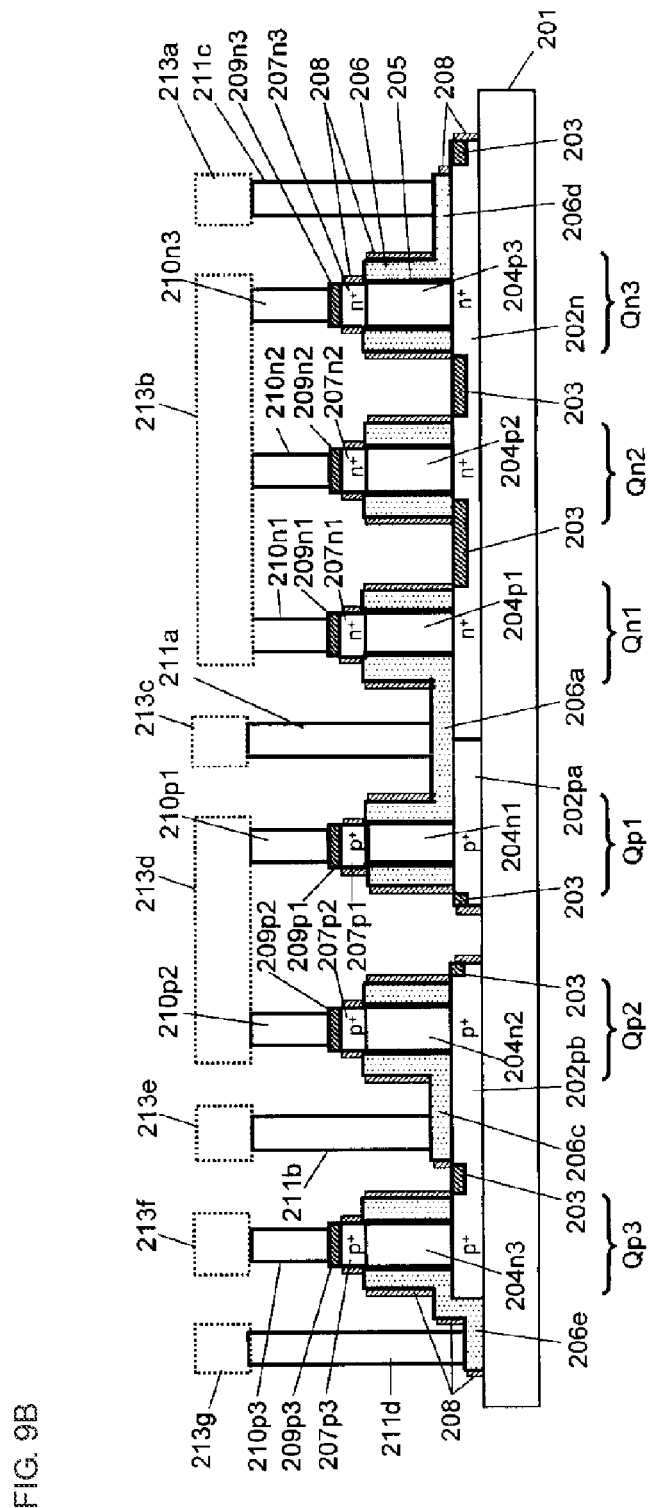
FIG. 9B is a cross-sectional view of the NOR circuit according to the seventh embodiment of the present invention.

FIGS. 9A and 9B illustrate a seventh embodiment. FIG. 9A is a plan view of the layout (arrangement) in the 3-input NOR circuit (hereinafter, simply referred to as a NOR circuit) of the present invention. FIG. 9B is a cross-sectional view taken along a cut line A-A' illustrated in FIG. 9A.

The seventh embodiment is based on the equivalent circuit illustrated in FIG. 6 because the input signal is connected by using different lines IN3a and IN3b. Referring to FIG. 9A, the NMOS transistor Qn3, the NMOS transistor Qn2, the NMOS transistor Qn1, the PMOS transistor Qp1, the PMOS transistor Qp2, and the PMOS transistor Qp3 of the NOR circuit illustrated in FIG. 6 are arranged in a line from the right.

A difference from the configuration illustrated in FIGS. 8A and 8B is that first metal lines alone are used for connections.

In FIGS. 9A and 9B, the same or substantially the same structures as those illustrated in FIGS. 8A and 8B are denoted by the same reference numerals in the 200s.

Planar silicon layers 202n, 202pa, and 202pb are disposed on an insulating film, such as a buried oxide (BOX) film layer 201 disposed on a substrate. The planar silicon layers (hereinafter, also referred to as lower diffusion layers) 202n, 202pa, and 202pb are respectively formed as an n+ diffusion layer, a p+ diffusion layer, and a p+ diffusion layer through impurity implantation or the like. A silicide layer 203 disposed on the surfaces of the planar silicon layers (202n, 202pa, and 202pb) connects the planar silicon layers 202pa and 202n to each other. 204p1, 204p2, and 204p3 denote silicon pillars of p type, and 204n1, 204n2, and 204n3 denote silicon pillars of n type. 205 denotes a gate insulating film surrounding the silicon pillars 204p1, 204p2, 204p3, 204n1, 204n2, and 204n3. 206 denotes a gate electrode. 206a, 206b, 206c, 206d, and 206e each denote a gate line. At top portions of the silicon pillars 204p1, 204p2, and 204p3, n+diffusion layers (hereinafter, also referred to as upper diffusion layers) 207n1, 207n2, and 207n3 are respectively formed through impurity implantation or the like. At top portions of the silicon pillars 204n1, 204n2, and 204n3, p+ diffusion layers (hereinafter, also referred to as upper diffusion layers) 207p1, 207p2, and 207p3 are formed through impurity implantation or the like. 208 denotes a silicon nitride film that protects the gate insulating film 205. 209n1, 209n2, 209n3, 209p1, 209p2, and 209p3 denote silicide layers respectively connected to the n+ diffusion layers 207n1, 207n2, and 207n3 and the p+ diffusion layers 207p1, 207p2, and 207p3. 210n1, 210n2, 210n3, 210p1, 210p2, and 210p3 denote contacts that respectively connect the silicide layers 209n1, 209n2, 209n3, 209p1, 209p2, and 209p3 to first metal lines 213b, 213b, 213b, 213d, 213d, and 213f. 211a denotes a contact that connects the gate line 206a to a first metal line 213c. 211b denotes a contact that connects the gate line 206c to a first metal line 213e. 211c denotes a contact that connects the gate line 206d to a first metal line 213a. 211d denotes a contact that connects the gate line 206e to a first metal line 213g.

The silicon pillar 204p1, the lower diffusion layer 202n, the upper diffusion layer 207n1, the gate insulating film 205, and the gate electrode 206 constitute the NMOS transistor Qn1. The silicon pillar 204p2, the lower diffusion layer 202n, the upper diffusion layer 207n2, the gate insulating film 205, and the gate electrode 206 constitute the NMOS transistor Qn2. The silicon pillar 204p3, the lower diffusion layer 202n, the upper diffusion layer 207n3, the gate insulating film 205, and the gate electrode 206 constitute the NMOS transistor Qn3. The silicon pillar 204n1, the lower diffusion layer 202pa, the upper diffusion layer 207p1, the gate insulating film 205, and the gate electrode 206 constitute the PMOS transistor Qp1. The silicon pillar 204n2, the lower diffusion layer 202pb, the upper diffusion layer 207p2, the gate insulating film 205, and the gate electrode 206 constitute the PMOS transistor Qp2. The silicon pillar 204n3, the lower diffusion layer 202pb, the upper diffusion layer 207p3, the gate insulating film 205, and the gate electrode 206 constitute the PMOS transistor Qp3.

In addition, the gate line 206a is connected to the gate electrode 206 of the NMOS transistor Qn1. The gate line 206b is connected to the gate electrode 206 of the NMOS transistor Qn2. The gate line 206d is connected to the gate electrode 206 of the NMOS transistor Qn3. The gate line 206a is connected to the gate electrode 206 of the PMOS transistor Qp1. The gate lines 206b and 206c are connected to the gate electrode 206 of the PMOS transistor Qp2. The gate line 206e is connected to the gate electrode 206 of the PMOS transistor Qp3.

The lower diffusion layers 202pa and 202n serve as a common drain of the PMOS transistor Qp1 and the NMOS transistors Qn1, Qn2, and Qn3 and is connected to an output OUT1. The upper diffusion layer 207n1, which is a source of the NMOS transistor Qn1, is connected to the first metal line 213b via the silicide layer 209n1 and the contact 210n1. The first metal line 213b is supplied with the reference voltage Vss. The upper diffusion layer 207n2, which is a source of the NMOS transistor Qn2, is connected to the first metal line 213b via the silicide layer 209n2 and the contact 210n2. The upper diffusion layer 207n3, which is a source of the NMOS transistor Qn3, is connected to the first metal line 213b via the silicide layer 209n3 and the contact 210n3. The upper diffusion layer 207p1, which is a source of the PMOS transistor Qp1, is connected to the first metal line 213d via the silicide layer 209p1 and the contact 210p1. The upper diffusion layer 207p2, which is a drain of the PMOS transistor Qp2, is connected to the first metal line 213d via the silicide layer 209p2 and the contact 210p2. The source of the PMOS transistor Qp1 and the drain of the PMOS transistor Qp2 are connected to each other via the first metal line 213d. The source of the PMOS transistor Qp2 is connected to the drain of the PMOS transistor Qp3 via the lower diffusion layer 202pb and the silicide layer 203. The source of the PMOS transistor Qp3 is connected to the first metal line 213f via the contact 210p3. The first metal line 213f is supplied with the supply voltage Vcc.

The input signal IN1 is supplied to the first metal line 213c, is connected to the gate line 206a via the contact 211a, and is supplied to the gate electrodes 206 of the NMOS transistor Qn1 and the PMOS transistor Qp1.

The input signal IN2 is supplied to the first metal line 213e, is connected to the gate line 206c via the contact 211b, and is connected to the gate electrode 206 of the PMOS transistor Qp2. The input signal IN2 is also connected to the gate electrode 206 of the NMOS transistor Qn2 via the gate line 206b.

The input signal IN3a is supplied to the first metal line 213a, is connected to the gate line 206d via the contact 211c, and is connected to the gate electrode 206 of the NMOS transistor Qn3.

The input signal IN3b is supplied to the first metal line 213g, is connected to the gate line 206e via the contact 211d, and is connected to the gate electrode 206 of the PMOS transistor Qp3.

The input signals IN3a and IN3b are connected to the input signal IN3 at a node (not illustrated).

According to the seventh embodiment, although the number of input signal lines increases by one, connections can be made without using second metal lines. In addition, six SGTs constituting a 3-input NOR circuit can be arranged in a line without providing any extra lines or contact regions. Thus, a semiconductor device with a reduced area can be provided.

Eighth Embodiment

Figure 10A:
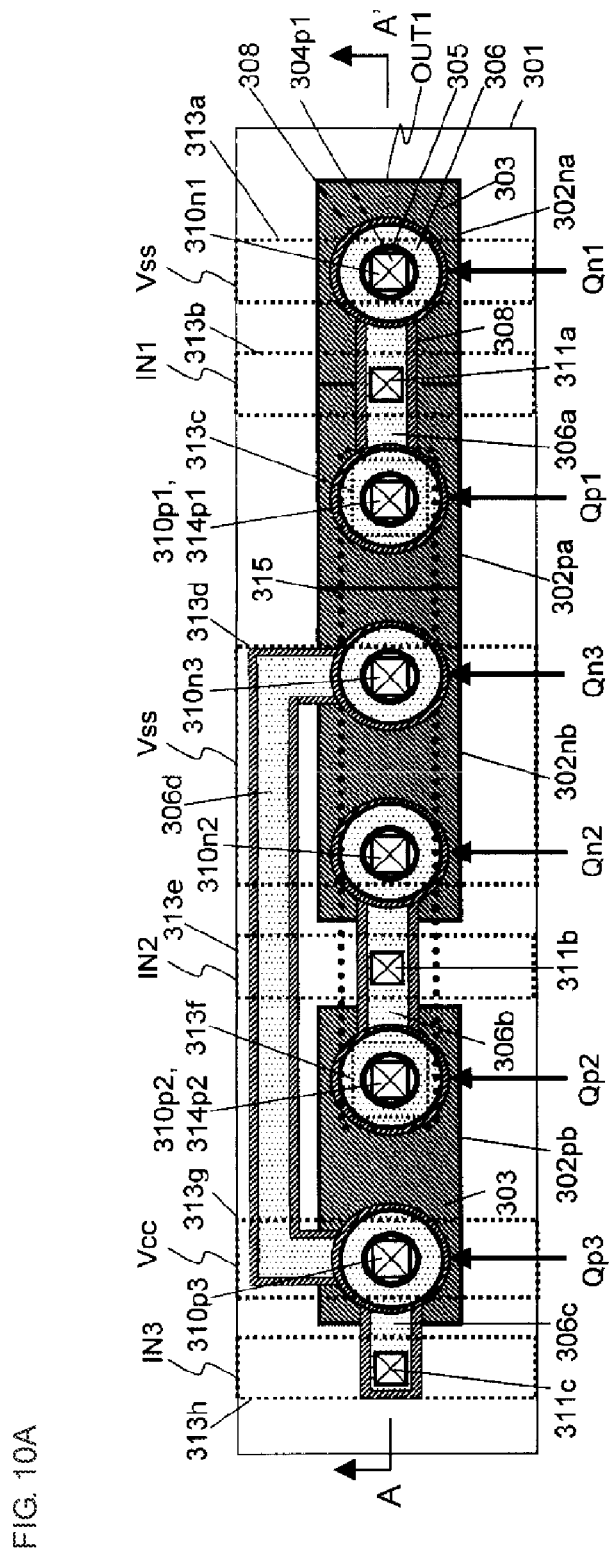
FIG. 10A is a plan view of a NOR circuit according to an eighth embodiment of the present invention.
Figure 10B:
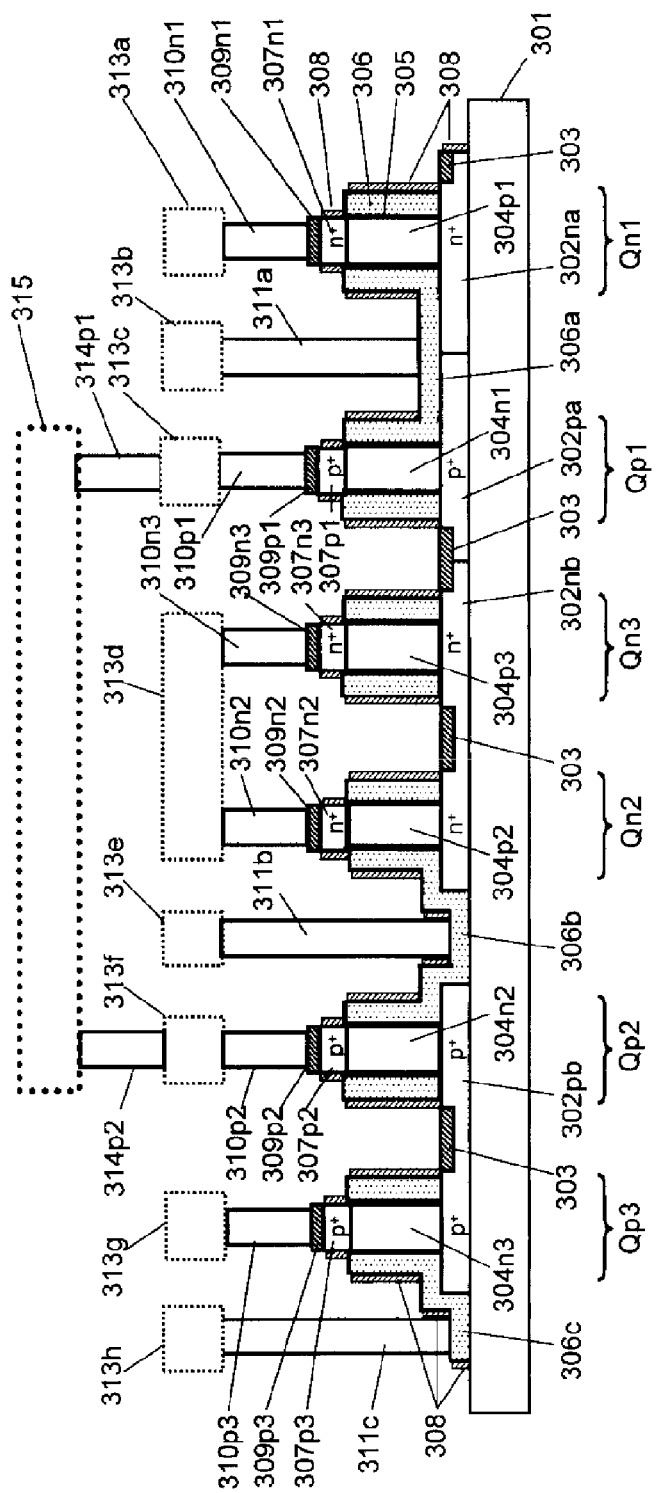
FIG. 10B is a cross-sectional view of the NOR circuit according to the eighth embodiment of the present invention.

FIGS. 10A and 10B illustrate an eighth embodiment. FIG. 10A is a plan view of the layout (arrangement) in the 3-input NOR circuit (hereinafter, simply referred to as a NOR circuit) of the present invention. FIG. 10B is a cross-sectional view taken along a cut line A-A' illustrated in FIG. 10A. The eighth embodiment is based on the equivalent circuit illustrated in FIG. 1.

Referring to FIG. 10A, the NMOS transistor Qn1, the PMOS transistor Qp1, the NMOS transistor Qn3, the NMOS transistor Qn2, the PMOS transistor Qp2, and the PMOS transistor Qp3 of the NOR circuit illustrated in FIG. 1 are arranged in a line from the right.

A difference from the configuration illustrated in FIGS. 2A and 2B is that positions of the NMOS transistor Qn1 and the PMOS transistor Qp1 are switched.

In FIGS. 10A and 10B, the same or substantially the same structures as those illustrated in FIGS. 2A and 2B are denoted by reference numerals in the 300s having the same last one or two digits as the reference numerals used in FIGS. 2A and 2B.

Planar silicon layers 302na, 302pa, 302nb, and 302pb are disposed on an insulating film, such as a buried oxide (BOX) film layer 301 disposed on a substrate. The planar silicon layers (hereinafter, also referred to as lower diffusion layers) 302na, 302pa, 302nb, and 302pb are respectively formed as an n+ diffusion layer, a p+ diffusion layer, an n+ diffusion layer, and a p+ diffusion layer through impurity implantation or the like. A silicide layer 303 disposed on the surfaces of the planar silicon layers (302na, 302pa, 302nb, and 302pb) connects the planar silicon layers 302na, 302pa, and 302nb to one another. 304p1, 304p2, 304p3 are silicon pillars of p type, and 304n1, 304n2, and 304n3 are silicon pillars of n type. 305 denotes a gate insulating film surrounding the silicon pillars 304p1, 304p2, 304p3, 304n1, 304n2, and 304n3. 306 denotes a gate electrode. 306a, 306b, 306c, and 306d each denote a gate line. At top portions of the silicon pillars 304p1, 304p2, and 304p3, n+ diffusion layers (hereinafter, also referred to as upper diffusion layers) 307n1, 307n2, and 307n3 are respectively formed through impurity implantation or the like. At top portions of the silicon pillars 304n1, 304n2, and 304n3, p+ diffusion layers (hereinafter, also referred to as upper diffusion layers) 307p1, 307p2, and 307p3 are formed through impurity implantation or the like. 308 denotes a silicon nitride film that protects the gate insulating film 305. 309n1, 309n2, 309n3, 309p1, 309p2, and 309p3 denote silicide layers respectively connected to the n+ diffusion layers 307n1, 307n2, and 307n3 and the p+ diffusion layers 307p1, 307p2, and 307p3. 310n1, 310n2, 310n3, 310p1, 310p2, and 310p3 denote contacts that respectively connect the silicide layers 309n1, 309n2, 309n3, 309p1, 309p2, and 309p3 to first metal lines 313a, 313d, 313d, 313c, 313f, and 313g. 311a denotes a contact that connects the gate line 306a to a first metal line 313b. 311b denotes a contact that connects the gate line 306b to a first metal line 313e. 311c denotes a contact that connects the gate line 306c to a first metal line 313h.

314p1 denotes a contact that connects the first metal line 313c to a second metal line 315. 314p2 denotes a contact that connects the first metal line 313f to the second metal line 315.

The silicon pillar 304p1, the lower diffusion layer 302na, the upper diffusion layer 307n1, the gate insulating film 305, and the gate electrode 306 constitute the NMOS transistor Qn1. The silicon pillar 304p2, the lower diffusion layer 302nb, the upper diffusion layer 307n2, the gate insulating film 305, and the gate electrode 306 constitute the NMOS transistor Qn2. The silicon pillar 304p3, the lower diffusion layer 302nb, the upper diffusion layer 307n3, the gate insulating film 305, and the gate electrode 306 constitute the NMOS transistor Qn3. The silicon pillar 304n1, the lower diffusion layer 302pa, the upper diffusion layer 307p1, the gate insulating film 305, and the gate electrode 306 constitute the PMOS transistor Qp1. The silicon pillar 304n2, the lower diffusion layer 302pb, the upper diffusion layer 307p2, the gate insulating film 305, and the gate electrode 306 constitute the PMOS transistor Qp2. The silicon pillar 304n3, the lower diffusion layer 302pb, the upper diffusion layer 307p3, the gate insulating film 305, and the gate electrode 306 constitute the PMOS transistor Qp3.

In addition, the gate line 306a is connected to the gate electrode 306 of the NMOS transistor Qn1. The gate line 306b is connected to the gate electrode 306 of the NMOS transistor Qn2. The gate line 306d is connected to the gate electrode 306 of the NMOS transistor Qn3. The gate line 306a is connected to the gate electrode 306 of the PMOS transistor Qp1. The gate line 306b is connected to the gate electrode 306 of the PMOS transistor Qp2. The gate lines 306c and 306d are connected to the gate electrode 306 of the PMOS transistor Qp3.

The lower diffusion layers 302na, 302pa, and 302nb serve as a common drain of the PMOS transistor Qp1 and the NMOS transistors Qn1, Qn2, and Qn3 and is connected to an output OUT1. The upper diffusion layer 307n1, which is a source of the NMOS transistor Qn1, is connected to the first metal line 313a via the silicide layer 309n1 and the contact 310n1. The first metal line 313a is supplied with the reference voltage Vss. The upper diffusion layer 307n2, which is a source of the NMOS transistor Qn2, is connected to the first metal line 313d via the silicide layer 309n2 and the contact 310n2. The first metal line 313d is supplied with the reference voltage Vss. The upper diffusion layer 307n3, which is a source of the NMOS transistor Qn3, is connected to the first metal line 313d via the silicide layer 309n3 and the contact 310n3. The upper diffusion layer 307p1, which is a source of the PMOS transistor Qp1, is connected to the first metal line 313c via the silicide layer 309p1 and the contact 310p1. The first metal line 313c is further connected to the second metal line 315 via the contact 314p1. The upper diffusion layer 307p2, which is a drain of the PMOS transistor Qp2, is connected to the first metal line 313f via the silicide layer 309p2 and the contact 310p2. The first metal line 313f is further connected to the second metal line 315 via the contact 314p2. The source of the PMOS transistor Qp1 and the drain of the PMOS transistor Qp2 are connected to each other via the second metal line 315. The source of the PMOS transistor Qp2 is connected to the drain of the PMOS transistor Qp3 via the lower diffusion layer 302pb and the silicide layer 303. The source of the PMOS transistor Qp3 is connected to the first metal line 313g via the contact 310p3. The first metal line 313g is supplied with the supply voltage Vcc.

The input signal IN1 is supplied to the first metal line 313b, is connected to the gate line 306a via the contact 311a, and is supplied to the gate electrodes 306 of the NMOS transistor Qn1 and the PMOS transistor Qp1.

The input signal IN2 is supplied to the first metal line 313e, is connected to the gate line 306b via the contact 311b, and is connected to the gate electrodes 306 of the NMOS transistor Qn2 and the PMOS transistor Qp2.

The input signal IN3 is supplied to the first metal line 313h, is connected to the gate line 306c via the contact 311c, and is connected to the gate electrode 306 of the PMOS transistor Qp3. The input signal IN3 is also connected to the gate electrode 306 of the NMOS transistor Qn3 via the gate line 306d.

According to the eighth embodiment, six SGTs constituting a 3-input NOR circuit can be arranged in a line without providing any extra lines or contact regions. Thus, a semiconductor device with a reduced area can be provided.

Ninth Embodiment

Figure 11A:
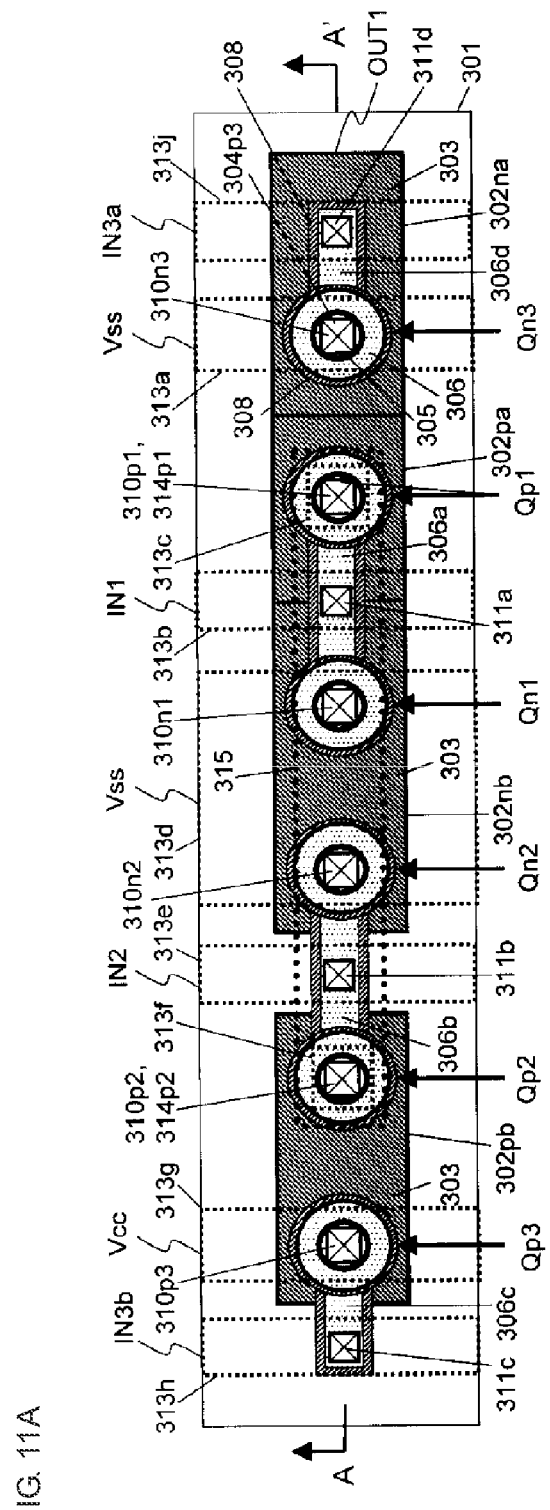
FIG. 11A is a plan view of a NOR circuit according to a ninth embodiment of the present invention.
Figure 11B:
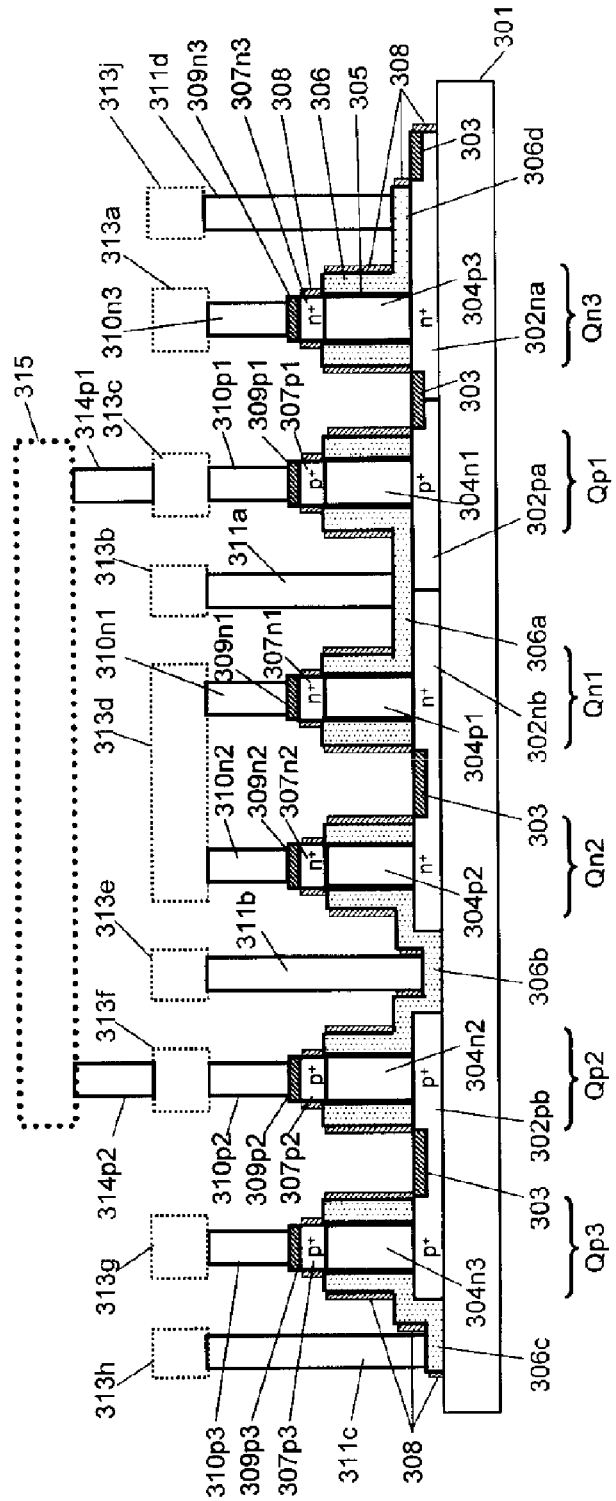
FIG. 11B is a cross-sectional view of the NOR circuit according to the ninth embodiment of the present invention.

FIGS. 11A and 11B illustrate a ninth embodiment. FIG. 11A is a plan view of the layout (arrangement) in the 3-input NOR circuit (hereinafter, simply referred to as a NOR circuit) of the present invention. FIG. 11B is a cross-sectional view taken along a cut line A-A' illustrated in FIG. 11A. The ninth embodiment is based on the equivalent circuit illustrated in FIG. 6.

Referring to FIG. 11A, the NMOS transistor Qn3, the PMOS transistor Qp1, the NMOS transistor Qn1, the NMOS transistor Qn2, the PMOS transistor Qp2, and the PMOS transistor Qp3 of the NOR circuit illustrated in FIG. 6 are arranged in a line from the right.

A difference from the configuration illustrated in FIGS. 10A and 10B is that positions of the NMOS transistors Qn1 and Qn3 are switched.

In FIGS. 11A and 11B, the same or substantially the same structures as those illustrated in FIGS. 10A and 10B are denoted by the same reference numerals in the 300s.

Planar silicon layers 302na, 302pa, 302nb, and 302pb are disposed on an insulating film, such as a buried oxide (BOX) film layer 301 disposed on a substrate. The planar silicon layers (hereinafter, also referred to as lower diffusion layers) 302na, 302pa, 302nb, and 302pb are respectively formed as an n+ diffusion layer, a p+ diffusion layer, an n+ diffusion layer, and a p+ diffusion layer through impurity implantation or the like. A silicide layer 303 disposed on the surfaces of the planar silicon layers (302na, 302pa, 302nb, and 302pb) connects the planar silicon layers 302na, 302pa, and 302nb to one another. 304p1, 304p2, 304p3 denote silicon pillars of p type, 304n1, 304n2, and 304n3 denote silicon pillars of n type. 305 denotes a gate insulating film surrounding the silicon pillars 304p1, 304p2, 304p3, 304n1, 304n2, and 304n3. 306 denotes a gate electrode. 306a, 306b, 306c, and 306d each denote a gate line. At top portions of the silicon pillars 304p1, 304p2, and 304p3, n+ diffusion layers (hereinafter, also referred to as upper diffusion layers) 307n1, 307n2, and 307n3 are respectively formed through impurity implantation or the like. At top portions of the silicon pillars 304n1, 304n2, and 304n3, p+ diffusion layers (hereinafter, also referred to as upper diffusion layers) 307p1, 307p2, and 307p3 are formed through impurity implantation or the like. 308 denotes a silicon nitride film that protects the gate insulating film 305. 309n1, 309n2, 309n3, 309p1, 309p2, and 309p3 denote silicide layers respectively connected to the n+ diffusion layers 307n1, 307n2, and 307n3 and the p+ diffusion layers 307p1, 307p2, and 307p3. 310n1, 310n2, 310n3, 310p1, 310p2, and 310p3 are contacts that respectively connect the silicide layers 309n1, 309n2, 309n3, 309p1, 309p2, and 309p3 to first metal lines 313d, 313d, 313a, 313c, 313f, and 313g. 311a denotes a contact that connects the gate line 306a to a first metal line 313b. 311b denotes a contact that connects the gate line 306b to a first metal line 313e. 311c denotes a contact that connects the gate line 306c to a first metal line 313h. 311d denotes a contact that connects the gate line 306d to a first metal line 313j.

314p1 denotes a contact that connects the first metal line 313c to a second metal line 315. 314p2 denotes a contact that connects the first metal line 313f to the second metal line 315.

The silicon pillar 304p1, the lower diffusion layer 302nb, the upper diffusion layer 307n1, the gate insulating film 305, and the gate electrode 306 constitute the NMOS transistor Qn1. The silicon pillar 304p2, the lower diffusion layer 302nb, the upper diffusion layer 307n2, the gate insulating film 305, and the gate electrode 306 constitute the NMOS transistor Qn2. The silicon pillar 304p3, the lower diffusion layer 302na, the upper diffusion layer 307n3, the gate insulating film 305, and the gate electrode 306 constitute the NMOS transistor Qn3. The silicon pillar 304n1, the lower diffusion layer 302pa, the upper diffusion layer 307p1, the gate insulating film 305, and the gate electrode 306 constitute the PMOS transistor Qp1. The silicon pillar 304n2, the lower diffusion layer 302pb, the upper diffusion layer 307p2, the gate insulating film 305, and the gate electrode 306 constitute the PMOS transistor Qp2. The silicon pillar 304n3, the lower diffusion layer 302pb, the upper diffusion layer 307p3, the gate insulating film 305, and the gate electrode 306 constitute the PMOS transistor Qp3.

In addition, the gate line 306a is connected to the gate electrode 306 of the NMOS transistor Qn1. The gate line 306b is connected to the gate electrode 306 of the NMOS transistor Qn2. The gate line 306d is connected to the gate electrode 306 of the NMOS transistor Qn3. The gate line 306a is connected to the gate electrode 306 of the PMOS transistor Qp1. The gate line 306b is connected to the gate electrode 306 of the PMOS transistor Qp2. The gate line 306c is connected to the gate electrode 306 of the PMOS transistor Qp3.

The lower diffusion layers 302na, 302pa, and 302nb serve as a common drain of the PMOS transistor Qp1 and the NMOS transistors Qn1, Qn2, and Qn3 and is connected to an output OUT1. The upper diffusion layer 307n1, which is a source of the NMOS transistor Qn1, is connected to the first metal line 313d via the silicide layer 309n1 and the contact 310n1. The first metal line 313d is supplied with the reference voltage Vss. The upper diffusion layer 307n2, which is a source of the NMOS transistor Qn2, is connected to the first metal line 313d via the silicide layer 309n2 and the contact 310n2. The upper diffusion layer 307n3, which is a source of the NMOS transistor Qn3, is connected to the first metal line 313a via the silicide layer 309n3 and the contact 310n3. The first metal line 313a is supplied with the reference voltage Vss. The upper diffusion layer 307p1, which is a source of the PMOS transistor Qp1, is connected to the first metal line 313c via the silicide layer 309p1 and the contact 310p1. The first metal line 313c is further connected to the second metal line 315 via the contact 314p1. The upper diffusion layer 307p2, which is a drain of the PMOS transistor Qp2, is connected to the first metal line 313f via the silicide layer 309p2 and the contact 310p2. The first metal line 313f is further connected to the second metal line 315 via the contact 314p2. The source of the PMOS transistor Qp1 and the drain of the PMOS transistor Qp2 are connected to each other via the second metal line 315. The source of the PMOS transistor Qp2 is connected to the drain of the PMOS transistor Qp3 via the lower diffusion layer 302pb and the silicide layer 303. The source of the PMOS transistor Qp3 is connected to the first metal line 313g via the contact 310p3. The first metal line 313g is supplied with the supply voltage Vcc.

The input signal IN1 is supplied to the first metal line 313b, is connected to the gate line 306a via the contact 311a, and is supplied to the gate electrodes 306 of the NMOS transistor Qn1 and the PMOS transistor Qp1.

The input signal IN2 is supplied to the first metal line 313e, is connected to the gate line 306b via the contact 311b, and is connected to the gate electrodes 306 of the NMOS transistor Qn2 and the PMOS transistor Qp2.

The input signal IN3a is supplied to the first metal line 313j, is connected to the gate line 306d via the contact 311d, and is connected to the gate electrode 306 of the NMOS transistor Qn3.

The input signal IN3b is supplied to the first metal line 313h, is connected to the gate line 306c via the contact 311c, and is connected to the gate electrode 306 of the PMOS transistor Qp3. According to the ninth embodiment, six SGTs constituting a 3-input NOR circuit can be arranged in a line without providing any extra lines or contact regions. Thus, a semiconductor device with a reduced area can be provided.

Tenth Embodiment

Figure 12A:
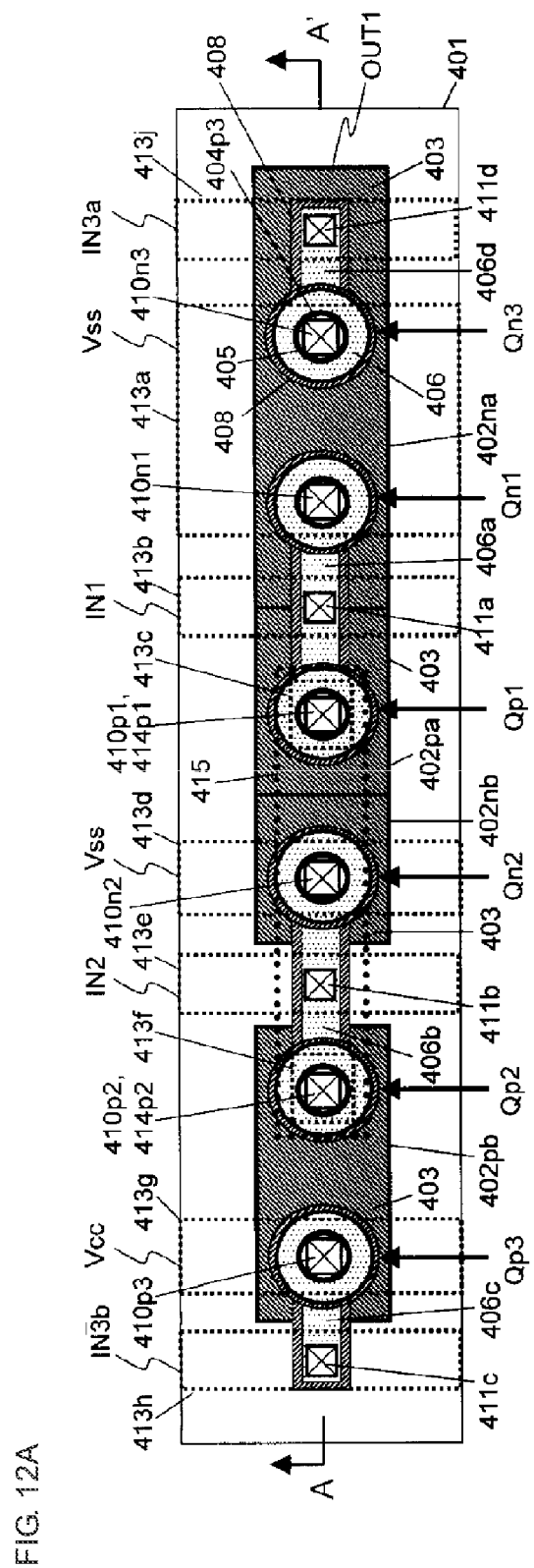
FIG. 12A is a plan view of a NOR circuit according to a tenth embodiment of the present invention.
Figure 12B:
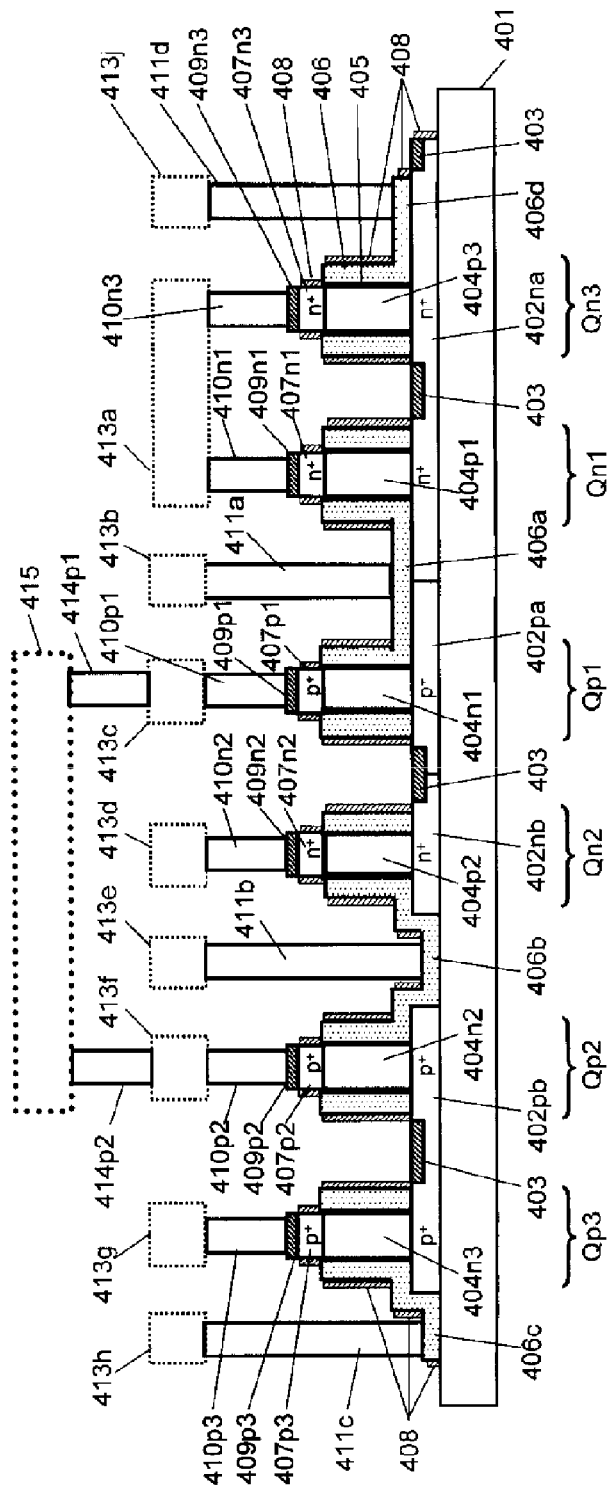
FIG. 12B is a cross-sectional view of the NOR circuit according to the tenth embodiment of the present invention.

FIGS. 12A and 12B illustrate a tenth embodiment. FIG. 12A is a plan view of the layout (arrangement) in the 3-input NOR circuit (hereinafter, simply referred to as a NOR circuit) of the present invention. FIG. 12B is a cross-sectional view taken along a cut line A-A' illustrated in FIG. 12A. The tenth embodiment is based on the equivalent circuit illustrated in FIG. 6.

Referring to FIG. 12A, the NMOS transistors Qn3, the NMOS transistor Qn1, the PMOS transistor Qp1, the NMOS transistor Qn2, the PMOS transistor Qp2, and the PMOS transistor Qp3 of the NOR circuit illustrated in FIG. 6 are arranged in a line from the right.

A difference from the configuration illustrated in FIGS. 11A and 11B is that positions of the NMOS transistor Qn1 and the PMOS transistor Qp1 are switched.

In FIGS. 12A and 12B, the same or substantially the same structures as those illustrated in FIGS. 11A and 11B are denoted by reference numerals in the 400s having the same last one or two digits as the reference numerals used in FIGS. 11A and 11B.

Planar silicon layers 402na, 402pa, 402nb, and 402pb are disposed on an insulating film, such as a buried oxide (BOX) film layer 401 disposed on a substrate. The planar silicon layers (hereinafter, also referred to as lower diffusion layers) 402na, 402pa, 402nb, and 402pb are respectively formed as an n+ diffusion layer, a p+ diffusion layer, an n+ diffusion layer, and a p+ diffusion layer through impurity implantation or the like. A silicide layer 403 disposed on the surfaces of the planar silicon layers (402na, 402pa, 402nb, and 402pb) connects the planar silicon layers 402na, 402pa, and 402nb to one another. 404p1, 404p2, and 404p3 denote silicon pillars of p type, and 404n1, 404n2, and 404n3 denote silicon pillars of n type. 405 denotes a gate insulating film surrounding the silicon pillars 404p1, 404p2, 404p3, 404n1, 404n2, and 404n3. 406 denotes a gate electrode. 406a, 406b, 406c, and 406d each denote a gate line. At top portions of the silicon pillars 404p1, 404p2, and 404p3, n+ diffusion layers (hereinafter, also referred to as upper diffusion layers) 407n1, 407n2, and 407n3 are respectively formed through impurity implantation or the like. At top portions of the silicon pillars 404n1, 404n2, and 404n3, p+ diffusion layers (hereinafter, also referred to as upper diffusion layers) 407p1, 407p2, and 407p3 are formed through impurity implantation or the like. 408 denotes a silicon nitride film that protects the gate insulating film 405. 409n1, 409n2, 409n3, 409p1, 409p2, and 409p3 denote silicide layers respectively connected to the n+ diffusion layers 407n1, 407n2, and 407n3 and the p+ diffusion layers 407p1, 407p2, and 407p3. 410n1, 410n2, 410n3, 410p1, 410p2, and 410p3 denote contacts that respectively connect the silicide layers 409n1, 409n2, 409n3, 409p1, 409p2, and 409p3 to first metal lines 413a, 413d, 413a, 413c, 413f, and 413g. 411a denotes a contact that connects the gate line 406a to a first metal line 413b. 411b denotes a contact that connects the gate line 406b to a first metal line 413e. 411c denotes a contact that connects the gate line 406c to a first metal line 413h. 411d denotes a contact that connects the gate line 406d to a first metal line 413j.

414p1 denotes a contact that connects the first metal line 413c to a second metal line 415. 414p2 denotes a contact that connects the first metal line 413f to the second metal line 415.

The silicon pillar 404p1, the lower diffusion layer 402na, the upper diffusion layer 407n1, the gate insulating film 405, and the gate electrode 406 constitute the NMOS transistor Qn1. The silicon pillar 404p2, the lower diffusion layer 402nb, the upper diffusion layer 407n2, the gate insulating film 405, and the gate electrode 406 constitute the NMOS transistor Qn2. The silicon pillar 404p3, the lower diffusion layer 402na, the upper diffusion layer 407n3, the gate insulating film 405, and the gate electrode 406 constitute the NMOS transistor Qn3. The silicon pillar 404n1, the lower diffusion layer 402pa, the upper diffusion layer 407p1, the gate insulating film 405, and the gate electrode 406 constitute the PMOS transistor Qp1. The silicon pillar 404n2, the lower diffusion layer 402pb, the upper diffusion layer 407p2, the gate insulating film 405, and the gate electrode 406 constitute the PMOS transistor Qp2. The silicon pillar 404n3, the lower diffusion layer 402pb, the upper diffusion layer 407p3, the gate insulating film 405, and the gate electrode 406 constitute the PMOS transistor Qp3.

In addition, the gate line 406a is connected to the gate electrode 406 of the NMOS transistor Qn1. The gate line 406b is connected to the gate electrode 406 of the NMOS transistor Qn2. The gate line 406d is connected to the gate electrode 406 of the NMOS transistor Qn3. The gate line 406a is connected to the gate electrode 406 of the PMOS transistor Qp1. The gate line 406b is connected to the gate electrode 406 of the PMOS transistor Qp2. The gate line 406c is connected to the gate electrode 406 of the PMOS transistor Qp3.

The lower diffusion layers 402na, 402pa, and 402nb serve as a common drain of the PMOS transistor Qp1 and the NMOS transistors Qn1, Qn2, and Qn3 and is connected to an output OUT1. The upper diffusion layer 407n1, which is a source of the NMOS transistor Qn1, is connected to the first metal line 413a via the silicide layer 409n1 and the contact 410n1. The first metal line 413a is supplied with the reference voltage Vss. The upper diffusion layer 407n2, which is a source of the NMOS transistor Qn2, is connected to the first metal line 413*d* via the silicide layer 409*n*2 and the contact 410*n*2. The first metal line 413*d* is supplied with the reference voltage Vss. The upper diffusion layer 407*n*3, which is a source of the NMOS transistor Qn3, is connected to the first metal line 413*a* via the silicide layer 409*n*3 and the contact 410*n*3. The upper diffusion layer 407*p*1, which is a source of the PMOS transistor Qp1, is connected to the first metal line 413*c* via the silicide layer 409*p*1 and the contact 410*p*1. The first metal line 413*c* is further connected to the second metal line 415 via the contact 414*p*1. The upper diffusion layer 407*p*2, which is a drain of the PMOS transistor Qp2, is connected to the first metal line 413*f* via the silicide layer 409*p*2 and the contact 410*p*2. The first metal line 413*f* is further connected to the second metal line 415 via the contact 414*p*2. The source of the PMOS transistor Qp1 and the drain of the PMOS transistor Qp2 are connected to each other via the second metal line 415. The source of the PMOS transistor Qp2 is connected to the drain of the PMOS transistor Qp3 via the lower diffusion layer 402*pb* and the silicide layer 403. The source of the PMOS transistor Qp3 is connected to the first metal line 413*g* via the contact 410*p*3. The first metal line 413*g* is supplied with the supply voltage Vcc.

The input signal IN1 is supplied to the first metal line 413*b*, is connected to the gate line 406*a* via the contact 411*a*, and is supplied to the gate electrodes 406 of the NMOS transistor Qn1 and the PMOS transistor Qp1.

The input signal IN2 is supplied to the first metal line 413*e*, is connected to the gate line 406*b* via the contact 411*b*, and is connected to the gate electrodes 406 of the NMOS transistor Qn2 and the PMOS transistor Qp2.

The input signal IN3*a* is supplied to the first metal line 413*j*, is connected to the gate line 406*d* via the contact 411*d*, and is connected to the gate electrode 406 of the NMOS transistor Qn3. The input signal IN3*b* is supplied to the first metal line 413*h*, is connected to the gate line 406*c* via the contact 411*c*, and is connected to the gate electrode 406 of the PMOS transistor Qp3.

According to the tenth embodiment, six SGTs constituting a 3-input NOR circuit can be arranged in a line without providing any extra lines or contact regions. Thus, a semiconductor device with a reduced area can be provided.

Eleventh Embodiment

Figure 13A:
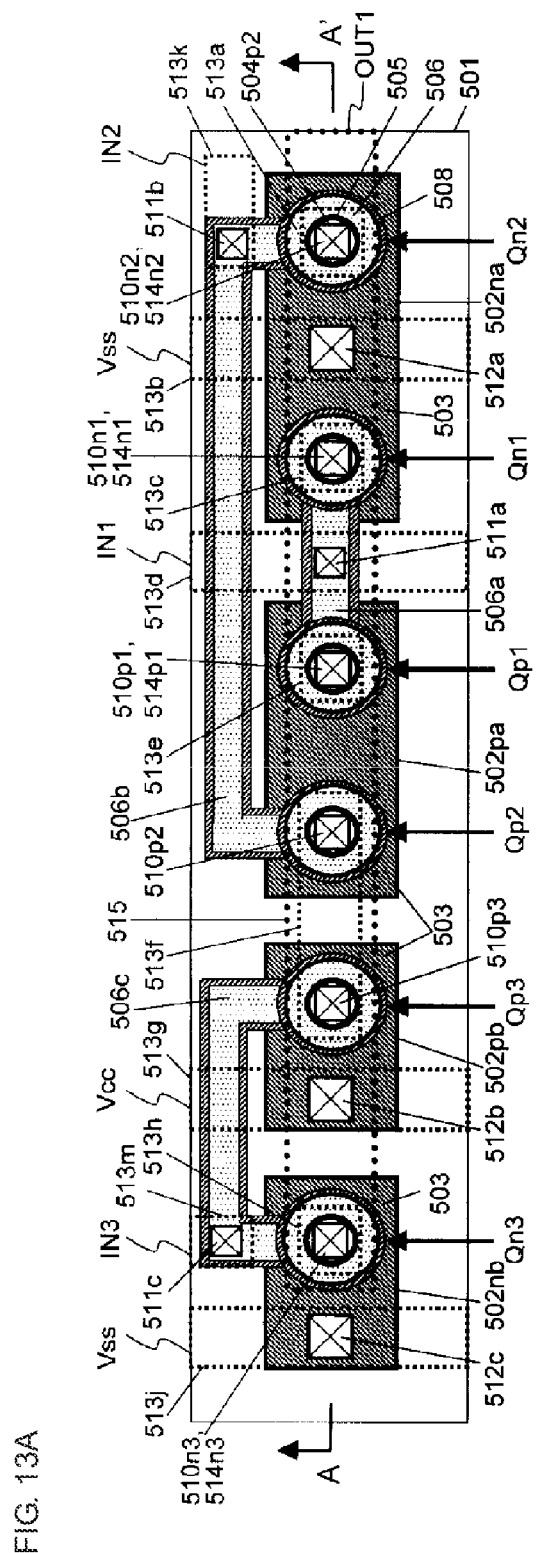
FIG. 13A is a plan view of a NOR circuit according to an eleventh embodiment of the present invention.
Figure 13B:
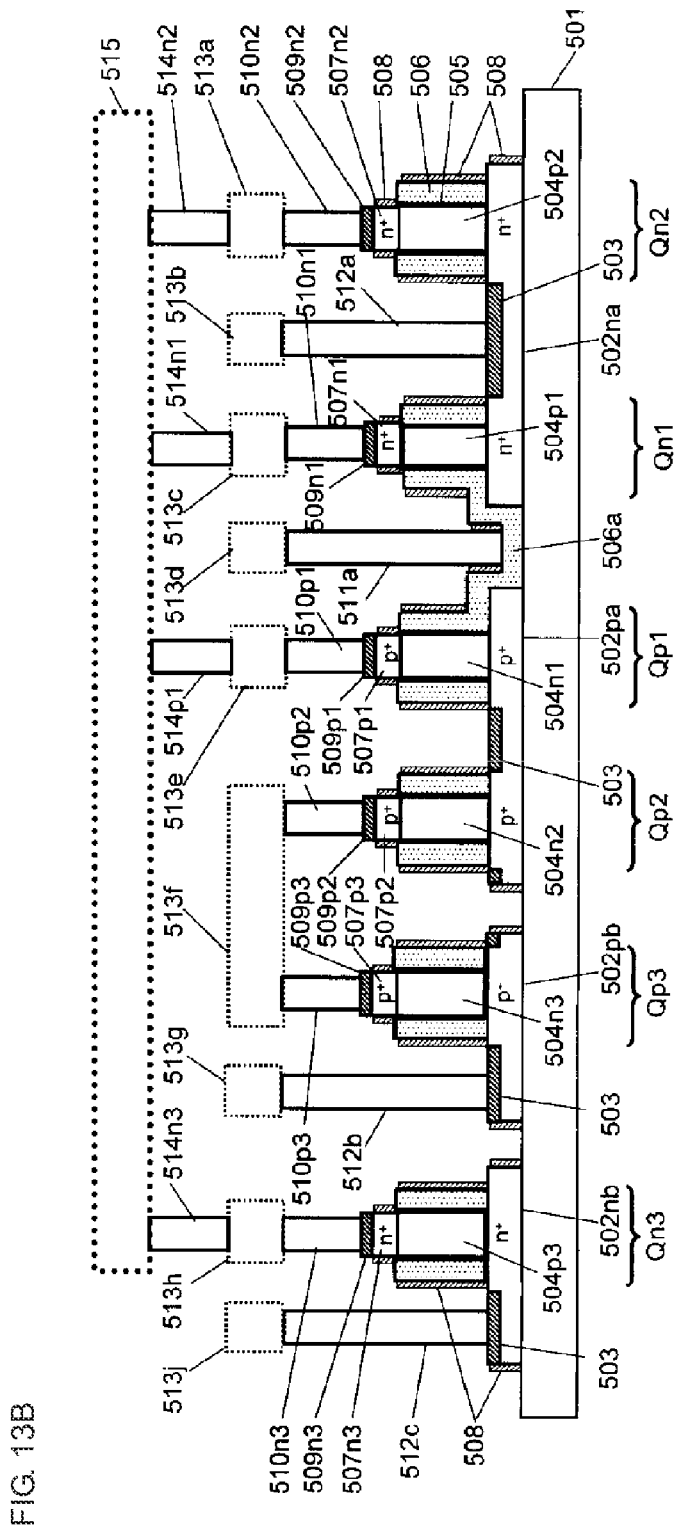
FIG. 13B is a cross-sectional view of the NOR circuit according to the eleventh embodiment of the present invention.

FIGS. 13A and 13B illustrate an eleventh embodiment. A big difference between the eleventh embodiment and the first to tenth embodiments described above is that sources and drains of the NMOS transistors Qn1, Qn2, and Qn3 and the PMOS transistors Qp1, Qp2, and Qp3 are disposed oppositely.

FIG. 13A is a plan view of the layout (arrangement) in the 3-input NOR circuit (hereinafter, simply referred to as a NOR circuit) of the present invention. FIG. 13B is a cross-sectional view taken along a cut line A-A' illustrated in FIG. 13A. The eleventh embodiment is based on the equivalent circuit illustrated in FIG. 1.

Referring to FIGS. 13A to 13B, the NMOS transistors Qn2, the NMOS transistor Qn1, the PMOS transistor Qp1, the PMOS transistor Qp2, the PMOS transistor Qp3, and the NMOS transistor Qn3 of the NOR circuit illustrated in FIG. 1 are arranged in a line from the right.

In FIGS. 13A and 13B, the same or substantially the same structures as those illustrated in FIGS. 2A and 2B are denoted by reference numerals in the 500s having the same last one or two digits as the reference numerals used in FIGS. 2A and 2B.

Planar silicon layers 502*na*, 502*pa*, 502*pb*, and 502*nb* are disposed on an insulating film, such as a buried oxide (BOX) film layer 501 disposed on a substrate. The planar silicon layers (hereinafter, also referred to as lower diffusion layers) 502*na*, 502*pa*, 502*pb*, and 502*nb* are respectively formed as an n+ diffusion layer, a p+ diffusion layer, a p+ diffusion layer, and an n+ diffusion layer through impurity implantation or the like. A silicide layer 503 is disposed on the surfaces of the planar silicon layers (502*na*, 502*pa*, 502*pb*, and 502*nb*). 504*p*1, 504*p*2, and 504*p*3 denote silicon pillars of p type, and 504*n*1, 504*n*2, and 504*n*3 denote silicon pillars of n type. 505 denotes a gate insulating film surrounding the silicon pillars 504*p*1, 504*p*2, 504*p*3, 504*n*1, 504*n*2, and 504*n*3. 506 denotes a gate electrode. 506*a*, 506*b*, and 506*c* each denote a gate line. At top portions of the silicon pillars 504*p*1, 504*p*2, and 504*p*3, n+ diffusion layers (hereinafter, also referred to as upper diffusion layers) 507*n*1, 507*n*2, and 507*n*3 are respectively formed through impurity implantation or the like. At top portions of the silicon pillars 504*n*1, 504*n*2, and 504*n*3, p+ diffusion layers (hereinafter, also referred to as upper diffusion layers) 507*p*1, 507*p*2, and 507*p*3 are formed through impurity implantation or the like. 508 denotes a silicon nitride film that protects the gate insulating film 505. 509*n*1, 509*n*2, 509*n*3, 509*p*1, 509*p*2, and 509*p*3 denote silicide layers respectively connected to the n+ diffusion layers 507*n*1, 507*n*2, and 507*n*3 and the p+ diffusion layers 507*p*1, 507*p*2, and 507*p*3. 510*n*1, 510*n*2, 510*n*3, 510*p*1, 510*p*2, and 510*p*3 denote contacts that respectively connect the silicide layers 509*n*1, 509*n*2, 509*n*3, 509*p*1, 509*p*2, and 509*p*3 to first metal lines 513*c*, 513*a*, 513*h*, 513*e*, 513*f*, and 513*f*. 511*a* denotes a contact that connects the gate line 506*a* to a first metal line 513*d*. 511*b* denotes a contact that connects the gate line 506*b* to a first metal line 513*k*. 511*c* denotes a contact that connects the gate line 506*c* to a first metal line 513*m*.

512*a* denotes a contact that connects the n+ diffusion layer 502*na* to a first metal line 513*b* via the silicide layer 503. 512*b* denotes a contact that connects the p+ diffusion layer 502*pb* to a first metal line 513*g* via the silicide layer 503. 512*c* denotes a contact that connects the n+ diffusion layer 502*nb* to a first metal line 513*j* via the silicide layer 503.

514*n*1 denotes a contact that connects the first metal line 513*c* to a second metal line 515. 514*n*2 denotes a contact that connects the first metal line 513*a* to the second metal line 515. 514*n*3 denotes a contact that connects the first metal line 513*h* to the second metal line 515. 514*p*1 denotes a contact that connects the first metal line 513*e* to the second metal line 515.

The silicon pillar 504*p*1, the lower diffusion layer 502*na*, the upper diffusion layer 507*n*1, the gate insulating film 505, and the gate electrode 506 constitute the NMOS transistor Qn1. The silicon pillar 504*p*2, the lower diffusion layer 502*na*, the upper diffusion layer 507*n*2, the gate insulating film 505, and the gate electrode 506 constitute the NMOS transistor Qn2. The silicon pillar 504*p*3, the lower diffusion layer 502*nb*, the upper diffusion layer 507*n*3, the gate insulating film 505, and the gate electrode 506 constitute the NMOS transistor Qn3. The silicon pillar 504*n*1, the lower diffusion layer 502*pa*, the upper diffusion layer 507*p*1, the gate insulating film 505, and the gate electrode 506 constitute the PMOS transistor Qp1. The silicon pillar 504*n*2, the lower diffusion layer 502*pa*, the upper diffusion layer 507*p*2, the gate insulating film 505, and the gate electrode 506 constitute the PMOS transistor Qp2. The silicon pillar 504*n*3, the lower diffusion layer 502*pb*, the upper diffusion layer 507p3, the gate insulating film 505, and the gate electrode 506 constitute the PMOS transistor Qp3.

In addition, the gate line 506a is connected to the gate electrode 506 of the NMOS transistor Qn1. The gate line 506b is connected to the gate electrode 506 of the NMOS transistor Qn2. The gate line 506c is connected to the gate electrode 506 of the NMOS transistor Qn3. The gate line 506a is connected to the gate electrode 506 of the PMOS transistor Qp1. The gate line 506b is connected to the gate electrode 506 of the PMOS transistor Qp2. The gate line 506c is connected to the gate electrode 506 of the PMOS transistor Qp3. The second metal line 515 serves as a common drain of the PMOS transistor Qp1 and the NMOS transistors Qn1, Qn2, and Qn3 and is connected to an output OUT1.

The lower diffusion layer 502na, which is sources of the NMOS transistors Qn1 and Qn2, is connected to the first metal line 513b via the silicide layer 503 and the contact 512a. The first metal line 513b is supplied with the reference voltage Vss. The lower diffusion layer 502nb, which is a source of the NMOS transistor Qn3, is connected to the first metal line 513j via the silicide layer 503 and the contact 512c. The first metal line 513j is supplied with the reference voltage Vss. The lower diffusion layer 502pa, which is a source of the PMOS transistor Qp1, is connected to a drain of the PMOS transistor Qp2 via the silicide layer 503. The upper diffusion layer 507p2, which is a source of the PMOS transistor Qp2, is connected to the first metal line 513f via the silicide layer 509p2 and the contact 510p2. The upper diffusion layer 507p3, which is a drain of the PMOS transistor Qp3, is connected to the first metal line 513f via the silicide layer 509p3 and the contact 510p3. The source of the PMOS transistor Qp2 and the drain of the PMOS transistor Qp3 are connected to each other via the first metal line 513f. The lower diffusion layer 502pb, which is a source of the PMOS transistor Qp3, is connected to the first metal line 513g via the silicide layer 503 and the contact 512b. The first metal line 513g is supplied with the supply voltage Vcc.

The input signal IN1 is supplied to the first metal line 513d, is connected to the gate line 506a via the contact 511a, and is supplied to the gate electrodes 506 of the NMOS transistor Qn1 and the PMOS transistor Qp1.

The input signal IN2 is supplied to the first metal line 513k, is connected to the gate line 506b via the contact 511b, and is connected to the gate electrodes 506 of the NMOS transistor Qn2 and the PMOS transistor Qp2.

The input signal IN3 is supplied to the first metal line 513m, is connected to the gate line 506c via the contact 511c, and is connected to the gate electrodes 506 of the NMOS transistor Qn3 and the PMOS transistor Qp3.

Although not illustrated, the first metal line 513m supplied with the input signal IN3 may be supplied with the input signal IN3 from the left side or the right side, for example, by connecting the first metal line 513m to a second metal line that extends to the left and right. Such a configuration increases the degree of freedom in wiring of the input signal lines.

According to the eleventh embodiment, six SGTs constituting a 3-input NOR circuit can be arranged in a line without providing any extra lines or contact regions. Thus, a semiconductor device with a reduced area can be provided.

In addition, the output OUT1 can be disposed by using the second metal line 515. Thus, the degree of freedom in wiring improves.

Twelfth Embodiment

FIGS. 14A to 14E illustrate a twelfth embodiment.

Figure 14A:
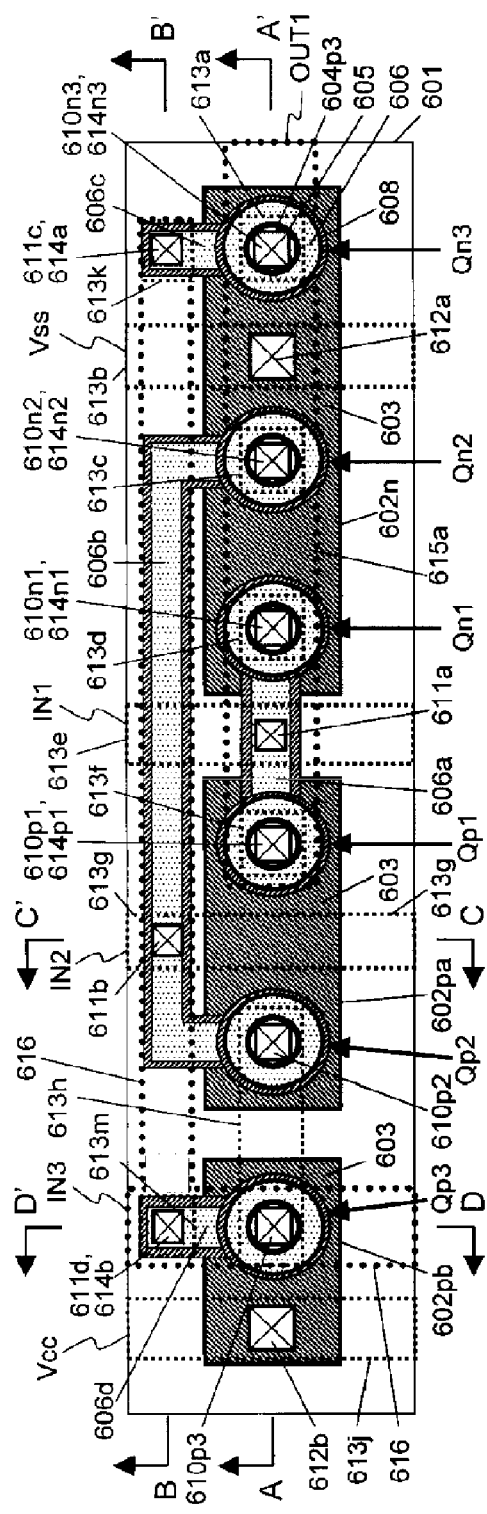
FIG. 14A is a plan view of a NOR circuit according to a twelfth embodiment of the present invention.
Figure 14B:
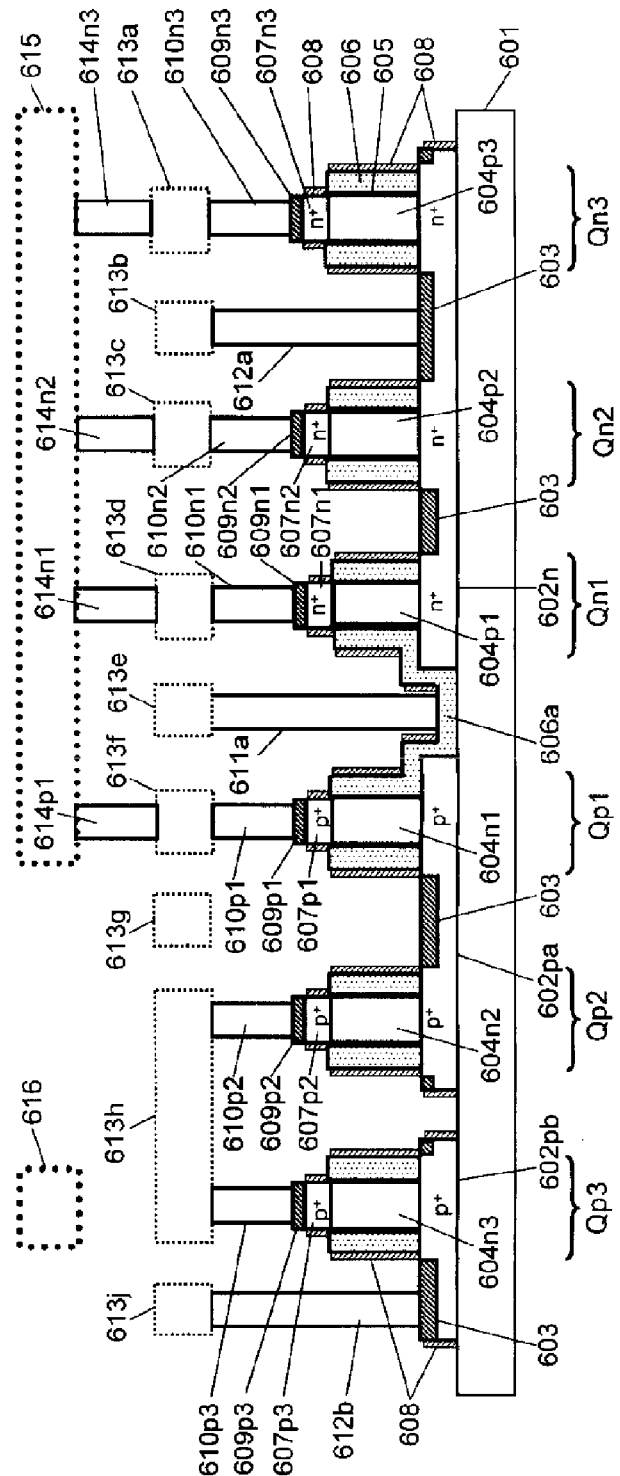
FIG. 14B is a cross-sectional view of the NOR circuit according to the twelfth embodiment of the present invention.
Figure 14C:
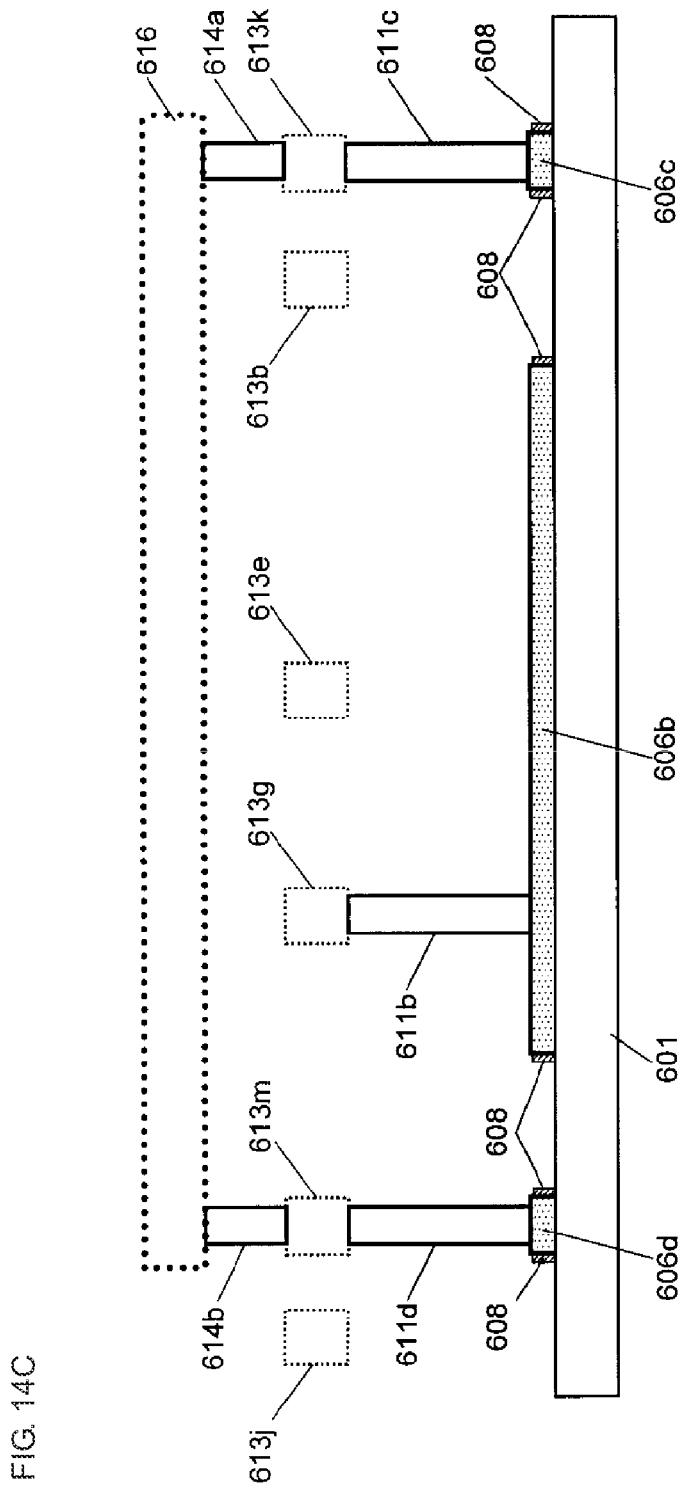
FIG. 14C is a cross-sectional view of the NOR circuit according to the twelfth embodiment of the present invention.
Figure 14D:
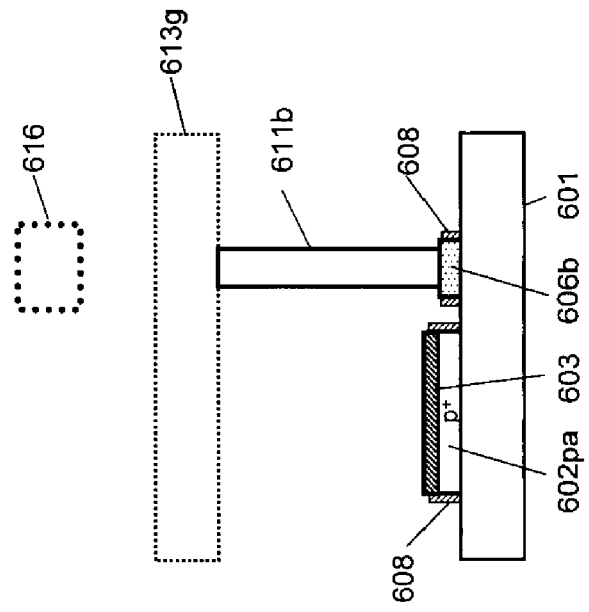
FIG. 14D is a cross-sectional view of the NOR circuit according to the twelfth embodiment of the present invention.
Figure 14E:
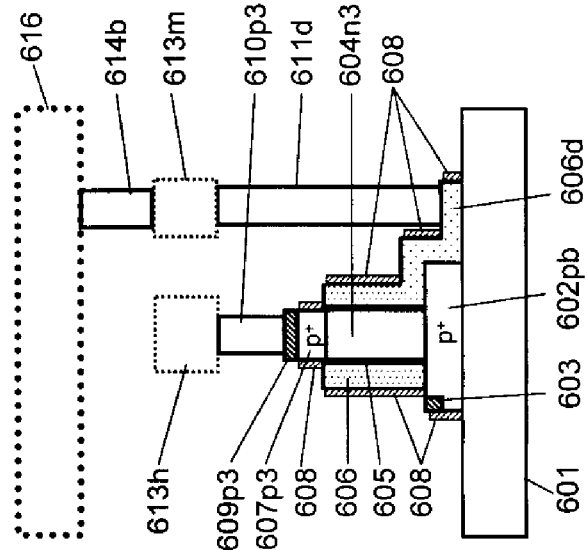
FIG. 14E is a cross-sectional view of the NOR circuit according to the twelfth embodiment of the present invention.

FIG. 14A is a plan view of the layout (arrangement) in the 3-input NOR circuit (hereinafter, simply referred to as a NOR circuit) of the present invention. FIG. 14B is a cross-sectional view taken along a cut line A-A' illustrated in FIG. 14A. FIG. 14C is a cross-sectional view taken along a cut line B-B' illustrated in FIG. 14A. FIG. 14D is a cross-sectional view taken along a cut line C-C' illustrated in FIG. 14A. FIG. 14E is a cross-sectional view taken along a cut line D-D' illustrated in FIG. 14A. The twelfth embodiment is based on the equivalent circuit illustrated in FIG. 1.

Referring to FIGS. 14A and 14B, the NMOS transistor Qn3, the NMOS transistor Qn2, the NMOS transistor Qn1, the PMOS transistor Qp1, the PMOS transistor Qp2, and the PMOS transistor Qp3 of the NOR circuit illustrated in FIG. 1 are arranged in a line from the right.

A difference from the configuration illustrated in FIGS. 13A and 13B is that the NMOS transistors Qn3, Qn2, and Qn1 are disposed collectively.

In FIGS. 14A to 14E, the same or substantially the same structures as those illustrated in FIGS. 13A and 13B are denoted by reference numerals in the 600s having the same last one or two digits as the reference numerals used in FIGS. 13A and 13B.

Planar silicon layers 602n, 602pa, and 602pb are disposed on an insulating film, such as a buried oxide (BOX) film layer 601 disposed on a substrate. The planar silicon layers (hereinafter, also referred to as lower diffusion layers) 602n, 602pa, and 602pb are respectively formed as an n+ diffusion layer, a p+ diffusion layer, and a p+ diffusion layer through impurity implantation or the like. A silicide layer 603 is disposed on the surfaces of the planar silicon layers (602n, 602pa, and 602pb). 604p1, 604p2, and 604p3 denote silicon pillars of p type, and 604n1, 604n2, and 604n3 denote silicon pillars of n type. 605 denotes a gate insulating film surrounding the silicon pillars 604p1, 604p2, 604p3, 604n1, 604n2, and 604n3. 606 denotes a gate electrode. 606a, 606b, 606c, and 606d each denote a gate line. At top portions of the silicon pillars 604p1, 604p2, and 604p3, n+ diffusion layers (hereinafter, also referred to as upper diffusion layers) 607n1, 607n2, and 607n3 are respectively formed through impurity implantation or the like. At top portions of the silicon pillars 604n1, 604n2, and 604n3, p+ diffusion layers (hereinafter, also referred to as upper diffusion layers) 607p1, 607p2, and 607p3 are formed through impurity implantation or the like. 608 denotes a silicon nitride film that protects the gate insulating film 605. 609n1, 609n2, 609n3, 609p1, 609p2, and 609p3 denote silicide layers respectively connected to the n+ diffusion layers 607n1, 607n2, and 607n3 and the p+ diffusion layers 607p1, 607p2, and 607p3. 610n1, 610n2, 610n3, 610p1, 610p2, and 610p3 denote contacts that respectively connect the silicide layers 609n1, 609n2, 609n3, 609p1, 609p2, and 609p3 to first metal lines 613d, 613c, 613a, 613f, 613h, and 613h. 611a denotes a contact that connects the gate line 606a to a first metal line 613e. 611b denotes a contact that connects the gate line 606b to a first metal line 613g. 611c denotes a contact that connects the gate line 606c to a first metal line 613k. 611d denotes a contact that connects the gate line 606d to a first metal line 613m.

612a denotes a contact that connects the n+ diffusion layer 602n to a first metal line 613b via the silicide layer 603. 612b denotes a contact that connects the p+ diffusion layer 602pb to a first metal line 613j via the silicide layer 603.

614a denotes a contact that connects the first metal line 613k to a second metal line 616. 614b denotes a contact that connects the first metal line 613m to the second metal line 616.

614n1 denotes a contact that connects the first metal line 613d to a second metal line 615. 614n2 denotes a contact that connects the first metal line 613c to the second metal line 615. 614n3 denotes a contact that connects the first metal line 613a to the second metal line 615. 614p1 denotes a contact that connects the first metal line 613f to the second metal line 615.

The silicon pillar 604p1, the lower diffusion layer 602n, the upper diffusion layer 607n1, the gate insulating film 605, and the gate electrode 606 constitute the NMOS transistor Qn1. The silicon pillar 604p2, the lower diffusion layer 602n, the upper diffusion layer 607n2, the gate insulating film 605, and the gate electrode 606 constitute the NMOS transistor Qn2. The silicon pillar 604p3, the lower diffusion layer 602n, the upper diffusion layer 607n3, the gate insulating film 605, and the gate electrode 606 constitute the NMOS transistor Qn3. The silicon pillar 604n1, the lower diffusion layer 602pa, the upper diffusion layer 607p1, the gate insulating film 605, and the gate electrode 606 constitute the PMOS transistor Qp1. The silicon pillar 604n2, the lower diffusion layer 602pa, the upper diffusion layer 607p2, the gate insulating film 605, and the gate electrode 606 constitute the PMOS transistor Qp2. The silicon pillar 604n3, the lower diffusion layer 602pb, the upper diffusion layer 607p3, the gate insulating film 605, and the gate electrode 606 constitute the PMOS transistor Qp3.

In addition, the gate line 606a is connected to the gate electrode 606 of the NMOS transistor Qn1. The gate line 606b is connected to the gate electrode 606 of the NMOS transistor Qn2. The gate line 606c is connected to the gate electrode 606 of the NMOS transistor Qn3. The gate line 606a is connected to the gate electrode 606 of the PMOS transistor Qp1. The gate line 606b is connected to the gate electrode 606 of the PMOS transistor Qp2. The gate line 606d is connected to the gate electrode 606 of the PMOS transistor Qp3. The second metal line 615 serves as a common drain of the PMOS transistor Qp1 and the NMOS transistors Qn1, Qn2, and Qn3 and is connected to an output OUT1.

The lower diffusion layer 602n, which is sources of the NMOS transistors Qn1, Qn2, and Qn3, is connected to the first metal line 613b via the silicide layer 603 and the contact 612a. The first metal line 613b is supplied with the reference voltage Vss. The lower diffusion layer 602pa, which is a source of the PMOS transistor Qp1, is connected to a drain of the PMOS transistor Qp2 via the silicide layer 603. The upper diffusion layer 607p2, which is a source of the PMOS transistor Qp2, is connected to the first metal line 613h via the silicide layer 609p2 and the contact 610p2. The upper diffusion layer 607p3, which is a drain of the PMOS transistor Qp3, is connected to the first metal line 613h via the silicide layer 609p3 and the contact 610p3. The source of the PMOS transistor Qp2 and the drain of the PMOS transistor Qp3 are connected via the first metal line 613h. The lower diffusion layer 602pb, which is a source of the PMOS transistor Qp3, is connected to the first metal line 613j via the silicide layer 603 and the contact 612b. The first metal line 613j is supplied with the supply voltage Vcc.

The input signal IN1 is supplied to the first metal line 613e, is connected to the gate line 606a via the contact 611a, and is supplied to the gate electrodes 606 of the NMOS transistor Qn1 and the PMOS transistor Qp1.

The input signal IN2 is supplied to the first metal line 613g, is connected to the gate line 606b via the contact 611b, and is connected to the gate electrodes 606 of the NMOS transistor Qn2 and the PMOS transistor Qp2.

The input signal IN3 is supplied to the second metal line 616, is connected to the gate line 606c via the contact 614a, the first metal line 613k, and the contact 611c, and is connected to the gate electrode 606 of the NMOS transistor Qn3. In addition, the second metal line 616 is connected to the gate line 606d via the contact 614b, the first metal line 613m, and the contact 611d, and thus the input signal IN3 is connected to the gate electrode 606 of the PMOS transistor Qp3.

According to the twelfth embodiment, six SGTs constituting a 3-input NOR circuit can be arranged in a line without providing any extra lines or contact regions. Thus, a semiconductor device with a reduced area can be provided.

In addition, the output OUT1 can be disposed by using the second metal line 615. Thus, the degree of freedom in wiring improves.

Thirteenth Embodiment

FIGS. 15A to 15E illustrate a thirteenth embodiment.

Figure 15A:
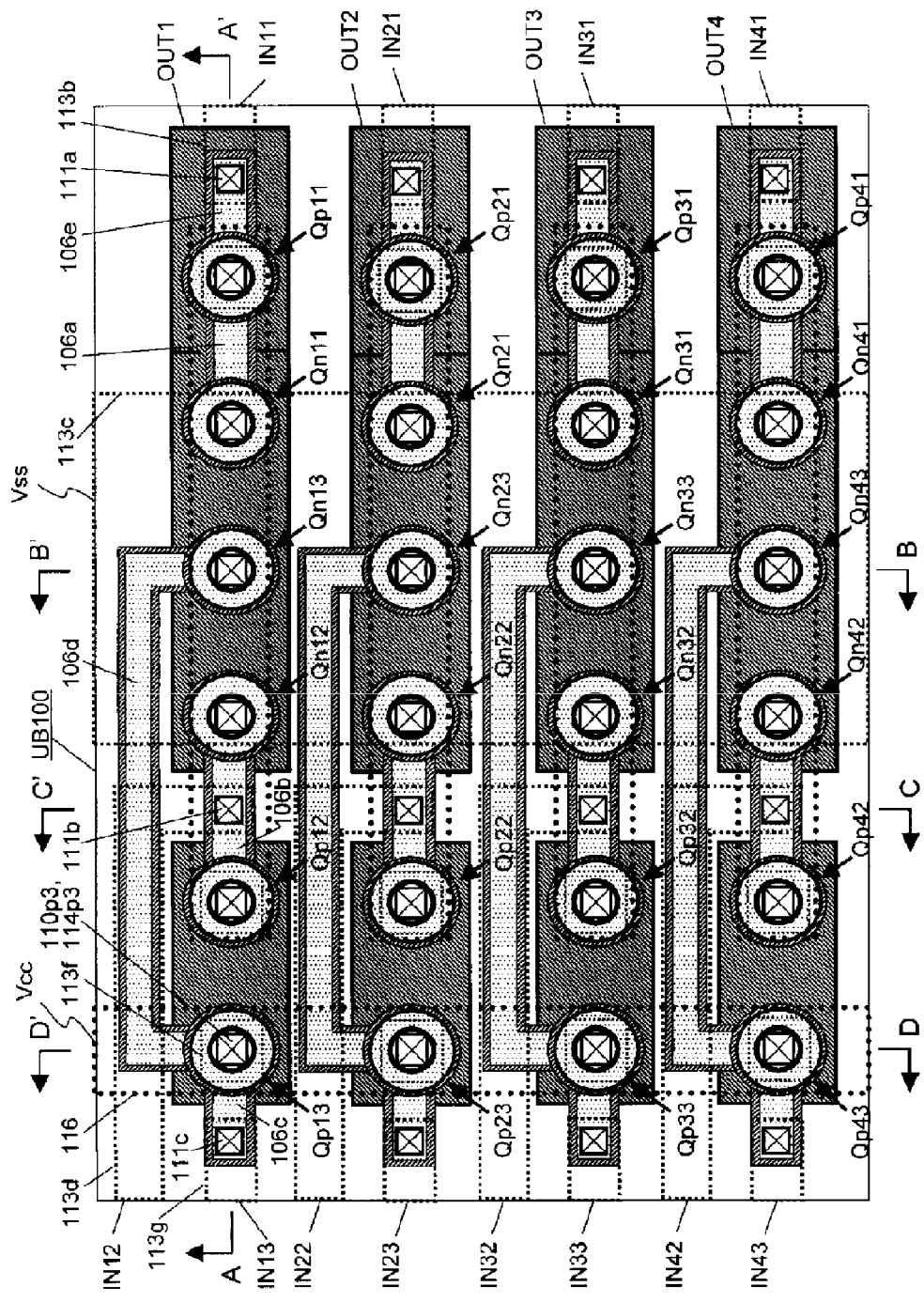
FIG. 15A is a plan view of NOR circuits according to a thirteenth embodiment of the present invention.
Figure 15B:
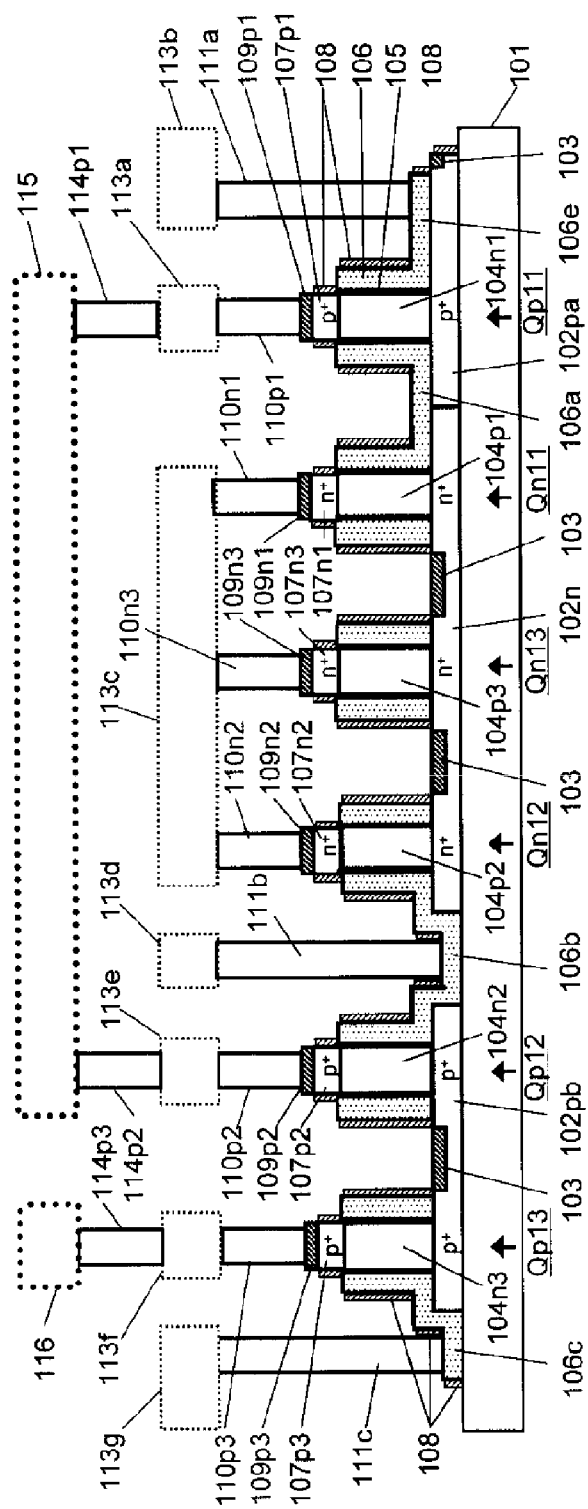
FIG. 15B is a cross-sectional view of the NOR circuit according to the thirteenth embodiment of the present invention.
Figure 15C:
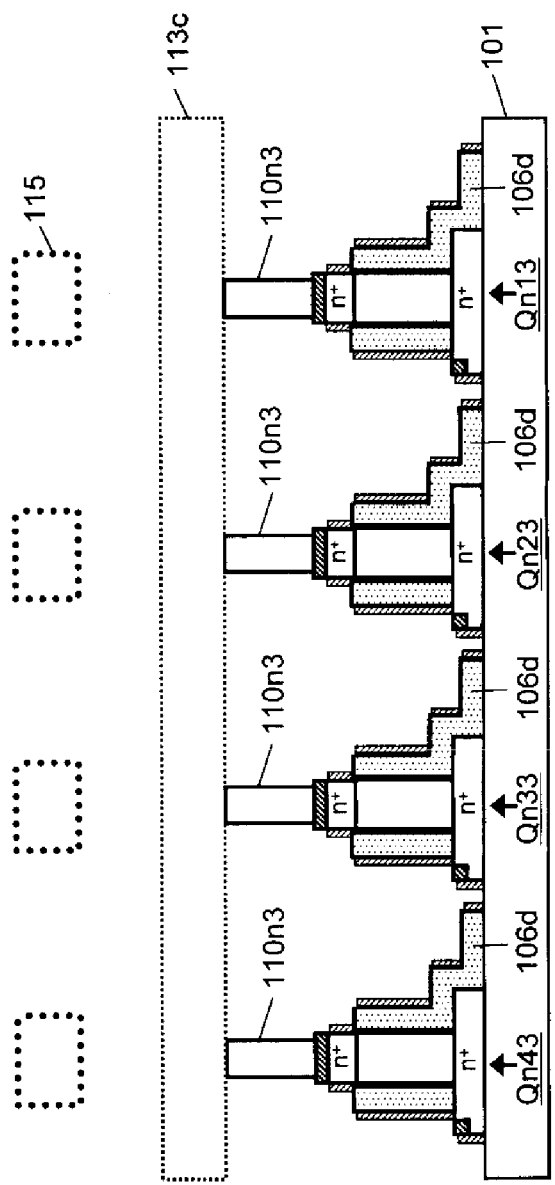
FIG. 15C is a cross-sectional view of the NOR circuits according to the thirteenth embodiment of the present invention.
Figure 15E:
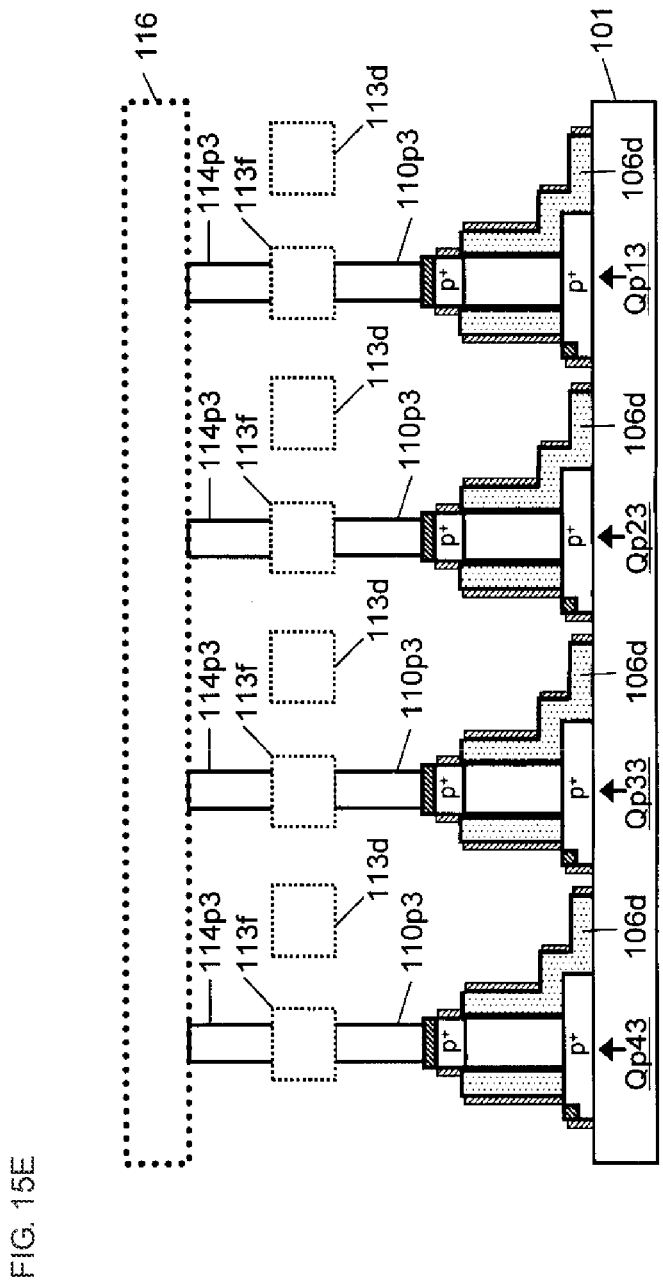
FIG. 15E is a cross-sectional view of the NOR circuits according to the thirteenth embodiment of the present invention.

FIG. 15A is a plan view of the layout (arrangement) of the 3-input NOR circuits (hereinafter, simply referred to as NOR circuits) of the present invention. FIG. 15B is a cross-sectional view taken along a cut line A-A' illustrated in FIG. 15A. FIG. 15C is a cross-sectional view taken along a cut line B-B' illustrated in FIG. 15A. FIG. 15D is a cross-sectional view taken along a cut line C-C' illustrated in FIG. 15A. FIG. 15E is a cross-sectional view taken along a cut line D-D' illustrated in FIG. 15A. The thirteenth embodiment is based on the equivalent circuit illustrated in FIG. 1.

The thirteen embodiment of the present invention is an embodiment in which four NOR circuits illustrated in FIG. 1 are arranged. The basic arrangement in the NOR circuit illustrated in FIGS. 2A and 2B is employed.

On the top row of FIG. 15A, a PMOS transistor Qp11, an NMOS transistor Qn11, an NMOS transistor Qn13, an NMOS transistor Qn12, a PMOS transistor Qp12, and a PMOS transistor Qp13 are arranged in a line from the right. Similarly, on the next row, a PMOS transistor Qp21, an NMOS transistor Qn21, an NMOS transistor Qn23, an NMOS transistor Qn22, a PMOS transistor Qp22, and a PMOS transistor Qp23 are arranged in a line. Further, on the next row, a PMOS transistor Qp31, an NMOS transistor Qn31, an NMOS transistor Qn33, an NMOS transistor Qn32, a PMOS transistor Qp32, and a PMOS transistor Qp33 are arranged in a line. On the fourth row, a PMOS transistor Qp41, an NMOS transistor Qn41, an NMOS transistor Qn43, an NMOS transistor Qn42, a PMOS transistor Qp42, and a PMOS transistor Qp43 are arranged in a line. A set of these four NOR circuits constitutes a NOR circuit unit block UB100.

In FIGS. 15A to 15E, the same or substantially the same structures as those illustrated in FIGS. 2A and 2B are denoted by the same reference numerals in the 100s, and the reference numerals and a description for such structures are omitted. A difference between the thirteenth embodiment of the present invention and the configuration illustrated in FIGS. 2A and 2B (first embodiment) will be described.

An object of the thirteenth embodiment is to minimize the area of the NOR circuit unit block UB100 by efficiently arranging a plurality of NOR circuits as densely as possible. To this end, a configuration is made so that the input signals can be input from and the output signal can be output to the left and the right in FIGS. 15A and 15B. Further, each of the supply voltage Vcc and the reference voltage Vss is connected in common. In this way, the NOR circuits are vertically and horizontally arranged in a minimized area.

The NOR circuit on the top row is fed with an input signal IN11 from the right side and with input signals IN12 and IN13 from the left side and outputs an output OUT1 to the right side. The NOR circuit on the second row is fed with an input signal IN21 from the right side and with input signals IN22 and IN23 from the left side and outputs an output OUT2 to the right side. The NOR circuit on the third row is fed with an input signal IN31 from the right side and with input signals IN32 and IN33 from the left side and outputs an output OUT3 to the right side. The NOR circuit on the last row is fed with an input signal IN41 from the right side and with input signals IN42 and IN43 from the left side and outputs an output OUT4 to the right side.

Such a configuration allows four NOR circuits to be arranged vertically next to one another and to be supplied with the supply voltage Vcc and with the reference voltage Vss in common, enabling arrangement in a minimized area.

In the NOR circuit on the top row in FIG. 15A, the input signal IN11 is supplied to the first metal line 113$b$ from the right side. The first metal line 113$b$ is connected to the gate line 106$e$ via the contact 111$a$ and to the gate electrode 106 of the PMOS transistor Qp11. The first metal line 113$b$ is also connected to the gate electrode 106 of the NMOS transistor Qn11 via the gate line 106$a$.

The input signal IN12 is supplied to the first metal line 113$d$ from the left side in FIG. 15A. The first metal line 113$d$ extends to the right, is connected to the gate line 106$b$ via the contact 111$b$, and is connected to the gate electrodes 106 of the NMOS transistor Qn12 and the PMOS transistor Qp12. The input signal IN13 is supplied to the first metal line 113$g$ from the left side in FIG. 15A. The first metal line 113$g$ is connected to the gate line 106$c$ via the contact 111$c$ and to the gate electrode 106 of the PMOS transistor Qp13. The first metal line 113$g$ is also connected to the gate electrode 106 of the NMOS transistor Qn13 via the gate line 106$d$. The output OUT1 is output to the right side in FIG. 15A via the lower diffusion layers 102$pa$ and 102$n$, which serve as a common drain of the PMOS transistor Qp11 and the NMOS transistors Qn11, Qn12, and Qn13, and the silicide layer 103 connecting the lower diffusion layers 102$pa$ and 102$n$ to each other. The same applies to the NOR circuits on the second, third, and fourth rows.

In this way, a plurality of NOR circuits can be arranged at minimum intervals in the vertical and horizontal directions in FIG. 15A.

In the thirteenth embodiment, four NOR circuits are arranged; however, the similar advantage can be obtained if the number of NOR circuits arranged is two or more.

According to the thirteenth embodiment, a plurality of 3-input NOR circuits each including SGTs arranged in a line can be arranged without providing any extra lines and contact regions. Thus, a semiconductor device with a reduced area can be provided.

In the thirteenth embodiment, a plurality of NOR circuits according to the first embodiment illustrated in FIGS. 2A and 2B are arranged; however, arrangement in the minimized area can be implemented similarly by using the NOR circuits illustrated in FIGS. 3A to 3E, FIGS. 4A and 4B, FIGS. 5A and 5B, FIGS. 7A and 7B, FIGS. 8A and 8B, FIGS. 9A and 9B, FIGS. 10A and 10B, FIGS. 11A and 11B, or FIGS. 12A and 12B by devising the arrangement of the inputs.

For example, the same configuration for FIGS. 2A to 2B can be used for FIGS. 3A to 3E. The first metal line 113$d$ for the input signal IN2 can be extended to the left side by disposing the contact 114$b$ for the input signal IN3 above the contact 111$c$ and omitting a part of the first metal line 113$g$.

In addition, the same configuration for FIGS. 2A to 2B can be used for FIGS. 4A and 4B. The first metal line 113$d$ can be extended to the left side by replacing the first metal line 113$d$ with a second metal line (not illustrated) above the gate line 106$d$ similarly to FIGS. 3A to 3E.

As for FIGS. 5A and 5B, the second metal line 116 for the input signal IN2 may be extended to the left side.

In addition, as for FIGS. 7A and 7B, the first metal line 113$j$ for the input signal IN3$a$ may be replaced with a second metal line and be connected to the input signal IN3$b$ similarly to FIGS. 3A to 3E.

In addition, as for FIGS. 8A and 8B, the first metal line 213$c$ for the input signal IN1 may be replaced with a second metal line so as to be extended to the right side, and the first metal line 213$e$ for the input signal IN2 may be replaced with a second metal line so as to be extended to the left side.

As for FIGS. 9A and 9B, wiring can be made in the same manner as that for FIGS. 8A and 8B.

In addition, as for FIGS. 10A and 10B, wiring is similar to that for FIGS. 2A and 2B.

In addition, as for FIGS. 11A and 11B, the first metal line 313$b$ for the input signal IN1 may be replaced with a second metal line so as to be extended to the right side, and the first metal line 313$e$ for the input signal IN2 may be replaced with a second metal line so as to be extended to the left side.

In addition, as for FIGS. 12A and 12B, wiring is similar to that for FIGS. 11A and 11B.

Fourteenth Embodiment

Figure 16A:
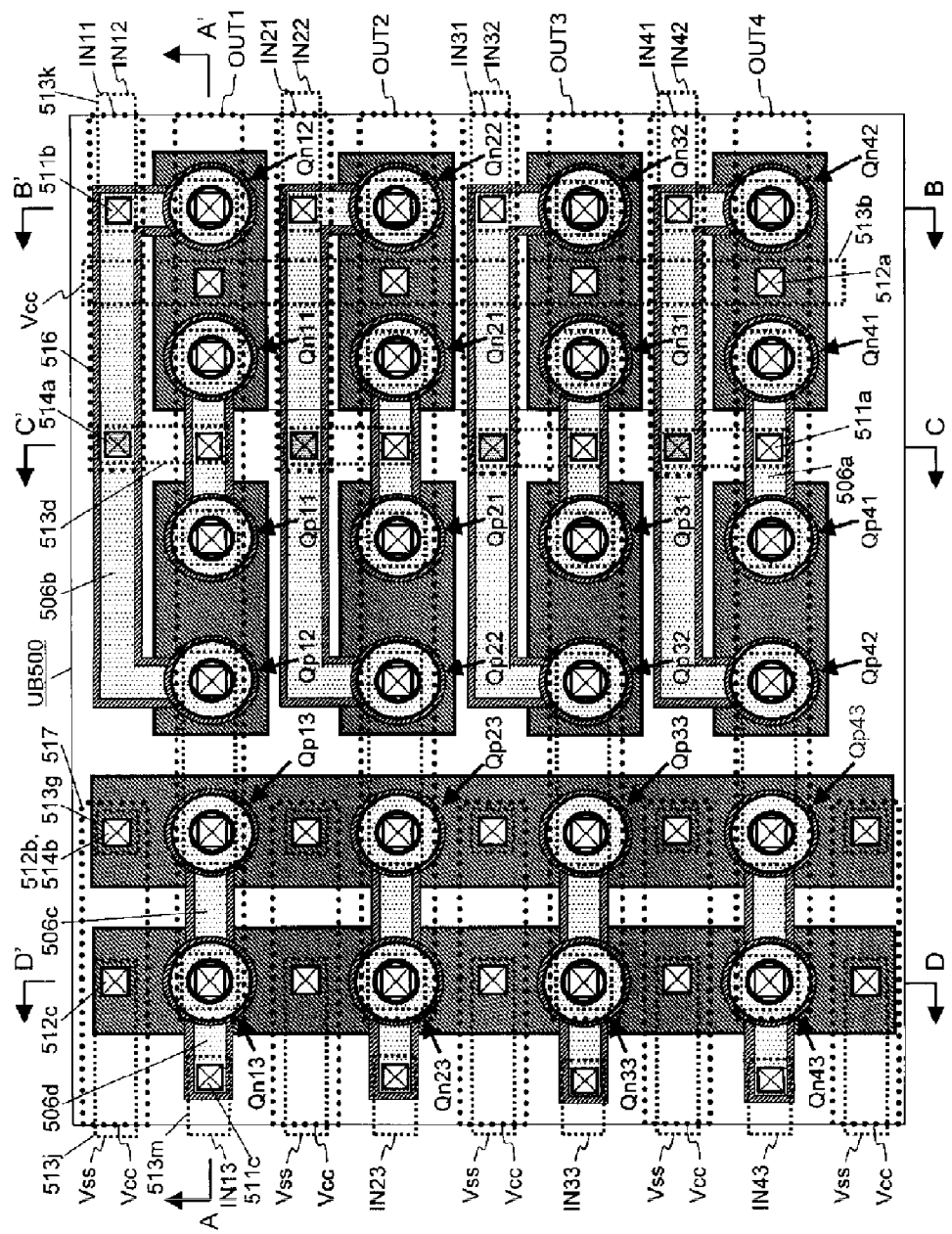
FIG. 16A is a plan view of NOR circuits according to a fourteenth embodiment of the present invention.
Figure 16B:
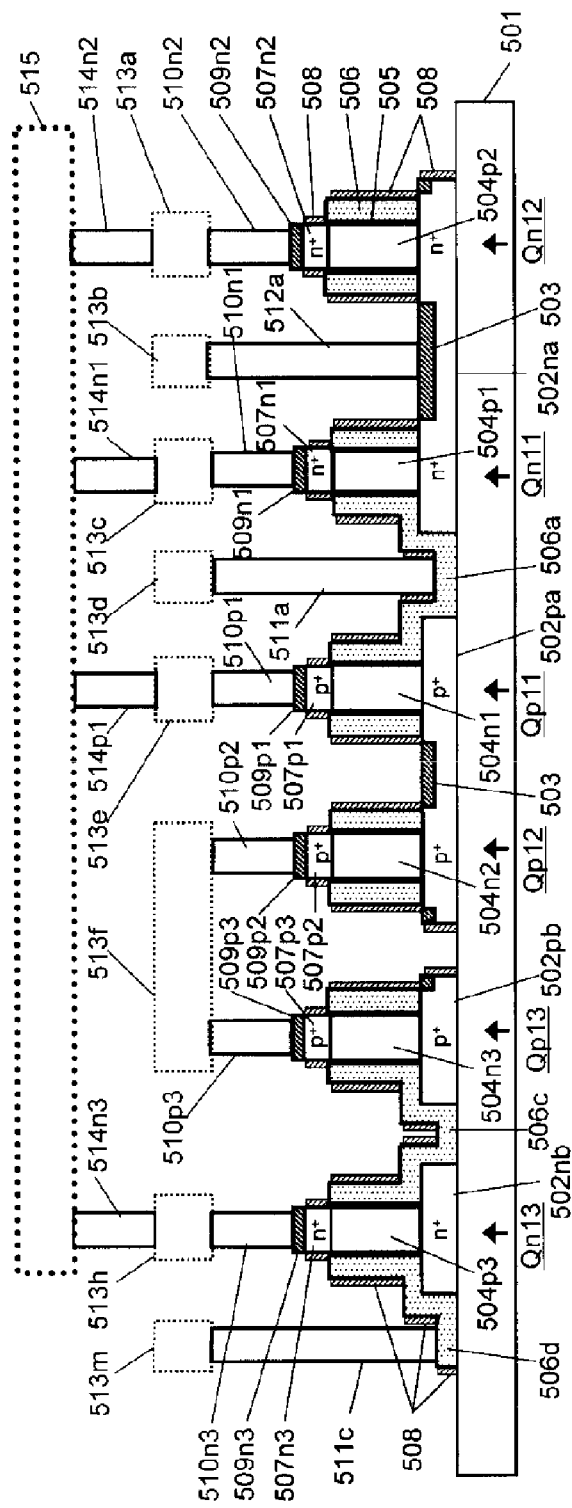
FIG. 16B is a cross-sectional view of the NOR circuit according to the fourteenth embodiment of the present invention.
Figure 16C:
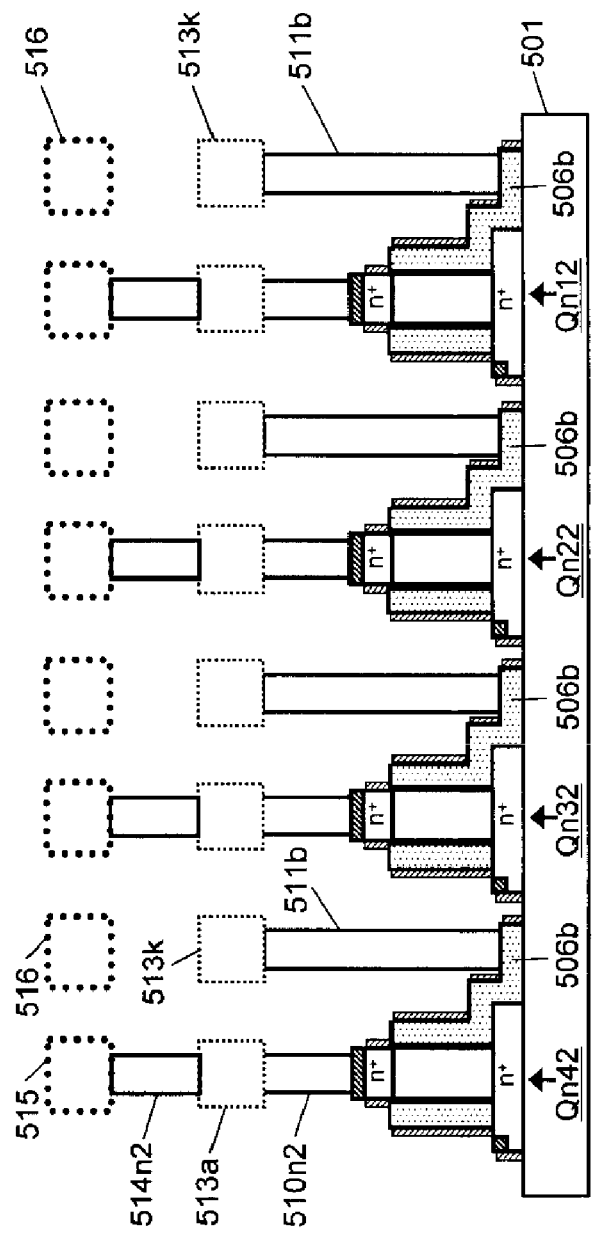
FIG. 16C is a cross-sectional view of the NOR circuits according to the fourteenth embodiment of the present invention.
Figure 16D:
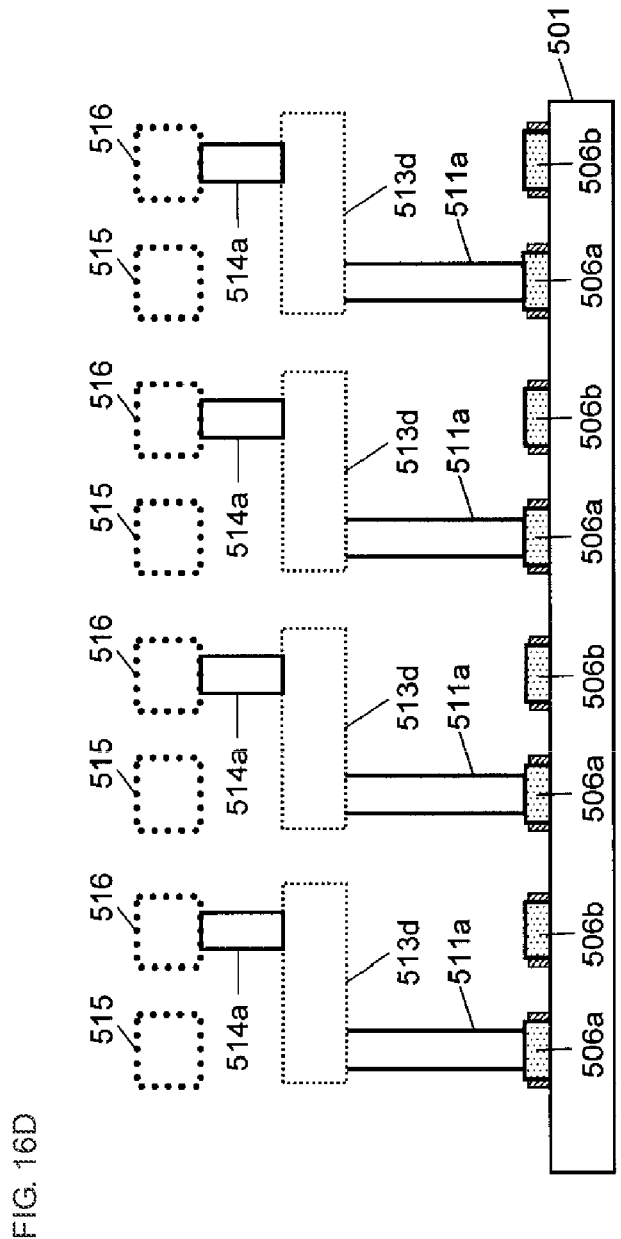
FIG. 16D is a cross-sectional view of the NOR circuits according to the fourteenth embodiment of the present invention.
Figure 16E:
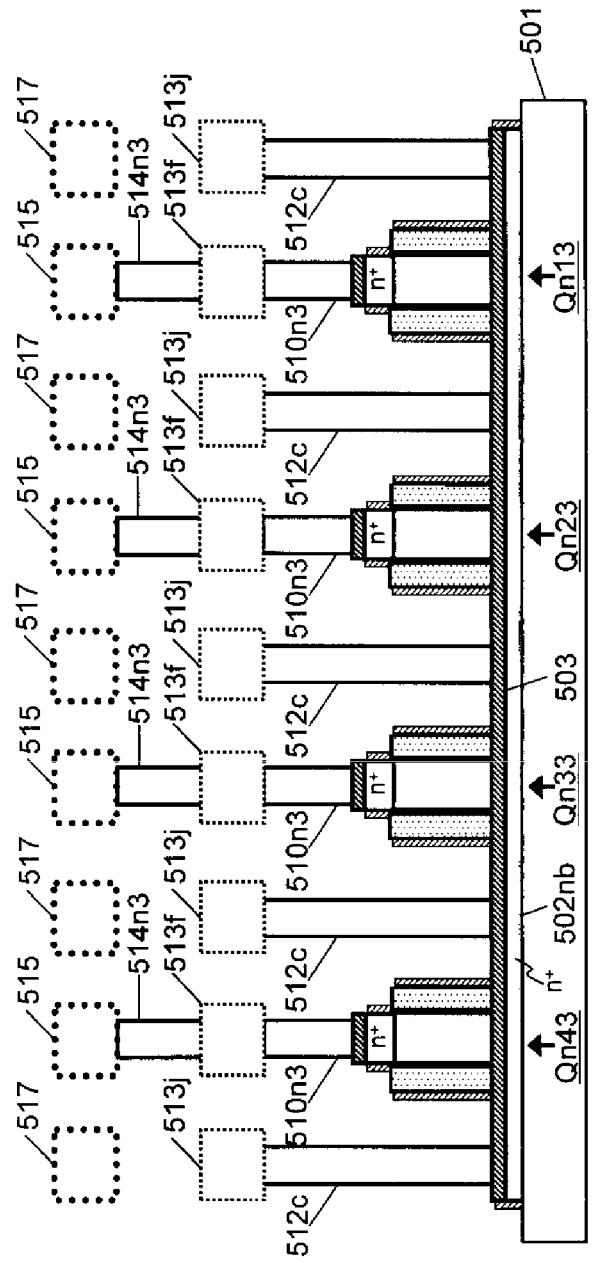
FIG. 16E is a cross-sectional view of the NOR circuits according to the fourteenth embodiment of the present invention.

FIGS. 16 to 16E illustrate a fourteenth embodiment.

FIG. 16A is a plan view of the layout (arrangement) of the 3-input NOR circuits (hereinafter, simply referred to as NOR circuits) of the present invention. FIG. 16B is a cross-sectional view taken along a cut line A-A' illustrated in FIG. 16A. FIG. 16C is a cross-sectional view taken along a cut line B-B' illustrated in FIG. 16A. FIG. 16D is a cross-sectional view taken along a cut line C-C' illustrated in FIG. 16A. FIG. 16E is a cross-sectional view taken along a cut line D-D' illustrated in FIG. 16A. The fourteenth embodiment is based on the equivalent circuit illustrated in FIG. 1.

The fourteenth embodiment of the present invention is an embodiment in which four NOR circuits illustrated in FIG. 1 are arranged. The basic arrangement in the NOR circuit illustrated in FIGS. 13A and 13B is employed.

On the top row of FIG. 16A, the NMOS transistor Qn12, the NMOS transistor Qn11, the PMOS transistor Qp11, the PMOS transistor Qp12, the PMOS transistor Qp13, and the NMOS transistor Qn13 are arranged in a line from the right. Similarly, on the next row, the NMOS transistor Qn22, the NMOS transistor Qn21, the PMOS transistor Qp21, the PMOS transistor Qp22, the PMOS transistor Qp23, and the NMOS transistor Qn23 are arranged in a line. Further, on the next row, the NMOS transistor Qn32, the NMOS transistor Qn31, the PMOS transistor Qp31, the PMOS transistor Qp32, the PMOS transistor Qp33, and the NMOS transistor Qn33 are arranged in a line. On the fourth row, the NMOS transistor Qn42, the NMOS transistor Qn41, the PMOS transistor Qp41, the PMOS transistor Qp42, the PMOS transistor Qp43, and the NMOS transistor Qn43 are arranged in a line. A set of these four NOR circuits constitutes a NOR circuit unit block UB500.

In FIGS. 16A to 16E, the same or substantially the same structures as those illustrated in FIGS. 13A and 13B are denoted by the same reference numerals in the 500s, and the reference numerals and a description for such structures are omitted. A difference between a configuration of the fourteenth embodiment of the present invention and the configuration illustrated in FIGS. 13A and 13B (eleventh embodiment) will be described.

An object of the fourteenth embodiment is to minimize the area of the NOR circuit unit block UB500 by efficiently arranging a plurality of NOR circuits as densely as possible. To this end, a configuration is made so that the input signals can be input from and the output signal can be output to the left and the right in FIGS. 16A and 16B. Further, the supply voltage Vcc and the reference voltage Vss, which are supplied via the lower diffusion layers, are connected in common. In this way, the NOR circuits are vertically and horizontally arranged in a minimized area.

A difference between the fourteenth embodiment and the eleventh embodiment (FIGS. 13A and 13B) is that the dimension in the horizontal direction in FIGS. 13A and 13B can be greatly reduced by extending the lower diffusion layers 502nb that supplies the reference voltage Vss to the NMOS transistors Qn13, Qn23, Qn33, and Qn43 in the vertical direction in FIG. 16A so as to connect the reference voltage Vss to the four NOR circuits in common and by extending the lower diffusion layer 502pb that supplies the supply voltage Vcc to the PMOS transistors Qp13, Qp23, Qp33, and Qp43 in the vertical direction in FIG. 16A so as to connect the supply voltage Vcc to the four NOR circuits in common.

A method for implementing this difference will be described for the NOR circuit on the top row by way of example.

The gate line 506c that is connected directly to the gate electrode 506 of the PMOS transistor Qp13 is provided by extending the gate line 506d connected to the gate electrode 506 of the NMOS transistor Qn13 from the left side in FIG. 16A. The gate line 506d is connected to the first metal line 513m via the contact 511c. The first metal line 513m is supplied with the input signal IN13.

The contact 512c that supplies the reference voltage Vss to the lower diffusion layer 502nb is disposed at regions above and below the NMOS transistor Qn13 to be connected to the first metal line 513j. The first metal line 513j is supplied with the reference voltage Vss.

Likewise, in order to supply the lower diffusion layer 502pb with the supply voltage Vcc, the contact 512b, the first metal line 513g, and the contact 514b are disposed in regions above and below the PMOS transistor Qp13 so as to be connected to the second metal line 517. The second metal line 517 is extended to the left side in FIG. 16A and is supplied with the supply voltage Vcc.

Such a configuration can greatly reduce the horizontal dimension of the NOR circuit unit block UB500.

The input signal IN11 is supplied via the second metal line 516 from the right side. The second metal line 516 extends to the left side and is connected to the first metal line 513d via the contact 514a, to the gate line 506a via the contact 511a, and to the gate electrodes 506 of the NMOS transistor Qn11 and the PMOS transistor Qp11.

The input signal IN12 is supplied via the first metal line 513k as in FIGS. 13A and 13B.

The input signal IN13 is supplied via the first metal line 513m from the left as described above. The output OUT1 can be output to the left or right via the second metal line.

According to the fourteenth embodiment, a unit block, with a minimized area, including a plurality of NOR circuits each of which is supplied with first and second input signals from the right side and with a third input signal from the left side and outputs an output signal to the right or left side via a second metal line can be implemented.

Fifteenth Embodiment

Figure 17A:
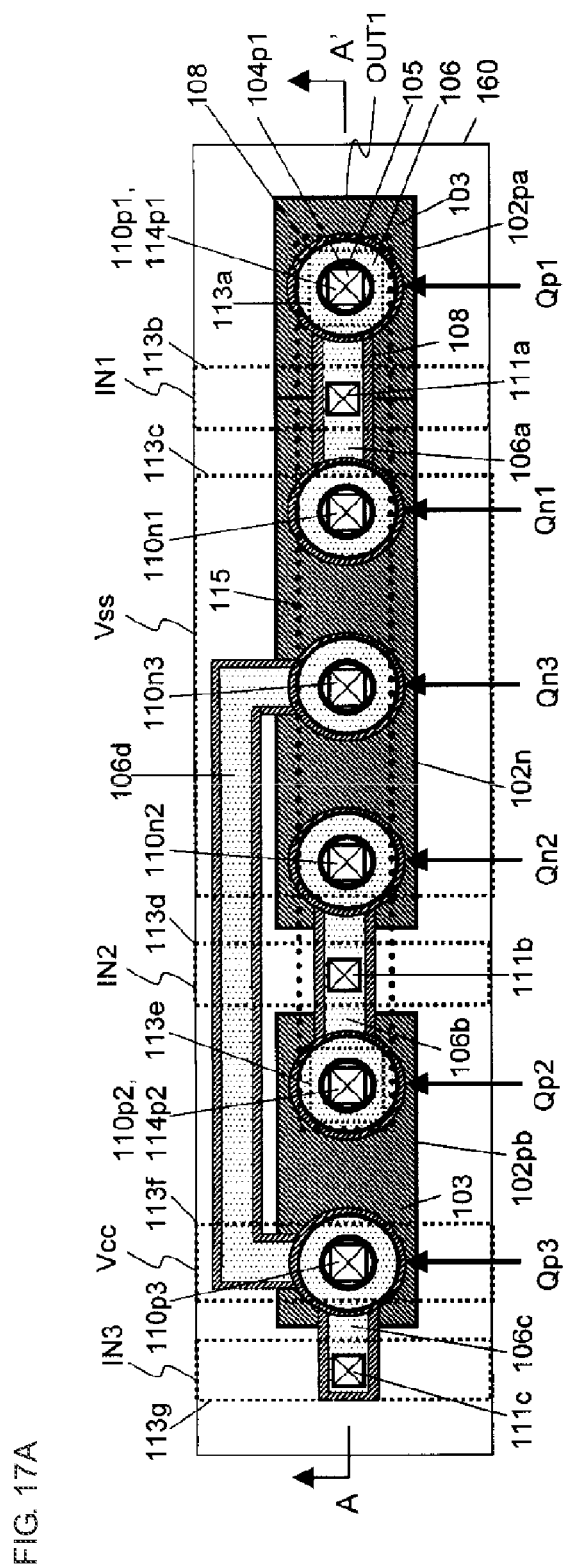
FIG. 17A is a plan view of a NOR circuit according to a fifteenth embodiment of the present invention.
Figure 17B:
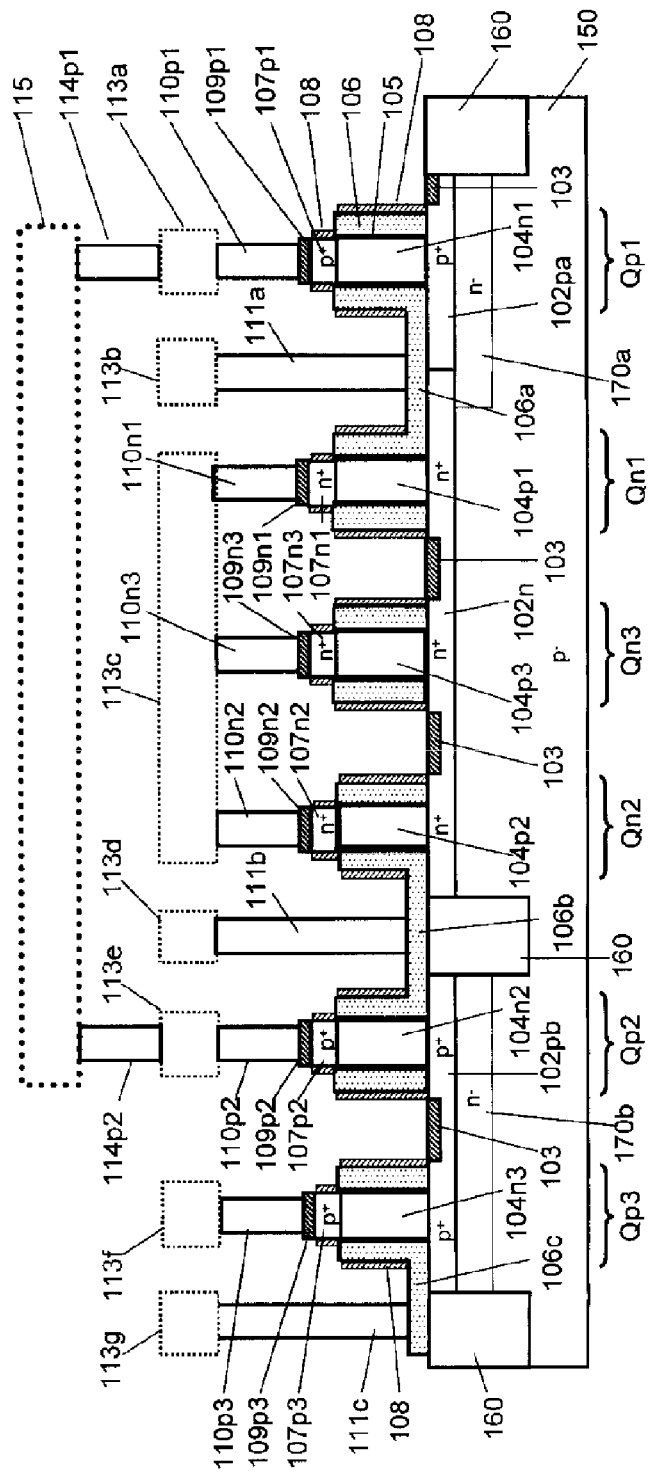
FIG. 17B is a cross-sectional view of the NOR circuit according to the fifteenth embodiment of the present invention.
Figure 18:
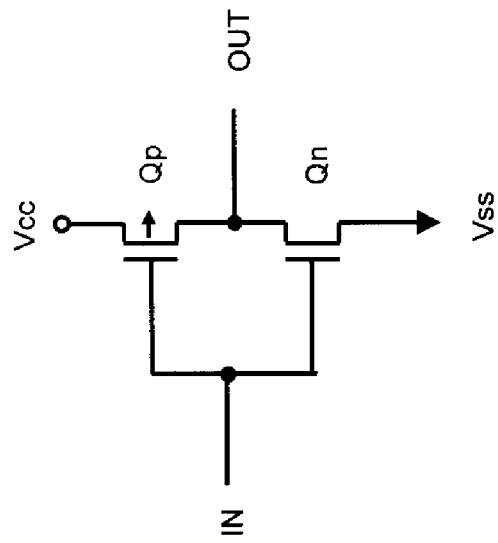
FIG. 18 illustrates an equivalent circuit of an inverter according to the related art.

In the embodiments described above, arrangement has been described using an example of a process of arranging planar silicon layers on an insulating film, such as a buried oxide (BOX) film layer disposed on a substrate; however, the arrangement can be implemented similarly when a bulk CMOS process is used. FIGS. 17A and 17B illustrate a fifteenth embodiment in which the first embodiment illustrated in FIGS. 2A and 2B are implemented using the bulk CMOS process by way of example.

FIG. 17A is a plan view of the layout (arrangement) in the 3-input NOR circuit (hereinafter, simply referred to as a NOR circuit) of the present invention. FIG. 17B is a cross-sectional view taken along a cut line A-A' illustrated in FIG. 17A.

Referring to FIG. 17A, the PMOS transistor Qp1, the NMOS transistor Qn1, the NMOS transistor Qn3, the NMOS transistor Qn2, the PMOS transistor Qp2, and the PMOS transistor Qp3 of the NOR circuit illustrated in FIG. 1 are arranged in a line from the right, which is the same as in FIG. 2A. In addition, in FIGS. 17A and 17B, the same or substantially the same structures as those illustrated in FIGS. 2A and 2B are denoted by the same reference numerals in the 100s.

Referring to Japanese Patent No. 4756221 cited above, there is no difference between the plan views for the BOX process and the bulk CMOS process of FIG. 2A and FIG. 17A but there is a difference between the cross-sectional views for the BOX process and the bulk CMOS process of FIGS. 2B and 17B. Referring to FIG. 17B, 150 denotes a p-type silicon substrate, 160 denotes an element isolation insulator, and 170a and 170b each denote an n− region which serves as a leakage preventing isolation layer. Other than the p-type silicon substrate 150, the element isolation insulator 160, and the leakage preventing isolation layers 170a and 170b, the processes and structures above the lower diffusion layers are the same, and the first to fourteenth embodiments of the present invention can be implemented using the bulk CMOS process. However, the bulk CMOS process requires the element isolation layer 160 and the leakage preventing isolation layers 170a and 170b. In addition, a body terminal (not illustrated) for applying a potential to the p-type silicon substrate 150 needs to be provided. Accordingly, the area increases to a certain extent.

In the description of the embodiments, the silicon pillar of an NMOS transistor is defined as a p-type silicon layer, and the silicon pillar of a PMOS transistor is defined as an n-type silicon layer. However, in a fine process, it is difficult to control the density obtained through impurity implantation. Thus, a so-called neutral (intrinsic) semiconductor with no impurity implantation may be used as silicon pillars of the NMOS transistor and the PMOS transistor, and differences between the work functions unique to metal gate materials may be used to control a channel, that is, thresholds of the NMOS and PMOS transistors.

In the embodiments, the lower diffusion layers or the upper diffusion layers are covered with the silicide layers.

Silicide is used to make resistance low and thus low-resistance materials or metals other than silicide may be used.

The essence of the present invention is the definition of the optimum arrangement of six transistors. In a case where the transistors are arranged in the optimum order, a wiring method and wiring positions for gate lines and a wiring method and wiring positions for metal lines that are not illustrated in the figures of the embodiments are also within the technical scope of the present invention.

In the embodiments, the description has been given using six transistors, which is the minimum number of transistors and includes three NMOS transistors and three PMOS transistors, as transistors of a 3-input NOR circuit in order to emphasize the arrangement area. In the case of practical design, there may be cases where a plurality of transistors are employed at each portion in order to increase the driving performance of the transistors by taking their characteristics into account. An equivalent circuit of such a case is also the same as the equivalent circuit described above, and the plurality of transistors that perform an equivalent operation are considered as a single transistor in the circuit. Such a configuration is also within the technical scope of the present invention within the range not departing from the gist of the present invention.

The invnetion claimed is:

1. A semiconductor device, comprising:
   six transistors arranged in a line on a substrate to constitute a NOR circuit, each of said six transistors having a source, a drain, and a gate arranged hierarchically in a direction perpendicular to the substrate, each of said six transistors having:
      a silicon pillar;
      an insulator surrounding a side surface of said silicon pillar;
      a gate surrounding said insulator;
      a source region disposed at an upper portion or lower portion of said silicon pillar; and
      a drain region disposed at an upper portion or lower portion of said silicon pillar on a side of said silicon pillar opposite to said source region,
   said six transistors including:
      a first n-channel MOS transistor,
      a second n-channel MOS transistor,
      a third n-channel MOS transistor,
      a first p-channel MOS transistor,
      a second p-channel MOS transistor, and
      a third p-channel MOS transistor;
   wherein:
   the gate of said first n-channel MOS transistor and the gate of said first p-channel MOS transistor are connected to each other,
   the gate of said second n-channel MOS transistor and the gate of said second p-channel MOS transistor are connected to each other,
   the gate of said third n-channel MOS transistor and the gate of said third p-channel MOS transistor are connected to each other,
   the drain region of said first n-channel MOS transistor, the drain region of said second n-channel MOS transistor, the drain region of said third n-channel MOS transistor, the drain region of said first p-channel MOS transistor, and the drain region of said third p-channel MOS transistor are disposed on a side of the silicon pillars close to the substrate,
   the source region of said second p-channel MOS transistor is disposed on a side of the silicon pillar close to the substrate,
   the drain region of said first n-channel MOS transistor, the drain region of said second n-channel MOS transistor, the drain region of said third n-channel MOS transistor, and the drain region of said first p-channel MOS transistor are connected to one another via a silicide region,
   the source region of said first p-channel MOS transistor and the drain region of said second p-channel MOS transistor are connected to each other via a contact, and
   the source region of said second p-channel MOS transistor and the drain region of said third p-channel MOS transistor are connected to each other via the silicide region.

2. The semiconductor device according to claim 1, wherein said six transistors are arranged in a line in an order of said first p-channel MOS transistor, said first n-channel MOS transistor, said third n-channel MOS transistor, said second n-channel MOS transistor, said second p-channel MOS transistor, and said third p-channel MOS transistor or in an order of said first p-channel MOS transistor, said first n-channel MOS transistor, said third n-channel MOS transistor, said second n-channel MOS transistor, said third p-channel MOS transistor, and said second p-channel MOS transistor.

3. The semiconductor device according to claim 2, wherein the gate of said third n-channel MOS transistor and the gate of said third p-channel MOS transistor are connected to each other via a contact.

4. The semiconductor device according to claim 2, wherein the gate of said third n-channel MOS transistor and the gate of said third p-channel MOS transistor are connected by different signal lines via a contact.

5. The semiconductor device according to claim 1, wherein said six transistors are arranged in a line in an order of said first p-channel MOS transistor, said first n-channel MOS transistor, said second n-channel MOS transistor, said third n-channel MOS transistor, said second p-channel MOS transistor, and said third p-channel MOS transistor or in an order of said first p-channel MOS transistor, said first n-channel MOS transistor, said second n-channel MOS transistor, said third n-channel MOS transistor, said third p-channel MOS transistor, and said second p-channel MOS transistor.

6. The semiconductor device according to claim 1, wherein said six transistors are arranged in a line in an order of said third n-channel MOS transistor, said second n-channel MOS transistor, said first n-channel MOS transistor, said first p-channel MOS transistor, said second p-channel MOS transistor, and said third p-channel MOS transistor.

7. The semiconductor device according to claim 6, wherein the gate of said third n-channel MOS transistor and the gate of said third p-channel MOS transistor are connected by different signal lines via a contact.

8. The semiconductor device according to claim 1, wherein said six transistors are arranged in a line in an order of said first n-channel MOS transistor, said first p-channel MOS transistor, said third n-channel MOS transistor, said second n-channel MOS transistor, said second p-channel MOS transistor, and said third p-channel MOS transistor or in an order of said first n-channel MOS transistor, said first p-channel MOS transistor, said third n-channel MOS transistor, said second n-channel MOS transistor, said third p-channel MOS transistor, and said second p-channel MOS transistor.

9. The semiconductor device according to claim 1, wherein said six transistors are arranged in a line in an order of said first n-channel MOS transistor, said first p-channel MOS transistor, said second n-channel MOS transistor, said third n-channel MOS transistor, said second p-channel MOS transistor, and said third p-channel MOS transistor or in an order of said first n-channel MOS transistor, said first p-channel MOS transistor, said second n-channel MOS transistor, said third n-channel MOS transistor, said third p-channel MOS transistor, and said second p-channel MOS transistor.

10. The semiconductor device according to claim 1, wherein said six transistors are arranged in a line in an order of said third n-channel MOS transistor, said first p-channel MOS transistor, said first n-channel MOS transistor, said second n-channel MOS transistor, said second p-channel MOS transistor, and said third p-channel MOS transistor or in an order of said third n-channel MOS transistor, said first p-channel MOS transistor, said first n-channel MOS transistor, said second n-channel MOS transistor, said third p-channel MOS transistor, and said second p-channel MOS transistor.

11. The semiconductor device according to claim 1, wherein said six transistors are arranged in a line in an order of said second n-channel MOS transistor, said first p-channel MOS transistor, said first n-channel MOS transistor, said third n-channel MOS transistor, said second p-channel MOS transistor, and said third p-channel MOS transistor or in an order of said second n-channel MOS transistor, said first p-channel MOS transistor, said first n-channel MOS transistor, said third n-channel MOS transistor, said third p-channel MOS transistor, and said second p-channel MOS transistor.

12. The semiconductor device according to claim 1, wherein said six transistors are arranged in a line in an order of said third n-channel MOS transistor, said first n-channel MOS transistor, said first p-channel MOS transistor, said second n-channel MOS transistor, said second p-channel MOS transistor, and said third p-channel MOS transistor or in an order of said third n-channel MOS transistor, said first n-channel MOS transistor, said first p-channel MOS transistor, said second n-channel MOS transistor, said third p-channel MOS transistor, and said second p-channel MOS transistor.

13. The semiconductor device according to claim 1, wherein said six transistors are arranged in a line in an order of said second n-channel MOS transistor, said first n-channel MOS transistor, said first p-channel MOS transistor, said third n-channel MOS transistor, said second p-channel MOS transistor, and said third p-channel MOS transistor or in an order of said second n-channel MOS transistor, said first n-channel MOS transistor, said first p-channel MOS transistor, said third n-channel MOS transistor, said third p-channel MOS transistor, and said second p-channel MOS transistor.

* * * * *